United States Patent
Lewis et al.

(10) Patent No.: US 11,143,961 B1
(45) Date of Patent: Oct. 12, 2021

(54) RESIST COMPOSITION

(71) Applicant: The University of Manchester, Manchester (GB)

(72) Inventors: Scott Lewis, Manchester (GB); Richard Winpenny, Manchester (GB); Stephen Yeates, Manchester (GB); Antonio Fernandez, Manchester (GB)

(73) Assignee: The University of Manchester, Manchester (GB)

( * ) Notice: Subject to any disclaimer, the term of this patent is extended or adjusted under 35 U.S.C. 154(b) by 443 days.

(21) Appl. No.: 15/764,584

(22) PCT Filed: Sep. 29, 2016

(86) PCT No.: PCT/GB2016/053032
§ 371 (c)(1),
(2) Date: Mar. 29, 2018

(87) PCT Pub. No.: WO2017/055850
PCT Pub. Date: Apr. 6, 2017

(30) Foreign Application Priority Data

Sep. 30, 2015 (GB) .................................... 1517273

(51) Int. Cl.
*G03F 7/20* (2006.01)
*G03F 7/16* (2006.01)
(Continued)

(52) U.S. Cl.
CPC .......... *G03F 7/2061* (2013.01); *G03F 7/0042* (2013.01); *G03F 7/031* (2013.01);
(Continued)

(58) Field of Classification Search
CPC ...... G03F 7/0042; G03F 7/038; G03F 7/7162; G03F 7/168; G03F 7/2002; G03F 7/2061;
(Continued)

(56) References Cited

U.S. PATENT DOCUMENTS 4,464,458 A * 8/1984 Chow .................... G03F 7/094
430/156
4,517,276 A * 5/1985 Lewis ...................... C08G 8/28
430/190

(Continued)

FOREIGN PATENT DOCUMENTS

EP 0097417 A2 1/1984
EP 0 413 087 A1 * 2/1991
(Continued)

OTHER PUBLICATIONS

Medeiros et al. Recent progress in electron-beam resists for advanced mask-making. IBM Journal of Research and Development (2001). 45(5):639-650 (Year: 2001).*

(Continued)

*Primary Examiner* — Duane Smith
(74) *Attorney, Agent, or Firm* — Nixon Peabody LLP; Linda B. Huber

(57) ABSTRACT

The present invention relates to resist compostions, in particular to photoresists that can be used in photolithography, especially in the fabrication of integrated circuits and derivative products. The resist compositions of the invention include an anti-scattering component which has a significant amount of empty space, and thus fewer scattering centers, such that radiation-scattering events are more limited during exposure. Such anti-scattering effects can lead to improved resolutions by reducing the usual proximity effects associated with lithographic techniques, allowing the production of smaller, higher resolution microchips. Furthermore, certain embodiments involve anti-scattering components which are directly linked to the resist components, which can improve the overall lithographic chemistry to provide benefits both in terms of resolution and resist sensitivity.

45 Claims, 7 Drawing Sheets

(51) Int. Cl.
| | |
|---|---|
| *G03F 7/32* | (2006.01) |
| *G03F 7/038* | (2006.01) |
| *G03F 7/031* | (2006.01) |
| *H01L 21/027* | (2006.01) |
| *H01L 21/768* | (2006.01) |
| *H01L 21/78* | (2006.01) |
| *H01L 21/56* | (2006.01) |
| *G03F 7/004* | (2006.01) |
| *H05K 3/30* | (2006.01) |
| *H01L 23/00* | (2006.01) |

(52) U.S. Cl.
CPC .............. *G03F 7/038* (2013.01); *G03F 7/162* (2013.01); *G03F 7/168* (2013.01); *G03F 7/2002* (2013.01); *G03F 7/325* (2013.01); *H01L 21/0274* (2013.01); *H01L 21/56* (2013.01); *H01L 21/76895* (2013.01); *H01L 21/78* (2013.01); *H01L 24/03* (2013.01); *H05K 3/303* (2013.01)

(58) Field of Classification Search
CPC ........ G03F 7/325; G03F 7/031; G03F 7/2059; G03F 7/0047; H05K 3/303; H01L 21/0274; H01L 21/56; H01L 21/76895; H01L 21/78; H01L 24/03; H01L 37/3175
USPC .......................................... 430/296, 312, 942
See application file for complete search history.

(56) References Cited

U.S. PATENT DOCUMENTS

| | | | | | |
|---|---|---|---|---|---|
| 4,737,425 | A | * | 4/1988 | Lin | G03F 7/405 430/11 |
| 5,068,259 | A | * | 11/1991 | Noguchi | C08F 283/10 522/102 |
| 5,079,131 | A | * | 1/1992 | Thackeray | G03F 7/0045 216/48 |
| 5,164,278 | A | * | 11/1992 | Brunsvold | G03F 7/039 430/176 |
| 5,382,637 | A | * | 1/1995 | Angelopoulos | C08G 73/101 522/146 |
| 5,548,034 | A | * | 8/1996 | Afzali-Ardakani | C08L 79/04 525/390 |
| 5,986,508 | A | | 11/1999 | Nevin | |
| 6,096,483 | A | * | 8/2000 | Harkness | C08K 5/0025 430/270.1 |
| 6,147,184 | A | * | 11/2000 | Castellanos | C07F 5/022 528/410 |
| 6,171,757 | B1 | * | 1/2001 | Angelopoulos | G03F 7/0042 430/270.1 |
| 6,436,605 | B1 | * | 8/2002 | Angelopoulos | G03F 7/0043 430/270.1 |
| 6,617,186 | B2 | * | 9/2003 | Kashiwabara | G03F 7/0007 438/29 |
| 6,841,883 | B1 | * | 1/2005 | Farnworth | H01L 21/561 257/777 |
| 6,899,990 | B2 | * | 5/2005 | Hasegawa | C07D 493/00 430/270.1 |
| 7,393,770 | B2 | * | 7/2008 | Wood | H01L 23/4951 438/598 |
| 8,124,301 | B2 | * | 2/2012 | Fujikawa | G03F 1/46 430/5 |
| 9,362,126 | B2 | * | 6/2016 | Ganesan | G03F 7/094 |
| 10,234,764 | B2 | * | 3/2019 | Lewis | G03F 7/2059 |
| 10,468,249 | B2 | * | 11/2019 | Chen | G03F 7/094 |
| 10,613,441 | B2 | * | 4/2020 | Lewis | G03F 7/027 |
| 2013/0043389 | A1 | | 2/2013 | Schiavone | |
| 2013/0224652 | A1 | | 8/2013 | Bass | |
| 2017/0235227 | A1 | * | 8/2017 | Lewis | H01J 37/3175 355/77 |

FOREIGN PATENT DOCUMENTS

| | | | |
|---|---|---|---|
| GB | 1291441 | * | 10/1972 |
| JP | 3177173 B | * | 5/1997 |
| JP | 3602492 B | * | 7/2002 |
| JP | 2004530921 A | | 10/2004 |
| JP | 2006080361 A | | 3/2006 |
| JP | 2007086368 A | | 4/2007 |
| JP | 2009-258357 A | * | 11/2009 |
| JP | 2010152136 A | | 7/2010 |
| JP | 5343340 B2 | * | 11/2013 |
| JP | 2015513540 A | | 5/2015 |
| WO | 2006063127 A2 | | 6/2006 |
| WO | 2012118847 A2 | | 9/2012 |
| WO | 2015026482 A2 | | 2/2015 |
| WO | 2016020650 A1 | | 2/2016 |
| WO | 2016065120 A1 | | 4/2016 |
| WO | 2017055850 A1 | | 4/2017 |
| WO | 2017066319 A2 | | 4/2017 |
| WO | 2017156388 A1 | | 9/2017 |
| WO | 2018031896 A1 | | 2/2018 |

OTHER PUBLICATIONS

International Search Report and Written Opinion of PTC/GB2016/053032, dated Dec. 14, 2016, 11 Pages.
Search Report of GB 1517273.7, dated Jun. 30, 2016, 3 Pages.

* cited by examiner

RESIST COMPOSITION

CROSS-REFERENCE TO RELATED APPLICATIONS

This application is a National Phase of International Application No. PCT/GB2016/053032 filed Sep. 29, 2016, which designated the U.S. and that International Application was published under PCT Article 21(2) in English, the entirety of which is hereby incorporated by reference. This application also includes a claim of priority under 35 U.S.C. § 119(a) and § 365(b) to British patent application No. GB 1517273.7 filed Sep. 30, 2015, the entirety of which is hereby incorporated by reference.

INTRODUCTION

The present invention relates to a resist composition, in particular to a photoresist composition. The present invention also relates to methods of preparing and using such resist compositions, alongside a variety of related aspects.

BACKGROUND

There is a continuous drive in the electronics industry to miniaturize integrated circuits (ICs), for a variety of reasons well known to those skilled in the art. Significant developments in the semiconductor industry were made possible by advances in photolithography, from the micron scale to the nanometer scale, but the physical resolution limits of optical lithography have now almost been reached, thus constraining further advancement. However, continued growth of the semiconductor industry depends on increasing the performance of integrated circuits on a silicon substrate.

Recent developments in extreme ultraviolet (EUV) lithography, at 13.5 nm, has enabled some further scaling/miniaturization of integrated circuits, but enormous challenges still obstruct the full implementation of this technique in the semiconductor industry.

Immersion 193 nm photolithography has extended the patterning resolution by utilizing sub wavelength technologies such as surface plasmon resonance and phase shift masks. Unfortunately, these resist materials require longer patterning times, resulting in reduced throughput.

One object of the invention is to develop a new resist composition that addresses at least one of the problems inherited by the prior art. Photoresists are already widely used in the art of IC fabrication, and thus new resist compositions which are compatible with (i.e. can be "retrofitted" to) existing techniques and hardware (which can be expensive) are particularly desirable to lower the burden of any technology migrations.

Photoresists fall into two principal categories: positive tone and negative tone photoresists. A "positive tone resist" (or +ve resist) reacts to exposure radiation by becoming more soluble in a resist developer, thereby allowing radiation-exposed portions to be removed during development without disturbing unexposed portions. In contrast, a "negative tone resist" (or −ve resist) reacts to exposure radiation by becoming less soluble in a resist developer, so that during development unexposed portions are removed whilst exposed portions remain. Though both types of resist are useful, negative tone photoresists are particularly appropriate in IC fabrication.

Typically, ultra-violet (UV) and deep UV (DUV) are used in the exposure of existing photoresists, though wavelength parameters are often selected based on the thickness of the applied photoresist layers. Thinner layers can be advantageously exposed by shorter wavelengths to thereby allow reduced aspect ratios and higher resolutions. However, current photoresist technologies suffer from the "trade-off" between resolution and exposure speed/sensitivity (i.e. throughput).

The key to high resolution photolithography is photoresist exposure control (good control allows exposed photoresists to exhibit maximum developer-solubility contrasts over short distances) whilst the key to high speed photolithography is the abundant supply of usable energy. Though better exposure control is afforded with shorter UV-wavelengths, which tend to afford higher resolution photolithographic patterns (due to their ability to interact with features on a smaller scale), such short UV wavelengths are generally better absorbed (by photoresists) than longer wavelengths due to the greater prevalence of spin-allowed electronic transitions (within absorbing molecules and atoms) at shorter wavelengths, thereby limiting the supply of usable energy. Since such absorption events tend to "lock-up" a photon's energy, since eventual vibronic energy dissipation is usually fruitless from a photolithography perspective, the energy of these photons can no longer be harnessed in a photolithographically-fruitful manner (e.g. through triggering chemical reactions that selectively modify the solubility of exposed vs non-exposed portions of a photoresist by promoting appropriate bond formations or bond scissions, depending on the tone of the resist). As such, resolution gains are typically at the expense of photolithographic kinetics.

Notwithstanding the above, photons having enough energy to ionize a photoresist can cause ejection of electrons (typically ionization from the valence bands, valence orbitals, and/or highest-occupied molecular-orbitals HOMOs) that may then fruitfully participate in further exposure of the photoresist materials. In the context of the present application, such "ejected" electrons are referred to as secondary electrons, though it will be understood that no incident primary electrons are actually required in their production (in contrast to technologies). Though photonic energy is absorbed during this ionization process, the energy (or at least a part thereof) is fruitfully released (rather than fruitlessly trapped) for further exposure events, though naturally this can in turn lead to exposure control problems, especially in view of the angle at which the electrons are ejected (~80° C.) which leads to proximity effects.

Photons with energies as low as 5 eV (i.e. ~248 nm) can induce such ionization (leading to the ejection of corresponding secondary electrons), though photonic energies above 20 eV (~62 nm) tend to result in more inner electron ionizations and Auger transitions which are generally less fruitful from a photolithographic perspective. Therefore, a useful photon and/or corresponding secondary electron energy range is 5-20 eV. Such electron energies (and indeed photon energies) are sufficient to cause localized chemical reactions ("localized" because the electron's energy is generally completely consumed in one collision event), for instance, through causing:

Bond breakages (e.g. bond dissocation energies: C—C (~3.60 eV), C—H (~4.5 eV));
Another electron ionization event in a neighbouring molecule/atom (e.g. leading to the formation of reactive species such as free radicals that can then react with neighbouring molecules);
Electronic excitations which place a molecule in a more reactive state.

Commonly used photoresist materials polymeric materials such as poly(methyl methacrylate) (PMMA), poly(methyl glutarimide) (PMGI), phenol formaldehyde resins (e.g. DNQ/Novolac), epoxy-based polymers (e.g. SU-8), all of which can be applied as a liquid to a substrate surface (e.g. silicon) via spin-coating, which is preferably to assure uniform thickness across the surface.

Chemical amplifier compounds (e.g. photoacids) are sometimes incorporated into photoresist compositions based to improve sensitivity. Upon exposure, such chemical amplifiers typically release acidic compounds which are then caused to diffuse during post-exposure bakes to thereby render surrounding/nearby polymer developer-soluble. Thus post-exposure diffusion of exposure-generated acids is crucial for the acid-catalysed reactions that ultimately give rise to the required photoresist solubility differentials for successful development. Even very small quantities of acid can cause significant effects (e.g. by deprotecting a resist polymer to render it more developer soluble), thus fewer fruitful photon collisions are required for develop, hence the increased sensitivity. The reliance on post-exposure acid diffusion (usually during post-exposure bakes) for successful exposures/developments can be somewhat limiting, especially in terms of the resolution and contrast of the resulting pattern.

It is therefore an object of the present invention to solve at least one of the problems of the prior art.

Another object of the invention is to provide a resist composition, suitably a photoresist composition, with a good balance between resolution and sensitivity.

SUMMARY OF THE INVENTION

According to a first aspect of the present invention there is provided a resist composition comprising an anti-scattering component and a resist component. The anti-scattering component suitably serves to reduce scattering (of either or both primary/incident radiation and/or secondary radiation) to thereby provide better exposure control and minimize proximity effects. The resist component suitably imparts resist qualities to the composition whereby the "developer-solubility" of (wavelength/radiation-appropriate) radiation-exposed portions of the composition (or coating thereof) is selectively transformed in contrast to unexposed portions, so that exposed and unexposed portions exhibit differential developer solubility. The anti-scattering component and resist component may be separate compounds, or may be mutually associated or somehow connected, whether chemically and/or physically, suitably by way of bonding. Such an association can facilitate interplay or collaboration between exposure control and sensitivity control functions for the benefit of each, thereby affording a resist composition that produces good resolution alongside good sensitivity.

According to a further aspect of the present invention, there is provided a resist composition comprising an anti-scattering component and a secondary electron generator (suitably as defined herein). The antiscattering component suitably is or comprises a resist component. The antiscattering component and secondary electron generator are suitably covalently or datively bonded to each other.

According to a further aspect of the present invention, there is provided an antiscattering-secondary electron generating hybrid compound (or complex) (AS-SEG hybrid), comprising a polymetallic cage compound covalently or datively bound to a secondary electron generator. The AS-SEG hybrid may comprise a secondary electron generator (suitably a metal centred compound or group, suitably with one or more of the properties defined herein) datively bonded to the polymetallic cage via one or more ligands associated with the polymetallic cage—e.g. the secondary electron generator behaves as an electron pair acceptor (or lewis acid).

According to a further aspect of the invention, there is provided a method of preparing a resist-coated material/substrate, the method comprising coating a substrate with a resist coating; wherein the resist coating comprises an optionally dried and/or cured resist composition as defined herein.

According to a further aspect of the invention, there is provided a resist-coated material/substrate obtainable by, obtained by, or directly obtained by a method of preparing a resist-coated material/substrate as defined herein.

According to a further aspect of the invention, there is provided a resist-coated material/substrate comprising a substrate coated with a resist coating; wherein the resist coating comprises an optionally dried and/or cured resist composition as defined herein.

According to a further aspect of the invention, there is provided a method of preparing a patterned substrate, the method comprising:
i) providing a resist-coated substrate as defined herein or applying a resist coating to a substrate;
ii) exposing part(s) of the resist coating to electromagnetic radiation to provide an exposed resist coating;
iii) developing the exposed resist coating to generate a resist pattern layer, the resist pattern layer comprising: developer-insoluble coating portions of the resist coating (i.e. ridges); and an array of grooves extending through the resist pattern layer;

wherein the resist coating comprises an optionally dried and/or cured resist composition as defined herein.

According to a further aspect of the invention, there is provided a patterned substrate obtainable by, obtained by, or directly obtained by a method of preparing a patterned substrate as defined herein.

According to a further aspect of the invention, there is provided a method of imaging, the method comprising:
i) providing a resist-coated substrate as defined herein or applying a resist coating to a substrate;
ii) exposing part(s) of the resist coating to electromagnetic radiation to provide an exposed resist coating;
iii) developing the exposed resist coating to generate a resist pattern layer, the resist pattern layer comprising: developer-insoluble coating portions of the resist coating (i.e. ridges); and an array of grooves extending through the resist pattern layer;

wherein the resist coating comprises an optionally dried and/or cured resist composition as defined herein.

According to a further aspect of the invention, there is provided a method of performing lithography, the method comprising:
i) providing a resist-coated substrate as defined herein or applying a resist coating to a substrate;
ii) exposing part(s) of the resist coating to radiation to provide an exposed resist coating;
iii) developing the exposed resist coating to generate a resist pattern layer, the resist pattern layer comprising: developer-insoluble coating portions of the resist coating (i.e. ridges); and an array of grooves extending through the resist pattern layer;
iv) optionally modifying the substrate, substrate surface, or part(s) thereof, underlying the resist pattern layer;
v) optionally removing the resist pattern layer to provide a modified substrate;

vi) optionally repeating, one or more times, step iv) and/or steps i)-v) (optionally with an alternative resist coating, such as a standard photoresist, instead of the resist coating; and optionally using alternative radiation during exposure) upon the modified substrate;

wherein step (i) of the method is optionally preceded by performing steps (i) to (vi) (i.e. pre-steps (i)-(vi)), optionally repeated one or more times, using either a resist coating or an alternative resist coating and using either electromagnetic radiation or alternative radiation during exposure;

wherein the resist coating comprises an optionally dried and/or cured resist composition as defined herein.

According to a further aspect of the invention, there is provided an imaged substrate obtainable by, obtained by, or directly obtained by the method of performing lithography as defined herein.

According to a further aspect of the invention, there is provided a method of manufacturing a lithographic mask (e.g. a photomask), the method comprising:
  i) providing a resist-coated substrate as defined herein or applying a resist coating to a substrate (suitably a substrate suitable for use in lithography);
  ii) exposing part(s) of the resist coating to electromagnetic radiation to provide an exposed resist coating;
  iii) developing the exposed resist coating to generate a resist pattern layer, the resist pattern layer comprising: developer-insoluble coating portions of the resist coating (i.e. ridges); and an array of grooves extending through the resist pattern layer;
  iv) optionally selectively modifying the substrate, substrate surface, or part(s) thereof, underlying the resist pattern layer (suitably such that the modified part(s) of the substrate or substrate surface have increased or decreased transparency to a pre-determined type of radiation, e.g. radiation used in photolithography, relative to the original substrate or unmodified part(s) of the substrate or substrate surface);
  v) optionally removing the resist pattern layer to provide a modified substrate;

wherein the resist coating comprises an optionally dried and/or cured resist composition as defined herein.

According to a further aspect of the invention, there is provided a lithographic mask (e.g. a photomask) obtainable by, obtained by, or directly obtained by the method of manufacturing a lithographic mask (e.g. a photomask) defined herein.

According to a further aspect of the invention, there is provided a method of performing lithography, the method comprising:
  i) providing a resist-coated substrate or applying a resist coating to a substrate (the resist coating may be any resist coating suitable for exposing via a lithographic mask, e.g. a photoresist);
  ii) exposing part(s) of the resist coating, through a lithographic mask (e.g. photomask) as defined herein (or obtainable by a method defined herein), to radiation (e.g. UV or visible light) to provide an exposed resist coating;
  iii) developing the exposed resist coating to generate a resist pattern layer, the resist pattern layer comprising: developer-insoluble coating portions of the resist coating (i.e. ridges); and an array of grooves extending through the resist pattern layer;
  iv) optionally modifying the substrate, substrate surface, or part(s) thereof, underlying the resist pattern layer;
  v) optionally removing the resist pattern layer to provide a modified substrate;
  vi) optionally repeating, one or more times, step iv) and/or steps i)-v) (with either a resist coating of the invention or an alternative resist coating, such as a standard photoresist; and optionally using electromagnetic radiation with or without a lithographic mask or alternative radiation during exposure) upon the modified substrate;

wherein step (i) of the method is optionally preceded by performing steps (i) to (vi) of this method and/or the method of performing photolithography (i.e. pre-steps (i)-(vi)), optionally repeated one or more times, using either a resist coating or an alternative resist coating and using either electromagnetic radiation or alternative radiation during exposure.

According to a further aspect of the invention, there is provided an imaged substrate obtainable by, obtained by, or directly obtained by the method of performing lithography as defined herein.

According to a further aspect of the invention, there is provided a method of fabricating an integrated circuit die or an integrated circuit wafer comprising a plurality of integrated circuit dice, the or each die comprising a plurality of electronic components, wherein the method comprises:
  i) providing a resist-coated substrate as defined herein or applying a resist coating to a substrate; and
  ii) exposing part(s) of the resist coating to radiation (e.g. UV) to provide an exposed resist coating;
  OR
  i) providing a resist-coated substrate or applying a resist coating to a substrate (the resist coating may be any resist coating suitable for exposing via a lithographic mask, e.g. a photoresist); and
  ii) exposing part(s) of the resist coating, through a lithographic mask (e.g. photomask) as defined herein (or obtainable by a method defined herein), to radiation (e.g. UV or visible light) to provide an exposed resist coating;
  AND
  iii) developing the exposed resist coating to generate a resist pattern layer, the resist pattern layer comprising: developer-insoluble coating portions of the resist coating (i.e. ridges); and an array of grooves extending through the resist pattern layer;
  iv) modifying the substrate, substrate surface, or part(s) thereof, underlying the resist pattern layer (this may involve conductively interconnecting the electronic components of the or each die with conductor(s));
  v) removing the resist pattern layer to provide a modified substrate;
  vi) optionally repeating, one or more times, step iv) and/or steps i)-v) (with either a resist coating of the invention or an alternative resist coating; and optionally using alternative radiation during exposure) upon the modified substrate;
  vii) optionally conductively interconnecting the electronic components of the or each die with conductor(s) (if not already performed during one or more substrate/substrate-surface modifying steps) to provide an integrated circuit with external contact terminals;
  viii) optionally performing one or more further finishing steps;
  ix) optionally separating an integrated circuit die from a wafer comprising a plurality of integrated circuit dice;

wherein step (i) of the method is optionally preceded by performing steps (i) to (vi) of this method (i.e. pre-steps (i)-(vi), optionally using either of the two step (i)/(ii) combinations) and/or performing steps (i) to (vi) of the method of performing lithography, optionally repeated one or more times, using either a resist coating of the invention or an alternative resist coating;

wherein the resist coating comprises an optionally dried and/or cured resist composition as defined herein.

According to a further aspect of the invention, there is provided an integrated circuit die obtainable by, obtained by, or directly obtained by a method of fabricating an integrated circuit die as defined herein.

According to a further aspect of the invention, there is provided an integrated circuit wafer comprising a plurality of integrated circuit dice, the integrated circuit wafer being obtainable by, obtained by, or directly obtained by a method of fabricating an integrated circuit wafer as defined herein. Such integrated circuits and wafers have a very high resistance, a high dry etch selectivity (typically above 20:1—i.e. the resist etches slower than the underlying silicon substrate by a factor of 20 or more). This in turn affords high aspect ratios.

According to a further aspect of the invention, there is provided a method of manufacturing an integrated circuit package, the integrated circuit package comprising a plurality of pins and an integrated circuit die with external contact terminals conductively connected to the corresponding plurality of pins, wherein the method comprises:
 i) providing an integrated circuit die as defined herein or fabricating an integrated circuit die by a method of fabricating an integrated circuit die as defined herein;
 ii) attaching the integrated circuit die to a package substrate, wherein the package substrate comprises electrical contacts, each of the electrical contacts being optionally connected or connectable to a corresponding pin;
 iii) conductively connecting each of the external contact terminals of the integrated circuit die to corresponding electrical contacts of the package substrate;
 iv) optionally (and if necessary) connecting the electrical contacts of the package substrate to corresponding pins;
 v) encapsulating the integrated circuit die.

According to a further aspect of the invention, there is provided an integrated circuit package obtainable by, obtained by, or directly obtained by a method of manufacturing an integrated circuit package as defined herein.

According to a further aspect of the invention, there is provided a method of manufacturing a circuit board comprising an integrated circuit package (suitably as defined herein) comprising a plurality of pins, wherein the method comprises:
 i) providing an integrated circuit package as defined herein or manufacturing an integrated circuit package by a method of manufacturing an integrated circuit package as defined herein;
 ii) conductively connecting the integrated circuit package to a circuit board.

According to a further aspect of the invention, there is provided a circuit board obtainable by, obtained by, or directly obtained by a method of manufacturing a circuit board as defined herein.

According to a further aspect of the invention, there is provided a method of manufacturing an electronic device or system, the electronic device or system comprising or being connectable to a power source and comprising a circuit board conductively connected to or connectable to a power source, wherein the method comprises:
 i) providing a circuit board as defined herein or manufacturing a circuit board by a method of manufacturing a circuit board as defined herein;
 ii) incorporating the circuit board within the electronic device or system.

According to a further aspect of the invention, there is provided an electronic device or system obtainable by, obtained by, or directly obtained by a method of manufacturing an electronic device or system as defined herein According to a further aspect of the invention, there is provided a use of a resist composition for coating a substrate with a resist coating; for patterning a substrate; for imaging; as a resist coating in lithography; for selectively modifying a surface of a substrate; for manufacturing a lithographic mask (such as those used in performing lithography or the production of integrated circuits etc.); for manufacturing a multi-layered substrate; for fabricating an integrated circuit die; for fabricating an integrated circuit wafer; for manufacturing an integrated circuit package; for manufacturing a circuit board; or for manufacturing an electronic device or system.

Though the resist composition of the invention may be suitable for use with a variety of radiation sources, including UV, eBeam, etc., most suitably the resist composition is a photoresist composition for use in photolithography, and any resist component is suitably a photoresist component.

However, the present invention also provides further aspects of the invention, such as "a composition", wherein the composition is suitably defined or suitably inherits any of the ingredients, properties, or parameters of any resist composition defined herein. Such "compositions" may be utilized in applications beyond resist or lithographic technologies, for example: the compositions may be deployed as self-healing compositions, for instance, alone or in admixture with one or more polymers in need of self-healing. The self-healing may then be induced with electromagnetic radiation as defined herein.

In a further aspect of the present invention there is provided an anti-scattering component or compound as herein defined.

In a further aspect of the present invention there is provided an antiscattering-resist hybrid component or compound as herein defined.

Any features, including optional, suitable, and preferred features, described in relation to any particular aspect of the invention may also be features, including optional, suitable and preferred features, of any other aspect of the present invention.

BRIEF DESCRIPTION OF THE DRAWINGS

For a better understanding of the invention, and to show how embodiments of the same are put into effect, reference is now made, by way of example, to the following diagrammatic drawings, in which.

DETAILED DESCRIPTION OF THE INVENTION

Definitions

Figure 1:
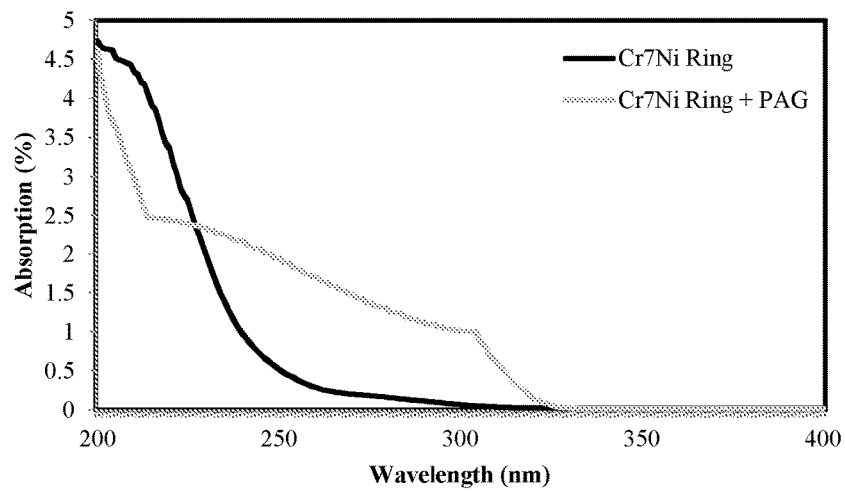
FIG. 1 shows a graph illustrating how radiation-absorption varies with incident wavelength for each of Formulations A(i) (i.e. $Cr_7Ni$ metal complex only) and Formulation A(ii) ($Cr_7Ni$ complex+photoacid generator).

Unless otherwise stated, the following terms used in the specification and claims have the following meanings set out below.

Herein, unless stated otherwise, the terms "radiation" and "irradiation" refer to the exposure of the resist composition, or coating thereof, to radiation that causes a physical or chemical change in the resist composition thereby allowing it to be "developed". The radiation in question may be any suitable radiation. Where electron-beam lithography is being performed, the radiation is electron beam radiation; where photolithography is being performed, electromagnetic radiation (usually UV) is used.

A "resist component" is a component which undergoes a change upon exposure to the relevant radiation (e.g. electron beam radiation, ionizing radiation, ultraviolet radiation). In some embodiments, the anti-scattering component is the/a resist component, especially where it reacts under exposure (or shortly thereafter) to yield a component of a different solubility. However, suitably the resist component is not the anti-scattering component per se, though in some embodiments it may be a part of (or otherwise associated with) the anti-scattering component. For instance, the anti-scattering component may be bonded to the resist component (or indeed a multiplicity of resist components, be them the same or different in each case) so that together they form a single compound or component, which may be termed a resist/anti-scattering hybrid. In some embodiments, one or more additional resist component(s) may be included within the resist composition, for example standard resist polymers such as PMMA. Where resist compositions excluded from the scope of the invention are used, such compositions may comprise other resist components, including a polymeric component, and may optionally be (substantially) free of an anti-scattering compound.

Herein, unqualified references to a "resist composition", "resist coating", "resist material", "resist-coated material", etc. may relate to a resist composition, coating, material, or coated material of the invention, or may relate to an alternative resist composition, coating, material, or coated material. Most preferably, an unqualified reference to a resist composition, coating, material, or coated material refers to an alternative resist.

"Alternative resist compositions" and coatings may be produced and used in accordance with standard workshop techniques well known to those skilled in the art. They may also be used in the same manner as defined herein in relation to resist compositions and coatings of the invention (including methods of coating, exposing, developing, removing, etc.), though the skilled person could readily adapt the methods defined herein to suit the alternative resists in question.

Herein "an anti-scattering compound" (which may in some cases be a resist component in itself or be otherwise associated with or bonded to a resist component) within a resist composition suitably serves to temper and control the impact of incident radiation, scattered radiation and/or secondary electrons on resist patterning. By minimising scattering events, the anti-scattering compound is thought to help focus and direct such radiation to the desired exposure sites, to thereby minimize any undesired exposure. This in turn allows for a much sharper, higher resolution image to be patterned within the resists in question. Moreover, the anti-scattering compound can prevent or reduce over-exposure of certain vulnerable components within the resist, which may otherwise compromise subsequent developing of the exposed resist. The anti-scattering compound therefore allows reduced blurring; reduce proximity effects (i.e. spillage of energy to otherwise unexposed parts of the resist); increased resolution, and increased aspect ratio (where aspect ratio is the depth divided by the width of the relevant pattern lines, whether grooves or ridges). Where an anti-scattering compound is described as containing one or more complexes whose charges do not cancel (to give a neutral compound), the actual antiscattering compound is a suitable salt of the non-neutral combination of complexes (thus giving a neutral compound overall). The skilled person will well understand that any remaining charges will generally be neutralised by appropriate countercations or counteranions. As such, throughout this specification the antiscattering compounds, and indeed any complexes, may be defined without said counterions.

Herein, the term "developer-insoluble" is intended to denote that a given coating portion has a relatively lower solubility in a developer than corresponding "developer-soluble" coating portions. It does not necessarily exclude where "developer-insoluble" coating portions have partial or even full solubility (if development times were sufficiently long) in a developer. As will be appreciated by those skilled in the art, coating portions are differentially designated as "developer-soluble" and "developer-insoluble" to indicate that parts of the coating (e.g. radiation-exposed parts) have different solubility properties, and thus typically a different chemical nature, to other parts of the coating (e.g. non-radiation-exposed parts). The nature of the developer is immaterial since this can be judiciously selected, depending on which portions of coating are intended for removal, on the basis of the differential solubility properties of the respective coating portions. Generally speaking, the term "solubility", as used in the context of developing, relates to kinetic solubility rather than thermodynamic solubility, since the speed of solubilisation is key though thermodynamic solubility may correlate with kinetic solubility, as would be understood by the skilled person.

In general, use of the terms "photoresist coating" and "electromagnetic radiation" in methods of the invention denote that a photoresist coating of the invention and electromagnetic radiation (usually UV) is used in said method at least once, but that alternative resist coating(s) and alternative radiation may optionally be used instead in one, some, or all of any other steps (e.g. repeat steps and/or pre-steps). Where, as in some methods of the invention, reference is made to optional repeat steps or pre-steps that involve "performing steps (i) to (vi) of the method of performing lithography", in this context performance of the method of performing lithography may optionally exclusively involve alternative resist coatings and alternative radiation instead of photoresist coatings of the invention and electromagnetic radiation—i.e. in this context reference to the method of performing lithography is merely a shorthand for repeat or pre-steps that may involve either photoresists of the invention or alternative resists.

Unless stated otherwise, any reference herein to an "average" value is intended to relate to the mean value.

Herein, unless stated otherwise, the term "parts by weight" (pbw) when used in relation to multiple ingredients/components, refers to relative ratios between said multiple ingredients/components. Though in many embodiments the amounts of individual components within a composition may be given as a "wt %" value, in alternative embodiments any or all such wt % values may be converted to parts by weight to define a multi-component composition. This is so because the relative ratios between components is often more important than the absolute concentrations thereof. Where a composition comprising multiple ingredients is described in terms of parts by weight alone (i.e. to indicate only relative ratios of ingredients), it is not necessary to stipulate the absolute amounts or concentrations of said ingredients (whether in toto or individually) because the advantages of the invention stem from the relative ratios of the respective ingredients rather than their absolute quantities or concentrations. However, suitably, the resist composition comprises at least 1 wt % of all the stipulated ingredients combined (excluding any diluents/solvents), suitably at least 5 wt %, suitably at least 10 wt %, suitably at least 15 wt %. Suitably the resist composition comprises at most 50 wt % of all the stipulated ingredients combined (excluding any diluents/solvents), suitably at most 30 wt %, suitably at most 20 wt % thereof. The balance (i.e. the remainder of the resist composition not constituted by the stipulated ingredients, excluding diluents/solvents) may consist essentially of a diluent(s)/solvent(s).

Herein, references to a "complex", such as a metal complex (e.g. primary metal complex) or co-ordination complex, will be well understood by those skilled in the art (especially in inorganic chemistry). Herein, complexes generally involve one or more metal species (generally metal ions) co-ordinated to one or more ligands. Where a particular complex is defined by reference to a formula and/or a list of components, unless stated otherwise, suitably such a complex may include any salt, solvate, or hydrate thereof and may additionally or alternatively include one or more optional extra/terminal ligands, and/or one or more additional metal species. In most embodiments, any defined complex may suitably include a salt thereof (especially where the complex has a net charge). Suitably, however, such a complex may be (substantially) as specifically defined (notwithstanding the optional salt form), i.e. may exclude a solvate, hydrate, or complex with one or more optional extra/terminal ligands, and/or one or more additional metal species. Moreover, where a particular complex is defined by a formula and/or a list of components, and absolute or relative amounts of the individual species of the complex are given (e.g. whether by reference to stoichiometry or moles of a species per mole of complex), unless stated otherwise this may suitably include any variants in which the absolute or relative amounts of the individual species are within +/−10% of those stipulated, more suitably within +/−5%, more suitably within +/−1%, more suitably within +/−0.1%, though in preferred embodiments the complex, including any absolute or relative amounts of individual species of the complex, is (substantially) as defined.

Herein, an unspecified number of a plurality of species of type X (e.g. be it a metal species, a ligand species, etc.) may be referred to as $X_1, X_2, \ldots, X_n$, or in the context of a complex may be stipulated as $[X_1X_2\ldots X_n]$, where $X_1$ is the first species of type X, $X_2$ is the second species of type X, and $X_n$ is the nth species of type X (e.g. $X_3, X_4, \ldots$).

Herein, unless stated otherwise, all chemical nomenclature may be defined in accordance with IUPAC definitions.

In this specification the term "alkyl" includes both straight and branched chain alkyl groups. References to individual alkyl groups such as "propyl" are specific for the straight chain version only and references to individual branched chain alkyl groups such as "isopropyl" are specific for the branched chain version only. For example, "(1-6C)alkyl" includes (1-4C)alkyl, (1-3C)alkyl, propyl, isopropyl and t-butyl. A similar convention applies to other radicals, for example "phenyl(1-6C)alkyl" includes phenyl(1-4C)alkyl, benzyl, 1-phenylethyl and 2-phenylethyl.

The term "(m-nC)" or "(m-nC) group" used alone or as a prefix, refers to any group having m to n carbon atoms. In embodiments stipulating a value for n that is greater than or equal to 6, n may optionally be a smaller number, for instance n may be 2, 4, or 5.

An "alkylene," "alkenylene," or "alkynylene" group is an alkyl, alkenyl, or alkynyl group that is positioned between and serves to connect two other chemical groups. Thus, "(1-6C)alkylene" means a linear saturated divalent hydrocarbon radical of one to six carbon atoms or a branched saturated divalent hydrocarbon radical of three to six carbon atoms, for example, methylene, ethylene, propylene, 2-methylpropylene, pentylene, and the like.

"(2-6C)alkenylene" means a linear divalent hydrocarbon radical of two to six carbon atoms or a branched divalent hydrocarbon radical of three to six carbon atoms, containing at least one double bond, for example, as in ethenylene, 2,4-pentadienylene, and the like.

"(2-6C)alkynylene" means a linear divalent hydrocarbon radical of two to six carbon atoms or a branched divalent hydrocarbon radical of three to six carbon atoms, containing at least one triple bond, for example, as in ethynylene, propynylene, and butynylene and the like.

"(3-8C)cycloalkyl" means a hydrocarbon ring containing from 3 to 8 carbon atoms, for example, cyclopropyl, cyclobutyl, cyclopentyl, cyclohexyl, cycloheptyl or bicyclo[2.2.1]heptyl.

"(3-8C)cycloalkenyl" means a hydrocarbon ring containing at least one double bond, for example, cyclobutenyl, cyclopentenyl, cyclohexenyl or cycloheptenyl, such as 3-cyclohexen-1-yl, or cyclooctenyl.

"(3-8C)cycloalkyl-(1-6C)alkylene" means a (3-8C)cycloalkyl group covalently attached to a (1-6C)alkylene group, both of which are defined herein.

The term "halo" refers to fluoro, chloro, bromo and iodo.

The term "heterocyclyl", "heterocyclic" or "heterocycle" means a non-aromatic saturated or partially saturated monocyclic, fused, bridged, or spiro bicyclic heterocyclic ring system(s). The term heterocyclyl includes both monovalent species and divalent species. Monocyclic heterocyclic rings contain from about 3 to 12 (suitably from 3 to 7) ring atoms, with from 1 to 5 (suitably 1, 2 or 3) heteroatoms selected from nitrogen, oxygen or sulfur in the ring. Bicyclic heterocycles contain from 7 to 17 member atoms, suitably 7 to 12 member atoms, in the ring. Bicyclic heterocycles contain from about 7 to about 17 ring atoms, suitably from 7 to 12 ring atoms. Bicyclic heterocyclic(s) rings may be fused, spiro, or bridged ring systems. Examples of heterocyclic groups include cyclic ethers such as oxiranyl, oxetanyl, tetrahydrofuranyl, dioxanyl, and substituted cyclic ethers. Heterocycles containing nitrogen include, for example, azetidinyl, pyrrolidinyl, piperidinyl, piperazinyl, tetrahydrotriazinyl, tetrahydropyrazolyl, and the like. Typical sulfur containing heterocycles include tetrahydrothienyl, dihydro-1,3-dithiol, tetrahydro-2H-thiopyran, and hexahydrothiepine. Other heterocycles include dihydro-oxathiolyl, tetrahydro-oxazolyl, tetrahydro-oxadiazolyl, tetrahydrodioxazolyl, tetrahydro-oxathiazolyl, hexahydrotriazinyl, tetrahydro-oxazinyl, morpholinyl, thiomorpholinyl, tetrahydropyrimidinyl, dioxolinyl, octahydrobenzofuranyl, octahydrobenzimidazolyl, and octahydrobenzothiazolyl. For heterocycles containing sulfur, the oxidized sulfur heterocycles containing SO or SO$_2$ groups are also included. Examples include the sulfoxide and sulfone forms of tetrahydrothienyl and thiomorpholinyl such as tetrahydrothiene 1,1-dioxide and thiomorpholinyl 1,1-dioxide. A suitable value for a heterocyclyl group which bears 1 or 2 oxo (=O) or thioxo (=S) substituents is, for example, 2-oxopyrrolidinyl, 2-thioxopyrrolidinyl, 2-oxoimidazolidinyl, 2-thioxoimidazolidinyl, 2-oxopiperidinyl, 2,5-dioxopyrrolidinyl, 2,5-dioxoimidazolidinyl or 2,6-dioxopiperidinyl. Particular heterocyclyl groups are saturated monocyclic 3 to 7 membered heterocyclyls containing 1, 2 or 3 heteroatoms selected from nitrogen, oxygen or sulfur, for example azetidinyl, tetrahydrofuranyl, tetrahydropyranyl, pyrrolidinyl, morpholinyl, tetrahydrothienyl, tetrahydrothienyl 1,1-dioxide, thiomorpholinyl, thiomorpholinyl 1,1-dioxide, piperidinyl, homopiperidinyl, piperazinyl or homopiperazinyl. As the skilled person would appreciate, any heterocycle may be linked to another group via any suitable atom, such as via a carbon or nitrogen atom. However, reference herein to piperidino or morpholino refers to a piperidin-1-yl or morpholin-4-yl ring that is linked via the ring nitrogen.

By "bridged ring systems" is meant ring systems in which two rings share more than two atoms, see for example *Advanced Organic Chemistry*, by Jerry March, 4$^{th}$ Edition, Wiley Interscience, pages 131-133, 1992. Examples of bridged heterocyclyl ring systems include, aza-bicyclo[2.2.1]heptane, 2-oxa-5-azabicyclo[2.2.1]heptane, aza-bicyclo[2.2.2]octane, aza-bicyclo[3.2.1]octane and quinuclidine.

"Heterocyclyl(1-6C)alkyl" means a heterocyclyl group covalently attached to a (1-6C)alkylene group, both of which are defined herein.

The term "heteroaryl" or "heteroaromatic" means an aromatic mono-, bi-, or polycyclic ring incorporating one or more (for example 1-4, particularly 1, 2 or 3) heteroatoms selected from nitrogen, oxygen or sulfur. The term heteroaryl includes both monovalent species and divalent species. Examples of heteroaryl groups are monocyclic and bicyclic groups containing from five to twelve ring members, and more usually from five to ten ring members. The heteroaryl group can be, for example, a 5- or 6-membered monocyclic ring or a 9- or 10-membered bicyclic ring, for example a bicyclic structure formed from fused five and six membered rings or two fused six membered rings. Each ring may contain up to about four heteroatoms typically selected from nitrogen, sulfur and oxygen. Typically the heteroaryl ring will contain up to 3 heteroatoms, more usually up to 2, for example a single heteroatom. In one embodiment, the heteroaryl ring contains at least one ring nitrogen atom. The nitrogen atoms in the heteroaryl rings can be basic, as in the case of an imidazole or pyridine, or essentially non-basic as in the case of an indole or pyrrole nitrogen. In general the number of basic nitrogen atoms present in the heteroaryl group, including any amino group substituents of the ring, will be less than five.

Examples of heteroaryl include furyl, pyrrolyl, thienyl, oxazolyl, isoxazolyl, imidazolyl, pyrazolyl, thiazolyl, isothiazolyl, oxadiazolyl, thiadiazolyl, triazolyl, tetrazolyl, pyridyl, pyridazinyl, pyrimidinyl, pyrazinyl, 1,3,5-triazenyl, benzofuranyl, indolyl, isoindolyl, benzothienyl, benzoxazolyl, benzimidazolyl, benzothiazolyl, benzothiazolyl, indazolyl, purinyl, benzofurazanyl, quinolyl, isoquinolyl, quinazolinyl, quinoxalinyl, cinnolinyl, pteridinyl, naphthyridinyl, carbazolyl, phenazinyl, benzisoquinolinyl, pyridopyrazinyl, thieno[2,3-b]furanyl, 2H-furo[3,2-b]-pyranyl, 5H-pyrido[2,3-d]-o-oxazinyl, 1H-pyrazolo[4,3-d]-oxazolyl, 4H-imidazo[4,5-d]thiazolyl, pyrazino[2,3-d]pyridazinyl, imidazo[2,1-b]thiazolyl, imidazo[1,2-b][1,2,4]triazinyl. "Heteroaryl" also covers partially aromatic bi- or polycyclic ring systems wherein at least one ring is an aromatic ring and one or more of the other ring(s) is a non-aromatic, saturated or partially saturated ring, provided at least one ring contains one or more heteroatoms selected from nitrogen, oxygen or sulfur. Examples of partially aromatic heteroaryl groups include for example, tetrahydroisoquinolinyl, tetrahydroquinolinyl, 2-oxo-1,2,3,4-tetrahydroquinolinyl, dihydrobenzthienyl, dihydrobenzfuranyl, 2,3-dihydro-benzo[1,4]dioxinyl, benzo[1,3]dioxolyl, 2,2-dioxo-1,3-dihydro-2-benzothienyl, 4,5,6,7-tetrahydrobenzofuranyl, indolinyl, 1,2,3,4-tetrahydro-1,8-naphthyridinyl, 1,2,3,4-tetrahydropyrido[2,3-b]pyrazinyl and 3,4-dihydro-2H-pyrido[3,2-b][1,4]oxazinyl Examples of five membered heteroaryl groups include but are not limited to pyrrolyl, furanyl, thienyl, imidazolyl, furazanyl, oxazolyl, oxadiazolyl, oxatriazolyl, isoxazolyl, thiazolyl, isothiazolyl, pyrazolyl, triazolyl and tetrazolyl groups.

Examples of six membered heteroaryl groups include but are not limited to pyridyl, pyrazinyl, pyridazinyl, pyrimidinyl and triazinyl.

A bicyclic heteroaryl group may be, for example, a group selected from:

a benzene ring fused to a 5- or 6-membered ring containing 1, 2 or 3 ring heteroatoms;

a pyridine ring fused to a 5- or 6-membered ring containing 1, 2 or 3 ring heteroatoms;

a pyrimidine ring fused to a 5- or 6-membered ring containing 1 or 2 ring heteroatoms;

a pyrrole ring fused to a 5- or 6-membered ring containing 1, 2 or 3 ring heteroatoms;

a pyrazole ring fused to a 5- or 6-membered ring containing 1 or 2 ring heteroatoms;

a pyrazine ring fused to a 5- or 6-membered ring containing 1 or 2 ring heteroatoms;

an imidazole ring fused to a 5- or 6-membered ring containing 1 or 2 ring heteroatoms;

an oxazole ring fused to a 5- or 6-membered ring containing 1 or 2 ring heteroatoms;

an isoxazole ring fused to a 5- or 6-membered ring containing 1 or 2 ring heteroatoms;

a thiazole ring fused to a 5- or 6-membered ring containing 1 or 2 ring heteroatoms;

an isothiazole ring fused to a 5- or 6-membered ring containing 1 or 2 ring heteroatoms;

a thiophene ring fused to a 5- or 6-membered ring containing 1, 2 or 3 ring heteroatoms;

a furan ring fused to a 5- or 6-membered ring containing 1, 2 or 3 ring heteroatoms;

a cyclohexyl ring fused to a 5- or 6-membered heteroaromatic ring containing 1, 2 or 3 ring heteroatoms; and a cyclopentyl ring fused to a 5- or 6-membered heteroaromatic ring containing 1, 2 or 3 ring heteroatoms.

Particular examples of bicyclic heteroaryl groups containing a six membered ring fused to a five membered ring include but are not limited to benzfuranyl, benzthiophenyl, benzimidazolyl, benzoxazolyl, benzisoxazolyl, benzthiazolyl, benzisothiazolyl, isobenzofuranyl, indolyl, isoindolyl, indolizinyl, indolinyl, isoindolinyl, purinyl (e.g., adeninyl, guaninyl), indazolyl, benzodioxolyl and pyrazolopyridinyl groups.

Particular examples of bicyclic heteroaryl groups containing two fused six membered rings include but are not limited to quinolinyl, isoquinolinyl, chromanyl, thiochromanyl, chromenyl, isochromenyl, chromanyl, isochromanyl, benzodioxanyl, quinolizinyl, benzoxazinyl, benzodiazinyl, pyridopyridinyl, quinoxalinyl, quinazolinyl, cinnolinyl, phthalazinyl, naphthyridinyl and pteridinyl groups.

"Heteroaryl(1-6C)alkyl" means a heteroaryl group covalently attached to a (1-6C)alkylene group, both of which are defined herein. Examples of heteroalkyl groups include pyridin-3-ylmethyl, 3-(benzofuran-2-yl)propyl, and the like.

The term "aryl" means a cyclic or polycyclic aromatic ring having from 5 to 12 carbon atoms.

The term aryl includes both monovalent species and divalent species. Examples of aryl groups include, but are not limited to, phenyl, biphenyl, naphthyl and the like. In particular embodiment, an aryl is phenyl.

The term "aryl(1-6C)alkyl" means an aryl group covalently attached to a (1-6C)alkylene group, both of which are defined herein. Examples of aryl-(1-6C)alkyl groups include benzyl, phenylethyl, and the like.

This specification also makes use of several composite terms to describe groups comprising more than one functionality. Such terms will be understood by a person skilled in the art. For example heterocyclyl(m-nC)alkyl comprises (m-nC)alkyl substituted by heterocyclyl.

The term "optionally substituted" refers to either groups, structures, or molecules that are substituted and those that are not substituted.

Where optional substituents are chosen from "one or more" groups it is to be understood that this definition includes all substituents being chosen from one of the specified groups or the substituents being chosen from two or more of the specified groups. Suitably examples for optional substituents include, though are not necessarily limited to, halide, amino, cyano, imino, enamino, (1-6C) alkylamino, di-[(1-6C)alkyl]amino, tri-[(1-6C)alkyl]amino, oxo, oxide, hydroxide (OH⁻), (1-6C)alkoxide, (2-6C)alkenyloxy, (2-6C)alkynyloxy, formyl, carboxy, (1-6C)alkoxycarbonyl, (2-6C)alkanoyl, (2-6C)alkanoyloxy, sulpho, sulphide, hydrogensulphide, (1-6C)alkylthio, (2-6C) alkenylthio, (2-6C)alkynylthio, thiocarbonyl, heterocyclyl containing at least one internal heteroatom selected from nitrogen, oxygen or sulphur, heteroaryl containing at least one internal hetero atom selected from nitrogen, oxygen or sulphur (e.g. pyridyl), or (where appropriate); wherein any CH, $CH_2$, or $CH_3$ is optionally substituted.

Unless stated otherwise, references herein to a "pKa" should be construed as a pKa value in water at standard ambient temperature and pressure (SATP), suitably of the conjugate acid of the relevant species.

Herein, the term "carbocyclyl", "carbocycle" or "carbocyclic" refers to a radical of a non-aromatic cyclic hydrocarbon group, generally having from 3 to 10 ring carbon atoms (i.e. (3-10C)carbocyclyl) and zero heteroatoms in the non-aromatic ring system. Suitably, carbocyclyl groups include (3-nC)cycloalkyl and (3-nC)cycloalkenyl. Exemplary embodiments include: cyclobutyl, cyclobutenyl, cyclopentyl, cyclopentenyl, cyclohexyl, cyclohexenyl, cyclohexadienyl, cycloheptyl, cycloheptenyl, cycloheptadienyl, cycloheptatrienyl, cyclooctyl, cyclooctenyl, bicyclo [2.2.1]heptanyl, bicyclo[2.2.2]octanyl, and the like.

Herein, the term "macrocyclyl", "macrocycle" or "macrocyclic" refers to macrocyclic rings, which are well known in the art. Such macrocycicic rings are suitably cyclic macromolecules or a macromolecular cyclic portions of a molecule. Suitably a macrocyclic ring has nine or more atoms within the ring. Suitably a macrocyclic ring has three or more internal electron-pair donating atoms. A macrocyclic ring is suitably a cyclic molecule able to co-ordinate to a central metal species (e.g. $Mg^{2+}$). Examples include porphyrins.

Herein, the term "hydrocarbyl" general refers any aliphatic, acyclic, or cyclic (including aryl) hydrocarbon group, suitably with no heteroatoms.

Herein, a "co-ordinating moiety" is suitably an atom or moiety which is capable of co-ordinating, suitably through dative bonding, with an otherwise separate atom, molecule, ion, or complex. Suitably a co-ordinating moiety is capable of accepting or donating one or more lone pair of electrons, though suitably a co-ordinating moiety is not capable of both accepting and donating.

Herein, a "polymetallic" system (e.g. a polymetallic cage) simply means a system (or complex) having more than one metal atom/ion therein, which may be the same or different (in terms of metal element, oxidation state, etc.). For instance, a metal complex comprising eight Cr(III) ions is polymetallic, as is a metal complex comprising seven Cr(III) ions and one Ni(II) ion. Polymetallic systems, such as a polymetallic cages, may be either homometallic (e.g. where all metal species are derived from the same metal element, even if some metal species have a different oxidation state to another) or heterometallic (e.g. where the metal species are a mixture of different metal species derived from a different metal element, whether or not the different metal species have the same or a different oxidation state). Most suitably, all the metal species of a homometallic complex are of the same oxidation state, though they may also have different oxidation states. Most suitably, different metal species within a heterometallic complex have a different oxidation state, though they may also have the same oxidation state.

Herein, a "secondary electron generator" is a component which releases secondary electrons following irradiation, suitably with electromagnetic radiation. In a particular embodiment, the secondary electron generator releases electrons when exposed to appropriate wavelengths of ultraviolet radiation (typically 5 eV and above).

Herein, the "effective atomic number ($Z_{eff}$)" of a compound is the average atomic number obtained from a weighted summation of the atomic constituents of a compound.

Though the skilled person will be aware of a variety of ways to calculate and/or measure $Z_{eff}$ (e.g. F. W. Spiers, *Effective Atomic Number and Energy Absorption in Tissues*, Br. J. radiol., 19,52, 1946), for the purpose of the present invention "effective atomic number ($Z_{eff}$)" is suitably calculated as a simple mass-weighted average, suitably using the formula:

$$Z_{eff} = \Sigma \alpha_i Z_i$$

Where $Z_i$ is the atomic number of the ith element in the compound, and $\alpha_i$ is the fraction of the sum total of the atomic numbers of all atoms in the compound (i.e. the total number of protons in the compound) constituted by said ith element. This formula may otherwise be expressed as:

$$Z_{eff} = \alpha_1 Z_1 + \alpha_2 Z_2 + \ldots (+\alpha_n Z_n)$$

for a compound comprising n elements.

This is similar to the Spiers equation (F. W. Spiers, *Effective Atomic Number and Energy Absorption in Tissues*, Br. J. radiol., 19, 52, 1946) but without the exponents used by Spiers. The Spiers equation states $Z_{eff}$ as follows:

$$Z_{eff}^p = \Sigma \alpha_i Z_i^p$$

where the exponent p is suitably approximately 3 (e.g. p=2.94). Though in certain embodiments, this Spiers definition (especially with p=2.94) of $Z_{eff}$ may be used, and any preferred, optional, and suitable values of $Z_{eff}$ disclosed herein may equally apply to the Spiers definition, preferably the abovementioned simple mass-weighted average definition of $Z_{eff}$ should be used.

The secondary electron generator may suitably be or comprise a compound having an effective atomic number ($Z_{eff}$) greater than or equal to 15 (optionally when the effective atomic number calculation excludes any solvates having a boiling point less than or equal to 150° C. at 100 kPa pressure) By way of example, though the metal compound/complex $HAuCl_4 \cdot 4H_2O$ (hydrogen tetrachloroauratetetrahydrate) has an effective atomic number ($Z_{eff}$) of 40.76 when the solvate ($4 \times H_2O$) is included in the calculation, $HAuCl_4 \cdot 4H_2O$ has an effective atomic number ($Z_{eff}$) of 49.99 when water (which has a boiling point less than 150° C.) is excluded from the calculation, because:

firstly, the $4H_2O$ part of the compound is excluded from the calculation because water is a solvate (or hydrate) having a boiling point of less than or equal to 150° at 100 kPa pressure (its boiling point is 150° at 100 kPa pressure);

The relevant atomic numbers of $HAuCl_4 \cdot 4H_2O$ are therefore:

$$Z_H = 1$$

$$Z_{Au} = 79$$

$$Z_{Cl} = 17$$

The sum total of all atomic numbers in $HAuCl_4 \cdot 4H_2O$, excluding $4H_2O$ (i.e. $HAuCl_4$), is:

$$Z_H + Z_{Au} + (4 \times Z_{Cl}) = 1 + 79 + (4 \times 17) = 148$$

The relevant atomic number fractions for $HAuCl_4 \cdot 4H_2O$ are:

$$\alpha_H = 1/148 = 0.00676$$

$$\alpha_{Au} = 79/148 = 0.53378$$

$$\alpha_{Cl} = (4 \times 17)/148 = 0.45946$$

The $Z_{eff}$ calculated using the equation $Z_{eff} = \alpha_H Z_H + \alpha_{Au} Z_{Au} + \alpha_{Cl} Z_{Cl}$ is:

$$Z_{eff} = (0.00676 \times 1) + (0.53378 \times 79) + (0.45946 \times 17)$$

$$Z_{eff} = 0.00676 + 42.168 + 7.81082 = 49.99$$

The effective atomic number of organic compounds can be calculated in exactly the same fashion—typically there will be no need to discount solvate molecules in such cases, since solvates are more commonly associated with metal complexes. The effective atomic number of polymers may also be calculated in the same manner, though it is simplest to perform such calculations upon the monomer only, since this yields the same result. As such, the $Z_{eff}$ of PMMA (or methylmethacrylate) is approximately ~5.85. The effective atomic number of co-polymers may again be calculated in the same manner, though this time weighted averages of the respective monomers should be built into the equation. Likewise, though not generally relevant to the present invention, the effective atomic number of compound mixtures or compositions may also be calculated by including weighted averages of the respective components thereof. The skilled person is perfectly capable of calculating the effective atomic number ($Z_{eff}$) for all compounds and compositions.

Wherever groups with large carbon chains are disclosed (e.g. (1-12C)alkyl, (1-8C)alkenyl, etc.), such groups may optionally be shorted, for instance containing a between 1 and 5 carbons (e.g. (1-5C)alkyl or (1-5C)alkenyl), or contain between 1 and 3 carbons (e.g. (1-3C)alkyl or (1-3C)alkenyl instead of (1-12C)alkyl or (1-8C)alkenyl).

Herein, unless stated otherwise, the weight percentage (wt %) of any given component within a composition suitably means the percentage by weight of said component based on the overall weight of the composition.

Herein, the term "consist essentially of", when used to describe the proportion of a given ingredient within a material, suitably means the material comprises at least 70 wt % of the given ingredient, more suitably at least 80 wt %, more suitably at least 90 wt %, more suitably at least 95 wt %, and most suitably at least 99 wt %.

Herein, the term "hydrocarbyl" refers to any hydrocarbon radical, including but not limited to alkyl, alkenyl, alkynyl, aryl.

When stipulated herein (usually in relation to Lewis acidic species), references to a metal atom, species, complex, or compound may include a boron and/or silicon metal atom, species, complex, or compound, even though boron and silicon are not strictly metal species as such. However, such metal atoms, species, complexes, or compounds may exclude corresponding boron and/or silicon atoms, species, complexes, or compounds.

General Methodology and Advantages of the Invention

The present invention provides resist compositions, such as photoresist compositions (whether positive or negative tone resist), which provide access to enhanced quality resist patterns deployable in the production of high-precision, high-specification electronic components (e.g. as per those present in integrated circuits). In particular, the quality and resolution of the imaged resist patterns facilitates production of extremely high quality, high resolution electronic components and integrated circuits, which in turn allows the size of integrated circuits to be reduced yet further. This in turn paves the way to even faster microprocessors and microprocessors that can operate within low-power mobile devices.

The deliberate inclusion of an anti-scattering component within a resist composition prevents, inhibits, or reduces undesirable radiation scattering, radiation absorption, and generation of secondary electrons. In so doing, proximity effects and blurring are minimised, thus allowing for higher resolution patterning. It also permits the use of very thin resist film layers.

This disclosure equips the skilled person to judiciously select appropriate resist compositions and methodologies to optimise the ultimate product. The examples and data provided herein provide a highly credible demonstration of the broad applicability of the invention to a range of resist compositions.

Resist Composition

The present invention provides a resist composition, most suitably a photoresist composition. Suitably the resist composition, or corresponding coatings thereof, react to at least some electromagnetic radiation wavelengths between 10 nm and 1000 nm, suitably between 50 nm and 700 nm, suitably between 100 nm and 400 nm, suitably between 150 and 300 nm, suitably between 170 and 280 nm. Suitably exposing the resist composition, or a coating thereof, to certain electromagnetic radiation with wavelength(s) falling within such ranges causes relevant exposed portions of the resist composition or coating thereof to change their developer-solubility properties relative to unexposed portions thereof.

The resist composition suitably comprises an anti-scattering component (also referred to herein as an anti-scattering compound). Though the anti-scattering component/compound may itself serve as a resist material, potentially even the sole resist material (for example it may cross-link upon exposure and/or post-exposure baking, or may otherwise fragment upon exposure and/or baking, to thereby exhibit contrasting developer-solubilities between exposed and unexposed portions), suitably the resist composition additionally comprises a resist component. The resist component may be distinct from the anti-scattering component, and may be an entirely different and separate compound. However, the anti-scattering component may itself comprise or be otherwise associated with or part of the resist component (for instance it may be associated with or otherwise bonded thereto and may, for example, be a group or moiety). Where the anti-scattering component comprises or is otherwise associated with the resist component (e.g. if the resist component is bonded thereto, e.g. via a dative bond), the two associated components may be collectively referred to as an "antiscatter-resist hybrid".

The resist composition may comprise one or more anti-scattering compounds as defined herein. The resist composition may comprise one or more resist components as defined herein.

Inclusion of the anti-scattering compound within the resist composition (and any resist coatings derived therefrom) suitably limits scattering (e.g. of primary and/or secondary radiation) during radiation exposure, to thereby better focus incident radiation upon an intended target site. This in turn increases lithographic resolution and minimizes proximity effects and/or blurring. Suitably the anti-scattering compound causes minimal forward- or back-scattering of electrons.

The resist component suitably serves the usual function of a resist, as known in the art—i.e. allowing for contrasting developer-solubilities between radiation-exposed and unexposed portions of a resist composition (or coating thereof). Typically, relevant portions of a resist composition (or coating thereof) become transformed upon exposure to radiation (which includes incident radiation, scattered radiation, and/or secondary radiation such as secondary electrons), to allow exposed and unexposed portions of the resist composition to exhibit differential developer-solubilities. Such differential in developer-solubilities may be induced directly by radiation-exposure, and/or may be facilitated by subsequent processing (e.g. post-exposure bake). Subsequent processing may affect the developer-solubility of the exposed portions, unexposed portions, or both, so as to provide a contrast therebetween. For instance, if a photoacid generator is used within the resist composition, a post-exposure bake will generally cause the acid, generated selectively at radiation-exposed portions of the resist composition/coating, to diffuse slightly and ultimately trigger the resist component to react in a manner that changes the local developer-solubility (e.g. through acid-deprotections, etc.). (e.g. to become more developer-soluble as per positive tone resists, or less developer-soluble as per negative tone resists). Such exposure-induced transformations may perpetuate molecular fragmentation, whether of the resist component itself and/or other ingredients of the resist composition; and/or may perpetuate bond formation, whether between resist components and/or other ingredients. In particular embodiments, especially where the resist composition comprises an anti-scattering component that is associated with or bonded to one or more resist components, radiation exposure promotes chemical reactivity between proximal resist components (e.g. via high energy intermediates such as radicals), suitably between resist components associated with neighbouring (but distinct) anti-scattering components.

The resist composition may further comprise a photosensitive component, such as a photoinitiator, photoacid, or photosensitiser. In the context of the invention, a photosensitive component is suitably a component that is activated to undergo or otherwise trigger chemical reactions upon exposure to radiation/photons. In some embodiments, the resist component may be or otherwise contain or comprise a photosensitive component. However, the photosensitive component may be a separate photoinitiator or photoelectron generator. Such additional photosensitive component(s) may promote exposure-induced chemical reactions that lead to contrasting developer-solubilities between exposed and unexposed portions. However, in a particular embodiment, the resist composition is (substantially) free of a photoacid or a photoinitiator.

In preferred embodiments, radiation-exposure causes (suitably even without an additional photosentitive component) the resist component to react in situ (during exposure) so as to precipitate an exposed portion of the resist composition/coating with a different developer-solubility to corresponding unexposed portions. Though post-exposure bakes and/or other post-exposure processing steps may be employed prior to development of an exposed resist composition/coating, suitably such additional processing steps are not required to trigger the chemical reactions involved in affording contrasting developer-solubilities between exposed and unexposed portions.

The resist composition may suitably further comprise a resist cross-linker, which is suitably a cross-linking component that reacts with the resist component (e.g. during exposure or during post-exposure processing) to facilitate cross-linking between resist components or between a resist component and another component. Where a resist component is said to be capable of reacting with another resist component, such a reaction may be indirect and may involve an intervening resist cross-linker. Suitable cross-linkers are known in the art.

The resist composition may suitably further comprise a Plasmon component, suitably as defined herein.

Suitably the resist composition (e.g. pre-coating) comprises a diluent or solvent. Suitably the resist composition comprises between 20 and 99.5 wt % solvent, suitably between 50 and 99 wt %, more suitably between 80 and 98.5 wt % solvent, more suitably between 95 and 99 wt % solvent. As such, the resist composition suitably comprises between 0.5 and 80 wt % non-solvent components, suitably between 1 and 50 wt % non-solvent components, more suitably between 1.5 and 20 wt % non-solvent components, more suitably between 1 and 5 wt % non-solvent components. Suitably the resist composition is a solution, suitably which is free of any dispersed or suspended particulate matter. Suitably the resist composition is suitable for spinning onto a surface (e.g. spin-coating), suitably to provide a (substantially) homogeneous coating on said surface. Suitably the resist composition is (substantially) free of any particulate matter. Suitably the resist composition is (substantially) free of any nanoparticles, especially free of any metal(0) nanoparticles or metal-containing nanoparticles.

The resist composition may comprise one or more optional additional components.

In a particular embodiment, the resist composition comprises:

100 pbw anti-scattering compound/component; and
0-10000 pbw resist component.

The resist composition may be a negative tone resist composition or a positive tone resist composition. Most suitably, the resist composition is a negative tone resist composition.

Resist Component

The resist composition, or a corresponding resist coating, suitably comprises a resist component, suitably in addition to the anti-scattering component. The resist composition may further comprise a resist cross-linker capable of reacting with and forming cross-links between resist components or between a resist component and another species.

The skilled person is readily able to select an appropriate developer based on the resist component(s) being used. Suitably the developer is selected based on its ability to selectively dissolve either radiation-exposed portions (e.g. in the case of positive tone resists) of a resist composition/coating or non-radiation-exposed portions (e.g. in the case of negative tone resists) thereof, depending on the nature of the relevant resist component(s) and/or other ingredients present within the resist composition/coating.

The resist component may be a positive tone resist component (which suitably reacts to render a resist composition/coating more developer-soluble in radiation-exposed regions) or a negative tone resist component (which suitably reacts to render a resist composition/coating less developer-soluble in radiation-exposed regions). Typically, a positive tone resist component may fragment upon radiation-exposure (e.g. via photolytic bond cleavage reactions) or post-exposure processing, or may otherwise react (under radiation-exposure or post-exposure processing) so as to render the resist composition/coating more developer-soluble. In contrast, typically a negative tone resist component reacts with and becomes bonded to other component(s) (e.g. other resist components), optionally via a cross-linker.

The resist component(s) suitably comprise one or more π-systems, which π-systems are suitably cross-linkable or otherwise susceptible to photolytic coupling.

In an embodiment, the resist component is distinct and separate from the anti-scattering component (at least in terms of its molecular structure). Any suitable resist component may be used, suitably in conjunction with an appropriate developer (i.e. solvent that selectively dissolves either exposed or unexposed portions of the resist component). Suitably the resist component reacts with exposure radiation, whether directly (e.g. where exposure radiation causes the resist component to chemically transform and potentially undergo further chemical reactions) or indirectly (e.g. where exposure radiation causes a component of the resist composition, such as a photoinitiator or photoacid, to undergo a chemical transformation which eventually, possibly during post-exposure processing, causes the resist component chemically transform and potentially undergo further chemical reactions).

A wide variety of resist components (e.g. resist polymers), including both positive and negative tone resists, are known in the art, any of which are suitable for use in the context of the invention where an anti-scattering co-ingredient can deliver beneficial results. Often negative tone resist components are polymerized and/or cross-linked (directly or indirectly, e.g. via intervening crosslinkers or intervening molecules to which a resist component is attached) during radiation-exposure or post-exposure processing (e.g. post-exposure bakes).

Thus, the resist component(s) may be or comprise polymerisable monomer(s)/co-monomer(s) or fragmentable polymer(s).

Examples of suitable resist components for use with the present invention include inter alia: Polymethyl methacrylates (PMMAs); Poly(methylmethacrylate-co-methacrylic acid) (PMMA co MA); Poly(α-methylstyrene-co-methacrylic acid methyl ester) (PMS co Cl-MMA); Polystyrenes (PS); Polyimides (PI); Polyhydroxystyrenes (PSOH); Poly(hydroxystyrene-co- methyl methacrylate) (PSOH co MMA); (Long-chain) hydrocarbons; Novolacs (i.e. phenol resins comprising formaldehyde-phenol-ratio of less than 1:1); poly(l-naphthyl methacrylate), poly(l-vinylnaphthalene), poly(2,6-napthalenevinylene), poly(2-chlorostyrene), poly(2,6-dichlorostyrene), poly(2-vinylthiophene), poly(N-vinylphthalimide), poly(vinyl phenyl sulphide), polyhydroxystyrene or any suitable mixture or copolymer thereof.

Though the resist compositions of the invention may comprise distinct resist component(s) (e.g. resist polymers or resins, such as those above), in other embodiments the resist component(s) are alternatively or additionally associated with the anti-scattering component of the resist composition. For instance, the resist component(s) may be associated with or otherwise bonded to the anti-scattering component and may, for example, be a group or moiety of the anti-scattering component (e.g. a ligand or part thereof). Where the anti-scattering component comprises or is otherwise associated with the resist component (e.g. via a dative bond), the two associated components may be collectively referred to as an "antiscatter-resist hybrid". Further details of such embodiments are provided below in relation to the anti-scattering component.

Anti-Scattering Component/Compound

The anti-scattering component suitably functions within the resist composition/coating to limit scattering events (or scattering probabilities) within the resist composition/coating during radiation exposure. Such scattering inhibition is thought to be a consequence of a lower density of scattering centers and/or lower scattering cross-sections for the scattering centers present.

Since radiation scattering (especially of primary/incident radiation) causes untargeted portions of a resist composition/coating to become exposed by the scattered radiation (as primary radiation is deflected "off-course"), incorporating an anti-scattering component into a resist composition in accordance with the invention can afford significant improvements in lithographic resolution, improved aspect ratios, and/or reduced blurring. Under such circumstances, the primary radiation may be considered to be more "focused" towards a target site (whether the target is dictated by a mask, such as a photomask, or directional beam) in the presence of an anti-scattering component.

The anti-scattering component or compound may itself comprise one or more sub-components. Suitably, one or more components (especially complex(es), for example, polymetallic cages and/or polymetallic ring systems) of the anti-scattering compound has a molecular structure with a significant amount of free internal space. Suitably the anti-scattering compound as a whole (in view of the arrangement of the individual components thereof—e.g. an association of a plurality of metal cages or rings optionally arranged around a common hub or one or more linker components) has a structure with a significant amount of free internal space. Without wishing to be bound by theory, it is thought that such free empty space is a key contributor to the advantageous properties of the anti-scattering compound, and helps to minimise primary radiation scattering. As such, the anti-scattering compound suitably has a high mean free path ($\lambda$)—i.e. the distance between successive electron collisions is high. Suitably the anti-scattering compound has a low scattering cross-section ($\sigma$)—i.e. the chances of a collision are low.

Though metal organic frameworks (MOFs), well known in the art for their porous open (suitably 3-dimensional) crystal structures, can provide compounds and complexes with a significant amount of free empty space (typically used in practice for the absorption of gases), the anti-scattering compound, especially when a part of a resist coating (i.e. pre-exposed), is most suitably (substantially) non-crystalline and/or does not form 3-dimensional crystal/lattice structures. Such a lack of propensity to form 3-dimensional crystalline structures may indicate that the anti-scattering compound has more suitable solubility properties thereby enabling more uniform coating (e.g. spin-coating) of the resist composition. As such, most suitably the anti-scattering compound is not a metal-organic framework (MOF). Suitably, the anti-scattering compound is (substantially) non-porous.

Suitably the anti-scattering compound has a relatively low density. Where the anti-scattering compound actually comprises one or more resist component(s) (e.g. datively bonded therein), the anti-scattering compound may comprise localized regions of high-density where the resist component(s) reside, and yet suitably still relatively low-densities elsewhere (i.e. distal from the resist component(s)). Such configurations maximize anti-scattering effects of the resist composition as a whole, whilst promoting sensitivity to radiation at the key target sites (i.e. resist component(s)). As such, the resist composition suitably comprises regions of relatively low density (to limit scattering) and regions of relatively high density where it is needed (i.e. at the site of resist component(s)).

Suitably, the anti-scattering compound has a density less than or equal to 2.5 $g/cm^3$, suitably less than or equal to 2.0 $g/cm^3$, suitably less than or equal to 1.6 $g/cm^3$. Where the anti-scattering compound and resist component(s) are distinct entities, the anti-scattering compound may suitably have a density less than or equal to 1.5 $g/cm^3$, suitably less than 1.3 $g/cm^3$, suitably less than or equal to 1.2 $g/cm^3$, suitably less than or equal to 0.95 $g/cm^3$, suitably less than or equal to 0.9 $g/cm^3$, suitably less than or equal to 0.85 $g/cm^3$, suitably less than or equal to 0.8 $g/cm^3$, suitably less than or equal to 0.7 $g/cm^3$. Suitably the anti-scattering compound has a density greater than or equal to 0.4 $g/cm^3$, suitably greater than or equal to 0.5 $g/cm^3$, suitably greater than or equal to 0.55 $g/cm^3$, suitably greater than or equal to 0.6 $g/cm^3$. In a particular embodiment, the anti-scattering compound has a density between 0.6 $g/cm^3$ and 0.85 $g/cm^3$. In a particular embodiment, the anti-scattering compound has a density less than or equal to 1.2 $g/cm^3$. Where resist component(s) are associated or part of the anti-scattering compound, the anti-scattering compound suitably has a density greater than or equal to 0.9 $g/cm^3$, suitably greater than or equal to 1.2 $g/cm^3$.

Suitably, the anti-scattering compound has a molecular weight greater than or equal to 1000 g/mol, suitably greater than 2000 g/mol, suitably greater than or equal to 5000 g/mol, suitably greater than or equal to 10,000 g/mol, suitably greater than or equal to 15,000 g/mol. Suitably, the anti-scattering compound has a molecular weight less than or equal to 300,000 g/mol, suitably less than or equal to 200,000 g/mol, suitably less than or equal to 100,000 g/mol, suitably less than or equal to 50,000 g/mol, suitably less than or equal to 20,000 g/mol, suitably less than or equal to 5000 g/mol.

Suitably, the anti-scattering compound (substantially) does not generate secondary electrons (at least in the absence of any attached secondary electron generator), as ionization products, in response to exposure to primary radiation, especially where the primary radiation is greater than 150 nm, suitably when the primary radiation 180 nm.

The anti-scattering compound is suitably a metal-organic complex. Suitably the anti-scattering compound is a polymetallic compound. The anti-scattering compound suitably does not comprise an elemental metal (i.e. metal(0)). Suitably any metal species of the anti-scattering compound are metal ions.

The anti-scattering compound suitably comprises a primary metal complex (PMC). Suitably the primary metal complex is defined as set forth herein, and is suitably a metal cage, most suitably a polymetallic cage (suitably with at least one trivalent metal species and at least one divalent metal species, though in certain embodiments all metal species may be trivalent, whether all trivalent metal species are derived from the same or a different metal element). Metal cages may include those disclosed in or similar to those disclosed in G. F. S. Whitehead, F. Moro, G. A. Timco, W. Wernsdorfer, S. J. Teat and R. E. P. Winpenny, "A Ring of Rings and Other Multicomponent Assemblies of Clusters", Angew. Chem. Int. Ed., 2013, 52, 9932-9935. In some embodiments, the polymetallic cage is homometallic. In preferred embodiments, the polymetallic cage is heterometallic (i.e. having two or more, most suitably exactly two, different metal elements).

The primary metal complex may be neutral or charged (whether positively or negatively). The anti-scattering compound may, especially where the primary metal complex is charged, comprise one or more counterions (e.g. $C^1$, $C^2, \ldots, C^c$), suitably as defined herein, suitably associated with the primary metal complex as part of a primary metal complex salt. As such, the anti-scattering compound may be defined by, or may comprise units defined by, a primary metal complex salt of Formula A:

$(C^1{}_{i1}C^2{}_{i2}\ldots C^c{}_{ic})(PMC)_p$ wherein PMC is a primary metal complex, suitably as defined herein, and p is the relative stoichiometry of PMC in Formula A or p is the number of moles of PMC per mole of Formula A; and wherein $C^1$ is a first counterion, $C^2$ is a second counterion, and $C^c$ is a cth counterion, suitably as defined herein, wherein i1, i2, and ic, is the relative respective stoichiometry of each of $C^1, C^2, \ldots,$ and $C^c$ in Formula A or i1, i2, and ic, are the respective number of moles of each of $C^1, C^2, \ldots,$ and $C^c$ per mole of Formula A.

p may have any suitable value, and is preferably a non-zero integer. p may suitably be a value (suitably an integer) between 1 and 6.

In preferred embodiments, there are either no counterion species (i.e. i1, i2, and ic, are all zero) associated with the primary metal complex or the primary metal complex is associated with (i.e. the primary metal complex salt comprises) only a single (type of) counterion species (i.e. i1 is non-zero but i2, and ic are zero). Suitably the stoichiometry or relative number of moles of PMC and counterion(s) is such that the resulting primary metal complex salt is neutral. However, the presence of additional charged components (e.g. linker components—see below) within the anti-scattering compound may mean the primary metal complex salt need not be neutral.

The anti-scattering compound suitably comprises a linker component (or one or more linker components), suitably associated with (e.g. electrostatically and/or covalently, most suitably at least partially covalently) one or more, preferably two or more primary metal complexes. Suitably the linker component(s) is defined as set forth herein, and is suitably a complex or compound capable of co-ordinating with (i.e. forming dative bonds with) one or more (preferably two or more) primary metal complexes. The complex resulting from one or more linker component(s) being associated with one or more primary metal complex(es) may be termed a "hybrid complex".

The anti-scattering compound may be defined by, or may comprise units defined by, a hybrid complex of Formula B:

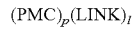
$(PMC)_p(LINK)_l$ wherein PMC is a primary metal complex, suitably as defined herein, and p is the relative stoichiometry of PMC in Formula B or p is the number of moles of PMC per mole of Formula B; and wherein LINK is a linker component, suitably as defined herein, and l is the relative stoichiometry of LINK in Formula B or l is the number of moles of LINK per mole of Formula B.

p may have any suitable value, and is preferably a non-zero integer. p may suitably be a value (suitably an integer) between 1 and 120 (where 120 is the theoretical limit), suitably between 1 and 48. p may suitably be a value (suitably an integer) between 1 and 30, suitably between 2 and 24, more suitably between 2 and 8, suitably between 4 and 6. Most suitably p is an even integer (especially 2, 4, or 6).

l may have any suitable value (including 0), and is suitably zero or a non-zero integer, most suitably a non-zero integer. l may suitably be a value (suitably an integer) between 0 and 10, suitably between 0 and 2, more suitably 0 or 1, most suitably 1.

The primary metal complex (e.g. PMC) and/or the linker component (e.g. LINK) may be neutral or charged (whether positively or negatively). Where both are present, both the primary metal complex and the linker component may be charged and, in some embodiments, each may have charges of opposing polarity (i.e. one being negatively charged, the other being positively charged, and potentially thereby electrostatically associated with one another in addition to any dative/covalent interactions therebetween). If the primary metal complex(es) have charges of opposing polarities to the linker component(s), the overall charges of these species within the anti-scattering compound may be zero (i.e. the charges may neutralise one another to give a compound or unit of Formula A having no net charge). Alternatively, the anti-scattering compound may, especially where a hybrid complex has a net charge (i.e. is non-neutral), comprise one or more counterions (e.g. $C^1, C^2, \ldots, C^c$), suitably as defined herein, suitably associated with the hybrid complex (and/or associated with either or both of the primary metal complex or/and linker component) as part of a hybrid complex salt. As such, the anti-scattering compound may be defined by, or may comprise units defined by, a hybrid complex salt of Formula C:

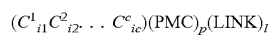
$(C^1{}_{i1}C^2{}_{i2}\ldots C^c{}_{ic})(PMC)_p(LINK)_l$ wherein PMC is a primary metal complex, suitably as defined herein, and p is the relative stoichiometry of PMC in Formula C or p is the number of moles of PMC per mole of Formula C;

wherein LINK is a linker component, suitably as defined herein, and l is the relative stoichiometry of LINK in Formula C or l is the number of moles of LINK per mole of Formula C; and wherein $C^1$ is a first counterion, $C^2$ is a second counterion, and $C^c$ is a cth counterion, suitably as defined herein, wherein i1, i2, and ic, is the relative respective stoichiometry of each of $C^1, C^2, \ldots,$ and $C^c$ in Formula C or i1, i2, and ic, are the respective number of moles of each of $C^1, C^2, \ldots,$ and $C^c$ per mole of Formula C.

p may have any suitable value, and is preferably a non-zero integer. p may suitably be a value (suitably an integer) between 1 and 120 (where 120 is the theoretical limit), suitably between 1 and 48. p may suitably be a value (suitably an integer) between 1 and 30, suitably between 2 and 24, more suitably between 2 and 8, suitably between 4 and 6. Most suitably p is an even integer (especially 2, 4, or 6).

l may have any suitable value (including 0), and is suitably zero or a non-zero integer, most suitably a non-zero integer. l may suitably be a value (suitably an integer) between 0 and 10, suitably between 0 and 2, more suitably 0 or 1, most suitably 1.

Either or both of the primary metal complex and linker component within a hybrid complex (or salt thereof) may be each independently associated with any of the counterions, and/or the counterions may be associated with the hybrid complex as a whole.

Suitably the hybrid complex salt is neutral overall.

The anti-scattering agent may comprise one or more additional metal complexes (AMC) (or salt(s) thereof), optionally associated with one or more counterions and/or one or more linker components as defined herein in relation to the primary metal complex. Any additional metal complex(es) are different from the primary metal complex (e.g. be it in terms of the metal species and/or ligands or the relative stoichiometries thereof). However, though different from the primary metal complex, any, some, or all of the additional metal complex(es) may be defined as set forth herein in relation to any primary metal complex. As such, any additional metal complex(es) may be a metal cage, such as a polymetallic cage, suitably wherein all metal species are divalent or where the metal sites are in different oxidation states. This polymetallic cage may be homometallic. However, the metal cage of the AMC may be as per any of those defined herein in relation to a primary metal complex. Where one or more additional metal complex(es) are present in addition to a primary metal complex, suitably at least one, preferably two, metal species of the addition metal complex(es) are different to those of the primary metal complex.

The anti-scattering agent may therefore be defined by, or may comprise units defined by, a hybrid complex or hybrid complex salt of Formula D:

$(C^1{}_{i1}C^2{}_{i2}\ldots C^c{}_{ic})(PMC)_{p-a}(AMC)_a(LINK)_l$ wherein PMC is a primary metal complex, suitably as defined herein, and p-a is the relative stoichiometry of PMC in Formula D or p-a is the number of moles of PMC per mole of Formula D;
wherein AMC is one or more additional metal complex(es), suitably as defined herein (optionally in the same manner as PMC so long as the AMC(s) differ from PMC), and a is the relative stoichiometry of AMC in Formula D or a is the number of moles of AMC per mole of Formula D;
wherein LINK is a linker component, suitably as defined herein, and l is the relative stoichiometry of LINK in Formula C or l is the number of moles of LINK per mole of Formula C; and
wherein $C^1$ is a first counterion, $C^2$ is a second counterion, and $C^c$ is a cth counterion, suitably as defined herein, wherein i1, i2, and ic, is the relative respective stoichiometry of each of $C^1$, $C^2$, ..., and $C^c$ in Formula C or i1, i2, and ic, are the respective number of moles of each of $C^1$, $C^2$, ..., and $C^c$ per mole of Formula C.

p may have any suitable value, and is preferably a non-zero integer. p may suitably be a value (suitably an integer) between 1 and 120 (where 120 is the theoretical limit), suitably between 1 and 48. p may suitably be a value (suitably an integer) between 1 and 30, suitably between 2 and 24, more suitably between 2 and 8, suitably between 4 and 6. Most suitably p is an even integer (especially 2, 4, or 6).

a may have any suitable value, and is preferably zero or a non-zero integer. a may suitably be a value (suitably an integer) between 1 and 30, suitably between 2 and 24, more suitably between 2 and 8, suitably between 4 and 6. Most suitably a is an even integer (especially 2, 4, or 6). However, suitably p-a is greater than zero.

l may have any suitable value (including 0), and is suitably zero or a non-zero integer, most suitably a non-zero integer. l may suitably be a value (suitably an integer) between 0 and 10, suitably between 0 and 2, more suitably 0 or 1, most suitably 1.

Optionally the hybrid complex of Formula D may be free of counterions—i.e. all of i1, i2, ic are zero.

Suitably the antiscattering agent comprises a primary metal complex but is (substantially) free of any additional metal complex(es). However, where additional metal complex(es) are present, they may be considered a substitute for a portion of the primary metal complex, and parameters and values may optionally be as defined herein as if the additional metal complex(es) were in fact the substituted primary metal complex.

References to any metal salts and/or complexes of the anti-scattering compound generally relate to the pre-mixed (i.e. prior to mixing with other components of the resist composition) form of such salts/complexes (i.e. in terms of cationic-anionic associations), and suitably also relate to the pre-coated, pre-cured, pre-exposed, pre-baked, pre-developed form thereof. It will be appreciated by those skilled in the art that, upon mixing with other components of the resist composition (and/or after coating, curing, exposing, baking and/or developing), the relevant cations, anions, and ligands of the metal salts and/or complexes of the anti-scattering compound may, in some embodiments (though not all), dissociate and possibly become associated with other counterions and/or ligands. Therefore, references to a resist composition (or indeed a coating, or a cured-, exposed-, or developed-product thereof) suitably indicates a resist composition (or a coating, or a cured-, exposed-, or developed-product thereof) "formed by" (or derived from) mixing said anti-scattering compound with any other ingredients of the resist composition. It is straightforward for those skilled in the art, using standard techniques, to determine the input in respect of the anti-scattering compound from a resist composition or a coated, cured-, exposed-, baked- or developed-product thereof.

Suitably, any metal salts and/or complexes of the anti-scattering compound comprise a two or more metal species.

The anti-scattering compound is suitably soluble in any diluent(s) or solvent(s) or diluent/solvent system of the resist composition (i.e. is soluble in a coating solvent system, which may be considered the diluents/solvents within the pre-coated resist composition). Suitably, at standard ambient temperature and pressure (SATP) the anti-scattering compound has a solubility of at least 1 mg/g in the coating solvent system, suitably at least 2 mg/g, suitably at least 10 mg/g, suitably at least 20 mg/g. Suitably the coating solvent system in question to which these solubility limits apply comprises or consists essentially of a (1-10C)hydrocarbyl solvent system, most preferably hexane.

The anti-scattering compound is suitably soluble in any diluent(s) or solvent(s) or diluent/solvent system of the pre-determined developing medium (especially where the resist composition is a negative tone resist composition). Suitably, at standard ambient temperature and pressure (SATP) the anti-scattering compound has a solubility of at least 1 mg/g in the developing medium, suitably at least 2 mg/g, suitably at least 10 mg/g, suitably at least 20 mg/g. Suitably the developing medium in question to which these solubility limits apply comprises or consists essentially of a (1-10C)hydrocarbyl solvent system, most preferably hexane.

Most suitably, the antiscattering agent is soluble, suitably within at least the limits defined herein, both a coating solvent system and a pre-determined developing medium.

Suitably, the anti-scattering component/compound is a resist component (i.e. serves a dual function) and/or comprises a resist component, suitably one or more resist components. Suitably such resist component(s) are fragmentable (e.g. as per positive tone resists) or cross-linkable (e.g. as per negative tone resists). Suitably, the resist component(s) are associated with or a part of one or more primary metal complexes. Anti-scattering components which are or comprise said resist component(s) may be referred to as anti-scattering-resist hybrid components.

Primary Metal Complex (and/or Additional Metal Complex)

The anti-scattering compound suitably comprises a primary metal complex. In some embodiments, the anti-scattering compound may consist of or consist essentially of a primary metal complex (and optionally one or more counterions). Suitably the primary metal complex is a metal cage, suitably a metal cage with no (direct) metal-metal bonds.

The primary metal complex suitably comprises at least two types of metal ion, wherein the at least two types of metal ion comprise the same or different metals. Where the metal ions are based on the same metal, suitably the respective metal ions have a different oxidation state.

The primary metal complex is suitably a polymetallic complex. The primary metal complex is suitably a polymetallic metal cage complex comprising a plurality of at least one type of metal ion interlinked via one or more bridging ligands (i.e. as differentiated from direct metal-metal bonds). Any suitable bridging ligands may be used, though commonly it may be a monodentate (e.g. fluoro) or bidentate (e.g. carboxylate) ligand.

The polymetallic complex may be homometallic (e.g. composed of metal species derived from the same element, whether or not they are of the same oxidation state, though most suitably all the metal species of a homometallic PMC are of the same oxidation state, suitably metal (III)). Alternatively, and most suitably, the polymetallic complex is heterometallic (e.g. composed of metal species derived from different metal elements, whether or not are of the same oxidation state, though most suitably the relevant metal species of a heterometallic PMC are of different oxidation states, most suitably metal (II) and metal(III).

The primary metal complex suitably comprises one or more metal species, each of which may be suitably denoted $M^1, M^2, \ldots, M^n$ (see below). As such, the primary metal compound suitably comprises at least one metal species $M^1$. Suitably, where there is only one metal species $M^1$ within a PMC, said metal species has an oxidation state of III (i.e. +3) (though for an AMC preferably II—+2). In a particular embodiment, the primary metal complex comprises Cr(III) as the only metal species, with each complex most suitably comprising 8 Cr(III) units each.

Suitably the primary metal complex comprises two or more (different/different types of) metal species, each of which may be suitably denoted $M^1, M^2, \ldots, M^n$. As such, suitably the primary metal complex comprises a metal species $M^1$, a metal species $M^2$, and optionally one or more additional metal species (e.g. $M^3, \ldots, M^e$). Suitably the two or more (different) metal species (suitably at least $M^1$ and $M^2$) of the primary metal complex are two or more (different) metal ions. $M^1$ and $M^2$ are suitably derived from the same metal element and have a different valency, or are suitably derived from a different metal element and have the same or a different valency. Suitably two or more of the (different) metal ions (suitably at least $M^1$ and $M^2$) have a different oxidation state, suitably an oxidation state which differs by one, most suitably one of the metal ions (suitably $M^1$) being trivalent (i.e. an oxidation state of III, or +3) and another of the metal ions (suitably $M^2$) being divalent (i.e. an oxidation state of II, or +2). Where there are two or more metal species, both or all may be derived of the same metal element but be of a different oxidation state. This may, for instance, include a PMC having both Fe(II) and Fe(III) species.

Suitably the two or more (different) metal species (suitably at least $M^1$ and $M^2$) are derived from two or more different metals. As such, suitably the anti-scattering compound is a heterometallic polymetallic compound (i.e. containing two or more different metal species). Suitably at least one of the two or more (different) metal species (or at least one of $M^1$ and $M^2$) is a transition metal (d-block) species, more suitably at least two of the two or more (different) metal species (or both of $M^1$ and $M^2$) are transition metal (d-block) species. In an embodiment, both $M^1$ and $M^2$ are transition metal ions such that the primary metal complex is a transition metal complex. Suitably at least one of the two or more (different) metal species (or at least one of $M^1$ and $M^2$) is a transition metal species of the 3d-block of the periodic table of elements, more suitably at least two of the two or more (different) metal species (or both of $M^1$ and $M^2$) are transition metal species of the 3d-block of the periodic table of element.

Suitably at least one of the two or more (different) metal species (or at least one of $M^1$ and $M^2$, most suitably $M^1$) is a trivalent metal species, suitably selected from the group including $Cr^{III}$, $Fe^{III}$, $V^{III}$, $Ga^{III}$, $Al^{III}$, or $In^{III}$, though most suitably the trivalent metal species (suitably $M^1$) is $Cr^{III}$. Suitably at least one (preferably one other than the aforementioned trivalent metal species) of the two or more (different) metal species (or at least one of $M^1$ and $M^2$, most suitably $M^2$) is a divalent metal species, suitably selected from the group including $Ni^{II}$, $Co^{II}$, $Zn^{II}$, $Mn^{II}$, $Mg^{II}$, $Ca^{II}$, $Sr^{II}$, $Ba^{II}$, $Cu^{II}$, or $Fe^{II}$, though most suitably the divalent metal species (suitably $M^2$) is $Ni^{II}$.

In a particular embodiment, the primary metal complex (and hence the anti-scattering compound) comprises at least one trivalent metal species (suitably $M^1$, suitably selected from the group including $Cr^{III}$, $Fe^{III}$, $V^{III}$, $Ga^{III}$, $Al^{III}$, or $In^{III}$; most suitably $Cr^{III}$) and at least one divalent metal species (suitably $M^2$, suitably selected from the group including $Ni^{II}$, $Co^{II}$, $Zn^{II}$, $Mn^{II}$, $Mg^{II}$, $Ca^{II}$, $Sr^{II}$, $Ba^{II}$, $Cu^{II}$, or $Fe^{II}$; most suitably $Ni^{II}$).

Suitably the primary metal complex comprises two or more moles of the metal species (i.e. combined) per mole of primary metal complex (e.g. two or more moles of $M^1$ and/or $M^2$, suitably two or more moles of $M^1$ and $M^2$ combined— e.g. $[M^1_x M^2_y]$ where $x+y \geq 2$), suitably three or more moles of the metal species per mole of primary metal complex, suitably four or more, suitably five or more, suitably six or more, suitably seven or more, most suitably about eight moles of the metal species per mole of primary metal complex. Suitably the primary metal complex comprises twelve or fewer moles of the metal species (i.e. combined) per mole of primary metal complex, suitably ten or fewer.

Suitably, at least one of the metal species of the primary metal complex(es) is magnetic, suitably paramagnetic, suitably two or more metal species thereof.

Suitably the primary metal complex comprises more (suitably by moles or stoichiometry ratio) trivalent metal species (e.g. $M^1$) than divalent metal species (e.g. $M^2$), suitably at least two times more, suitably at least three times more, suitably at least four times more, suitably at least seven times more. Suitably the molar ratio of $M^1$ (which is suitably trivalent) to $M^2$ (which is suitably divalent) within the primary metal complex is between 12:1 and 1:1, suitably between 10:1 and 2:1, suitably between 9:1 and 3:1, more suitably between 8:1 and 6:1, most suitably about 7:1.

Suitably, the anti-scattering component/compound comprises (especially when part of an anti-scattering compound comprising or associated with a/the resist component) one or more primary metal complexes, wherein:
  one or more primary metal complexes are interconnected (or cross-linked) by one or more interlinking groups (which may suitably represent a resist component or a portion thereof)—such a configuration is especially apt for positive tone resist compositions comprising a positive tone antiscattering-resist hybrid component;
  the primary metal complex(es) comprise one or more cross-linkable or polymerisable moieties (which may suitably represent a resist component or portion thereof)—such a configuration is especially apt for negative tone resist compositions comprising a negative tone antiscattering-resist hybrid component.

Where the resist composition comprises an antiscattering-resist hybrid component, suitably said antiscattering-resist hybrid serves the dual function of an anti-scattering component and a resist component, though the resist component may be isolated a the portion of the anti-scattering component that undergoes radiation-exposure-induced transformations. Suitably a negative tone antiscattering-resist hybrid component is susceptible to cross-linking (suitably whereby multiple negative tone antiscattering-resist hybrid components, in particular primary metal complexes thereof, become cross-linked to each other), suitably upon radiation exposure. Suitably a positive tone antiscattering-resist hybrid component is susceptible to fragmentation (whereby suitably the relevant resist component part of the positive tone antiscattering-resist hybrid component is cleaved so as to release multiple primary metal complexes), suitably upon radiation exposure.

Most suitably, the resist composition comprises a negative tone antiscattering-resist hybrid component, wherein the antiscattering-resist hybrid component comprises a primary metal complex comprising one or more resist components (suitably associated therewith or bonded thereto, for instance, via dative bonds). As such, the resist component(s) may be ligand(s) to the corresponding primary metal complex(es).

Suitably (especially where associated with an anti-scattering component/compound) the resist component(s) comprise one or more π-systems. Suitably the resist component(s) comprise one or more organic (i.e. carbon-containing) moieties comprising a π-system. Suitably the primary metal complex comprises such resist component(s). A suitable π-system may, for instance: include:
  a π-system characterized by a carbon-carbon double bond or triple bond;
  a carbon-heteroatom double bond or triple bond;
  an aromatic or heteroaromatic ring system;
  a conjugated π-system involving carbon and optionally heteroatom(s).

Suitably such t-system(s) can or can be caused to interlink (or cross-link) together, suitably across multiple primary metal complex units, so as to implement a form of polymerization and/or cross-linking between primary metal complex units. Suitably, such cross-linking between primary metal complex units may be induced by radiation exposure (suitably as described herein) or by chemical species (e.g. photoacids—e.g. triflic acid) arising from radiation exposure of the resist composition/coating. Most suitably, such cross-linking is caused directly by radiation exposure (e.g. through photolytic reactions). An schematic example of such cross-linking chemistry is depicted in Scheme 1 below.

Scheme 1—Schematic illustration of cross-linking chemistry between the π-systems two neighboring antiscattering-resist hybrid components

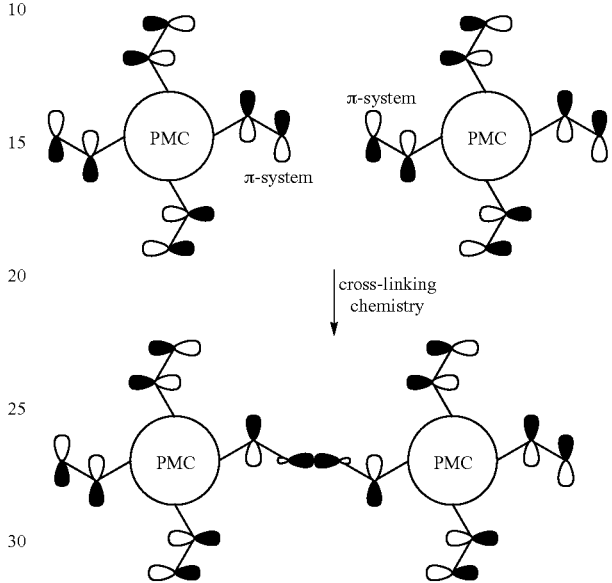

Suitably one or more ligands associated with or bound (preferably via a dative bond) to the primary metal complex(es) of the antiscattering-resist hybrid component are or comprise the resist component(s). Such ligands may be termed "resist ligands". A resist ligand thus suitably comprises a cross-linkable atom or group (e.g. a π-system) and a co-ordination donor atom or group. One or more such resist ligand(s) may be incorporated within a primary metal complex as a replacement for any other ligand defined herein in relation to an anti-scattering compound, or in addition thereto. For instance, a primary metal complex may comprise a mixture of resist ligand(s) and other ligands described elsewhere herein (e.g. non-resist ligands such as alkanoates).

Suitably the donor atom or group comprises a lone-pair bearing heteroatom (e.g. suitably a nitrogen and/or oxygen atom), suitably two or more lone-pair bearing heteroatoms (thereby facilitating polydentate co-ordination of the ligand via said donor atoms or groups). For example, the resist ligand may comprise a carboxylate, carboxylate ester, or carboxylic acid group—this comprises two oxygen atoms each of which bear lone-pairs capable of co-ordination with a metal centre of a primary metal complex.

Suitably the cross-linkable atom or group comprises a π-system, suitably a terminal π-system, most suitably a terminal alkene group. For example, the resist ligand may comprise a terminal alkene group.

Suitably, especially where the primary metal complex is a polymetallic metal cage or other polymetallic species, at least one or more of the resist ligands (suitably all) are externally co-ordinated within the corresponding primary metal complex (i.e. resides on the exterior portion of the cage as opposed to an internal portion or crevice within the cage). Such a juxtaposition of the ligand facilitates crosslinking chemistry which may otherwise be hindered for resist ligands residing within a metal cage structure.

Particularly suitable resist ligands may be independently selected from the group consisting of an optionally substituted: alkenoate, alkenoic acid, alkenoic ester, alkenoic amide, alkynoate, alkynoic acid, alkynoic ester, alkynoic amide, or a mixture thereof. In a particular embodiment, the resist ligand(s) are selected from the group consisting of: (optionally substituted) alkenoate, alkenoic acid, alkenoic ester, alkenoic amide, or a mixture thereof. In a particular embodiment, the resist ligand(s) are selected from the group consisting of: (optionally substituted) (2-20C)alkenoate, (2-20C)alkenoic acid, (2-20C)alkenoic ester, (2-20C)alkenoic amide, or a mixture thereof. In a particular embodiment, the resist ligand(s) are selected from the group consisting of: (optionally substituted) (2-12C)alkenoate, (2-12C)alkenoic acid, (2-12C)alkenoic ester, (2-12C)alkenoic amide, or a mixture thereof. In a particular embodiment, the resist ligand(s) are selected from the group consisting of: (optionally substituted) (2-6C)alkenoate, (2-6C)alkenoic acid, (2-6C)alkenoic ester, (2-6C)alkenoic amide, or a mixture thereof.

Suitably any optional substituents of any of the aforementioned prevent neither co-ordination within the primary metal complex or crosslinking (under relevant conditions). Suitably, any or all of the aforementioned groups comprise at least one terminal alkene or alkyne moiety.

In a particular embodiment, the resist ligand(s) comprises one or more lone pair-bearing heteroatoms (e.g. N and/or O), and one or more terminal alkene groups. In a particular embodiment, the resist ligand(s) comprise a (2-20C)alkene optionally substituted by one or more heteroatoms.

In a particular embodiment, the resist ligand(s) is selected from the group consisting of: 2-methyl-4-pentenoic acid, di-allylamine, N,N methylenebisacrylamide (bis-AMD), or pentaerythritol tetraacrylate.

The primary metal complex suitably comprises between 1 and 16 resist ligands (or resist components), suitably between 2 and 12, suitably between 4 and 10. Suitably, the primary metal complex comprises between 1 and 16 alkene groups (suitably cross-linkable alkene groups), suitably between 2 and 12, suitably between 4 and 10.

The primary metal complex suitably comprises one or more ligands, suitably one or more ligands co-ordinated to one, more, or all (or both) of the metal species (e.g. $M^1$ and/or $M^2$) of the primary metal complex. The primary metal complex suitably comprises ligands (including mixtures of ligands) of a sufficient type and in sufficient numbers to bind together (suitably indirectly, suitably via dative bonds) all of the metal species within the primary metal complex, suitably to form a metal cage, suitably without any metal-metal bonds. As such, the primary metal complex suitably comprises one or more bridging ligands, suitably which are capable of providing a bridge between two or more metal species—such bridging ligands may be polydentate, such as bidentate, but may also be monodentate where they are capable of donating more than one lone pair if electrons, such as with fluoro or oxygen-based ligands). Most suitably the primary metal complex comprises a mixture of two or more different types of ligand, wherein suitably one of the types of ligand is bidentate and another is monodentate. Most suitably, all of the ligands within the primary metal complex have co-ordinating atoms capable of donating more than one lone pair of electrons. Suitably, the primary metal complex comprises ligands of sufficient types and numbers (may be a mixture of monodentate ligands such as fluoro, and bidentate ligands such as carboxylate) to afford an average of at least 3 dative bonds per individual metal species within the complex (e.g. each individual $M^1$ and $M^2$ species within a complex forms an average of at least 3 dative bonds with ligands associated with the complex), suitably at least 4 dative bonds, most suitably about 6 dative bonds. Suitably the co-ordination sites of all the metal species may be completely filled/saturated (e.g. especially where the primary metal complex is intended to serve as a lewis basis within the overall anti-scattering compound) by the ligands within the complex, or there may be one or more vacant co-ordination sites amongst the metal species (e.g. especially where the primary metal complex is intended to serve as a lewis acid within the overall anti-scattering compound).

Suitably at least some, suitably all, ligands are negatively charged, most suitably bearing a single negative charge. Suitably the conjugate acid of the ligand(s) of the primary metal complex have a pKa value (in water at standard ambient temperature and pressure) greater than or equal to 2, suitably greater than or equal to 3.

Suitably, the ligand(s) of the primary metal complex are selected from monodentate ligands, bidentate ligands, or mixture(s) thereof. Most suitably, the ligand(s) of the primary metal complex comprise a mixture of monodentate ligands and bidentate ligands.

The monodentate ligand(s) suitably have a co-ordinating atom(s) (the atoms to and/or from which dative bonds are formed with metal species) bearing more than one lone pair of electrons, most suitably fluoride.

The bidentate ligands suitably have at least one, more suitably two, co-ordinating atoms bearing more than one lone pair of electrons, most suitably carboxylate (e.g. an optionally substituted organic carboxylate, e.g. optionally substituted hydrocarbyl carboxylates, such as acetate, pivalate, 3,3-dimethylbutanoate, benzoate, 4-tert-butylbenzoate, isonicotinate). In some embodiments (especially where the primary metal complex is intended to serve as a Lewis base), the ligands of the primary metal complex comprise at least two different types of bidentate ligand (e.g. comprise a first and second bidentate ligand) or carboxylate ligand. In such embodiments, suitably at least one of the bidentate ligands (e.g. the second) comprises a co-ordinating atom(s) capable of forming an internal dative bond(s) with metal species within the primary metal complex and one or more additional co-ordinating atoms capable of forming external dative bonds with metal species of another (different) complex or cage. Suitably such bifunctional ligands (e.g. the second bidentate ligand) may include a carboxylate group and an additional oxygen- or nitrogen-containing moiety, preferably a nitrogen-containing moiety, examples of which include iso-nicotinate and 4-aminobenzoate. However, in some embodiments (especially where the primary metal complex is intended to serve as a Lewis acid), the ligands of the primary metal complex are free of any additional co-ordinating atoms capable of forming external dative bonds with metal species of another (different) complex or cage, and may suitably comprise one type of bidentate ligand or carboxylate ligand.

In a particular embodiment, the primary metal complex is defined by Formula I or comprises units defined by Formula I:

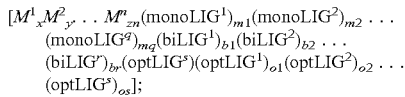

OR is defined as comprising, consisting essentially of, or being formed by mixing together, reacting, or otherwise combining (per each mole of primary metal complex):
- x moles of a first metal species ($M^1$)
- y moles of a second metal species ($M^2$);
- optionally zn moles of each additional nth metal species ($M^n$)
- m1 moles of a first monodentate ligand ($monoLIG^1$)
- optionally m2 moles of a second monodentate ligand ($monoLIG^2$)
- optionally mq moles of each additional qth monodentate ligand ($monoLIG^q$)
- b1 moles of a first bidentate ligand ($biLIG^1$)
- optionally b2 moles of a second bidentate ligand ($biLIG^2$)
- optionally br moles of each additional rth bidentate ligand ($biLIG^r$)
- o1 moles of a first optional extra/terminal ligand ($optLIG^1$)
- o2 moles of a second optional extra/terminal ligand ($optLIG^2$)
- os moles of each additional optional sth extra/terminal ligand ($optLIG^s$)

wherein:
- $M^1$ is a first metal species, suitably as defined herein (most suitably a trivalent metal ion, e.g. $Cr^{3+}$);
- $M^2$ is a second metal species, suitably as defined herein (most suitably a divalent metal ion, e.g. $Ni^{2+}$);
- $M^n$ is an nth metal species, suitably as defined herein (most suitably is absent);
- $monoLIG^1$ is a first monodentate ligand, suitably as defined herein (most suitably a monoanion whose conjugate acid has a $pK_a \geq 2$, suitably fluoride);
- $monoLIG^2$ is a second monodentate ligand, suitably as defined herein (most suitably absent);
- $monoLIG^q$ is a qth monodentate ligand, suitably as defined herein (most suitably absent);
- $biLIG^1$ is a first bidentate ligand, suitably as defined herein (most suitably carboxyate, suitably, suitably without any additional heteroatoms);
- $biLIG^2$ is a second bidentate ligand, suitably as defined herein (most suitably absent or a carboxylate bearing an additional oxygen- or nitrogen-containing moiety, most preferably an additional nitrogen-containing moiety);
- $biLIG^r$ is a rth bidentate ligand, suitably as defined herein (most suitably absent);
- $optLIG^1$ is a first optional extra ligand (suitably having a denticity of d), suitably as defined herein (most suitably absent, or is a polydentate ligand of denticity d, such as N-methyl-D-glucamine where d=6, a solvent or carboxylic acid);
- $optLIG^2$ is a second optional extra/terminal ligand, suitably as defined herein (most suitably absent or a solvent or carboxylic acid);
- $optLIG^s$ is a sth optional extra/terminal ligand, suitably as defined herein (most suitably absent or a solvent or carboxylic acid);

Most suitably x, y, zn, m1, m2, mq, b1, b2, br, o1, o2, os, are zero or integers, though in some examples any, some, or all of these may have an intermediate value between 0 and 1 or between any two integers.

x is suitably a number (most suitably an integer) between 1 and 16, suitably between 4 and 10; more suitably between 2 and 8; suitably 7.

y is suitably a number (most suitably an integer) between 0 and 15, suitably between 0 and 7; suitably between 0 and 2, suitably 0 or 1, most suitably 1.

zn is suitably a number (most suitably an integer) between 0 and 14, suitably between 0 and 6; suitably between 0 and 2; suitably 0.

m1 is suitably a number (most suitably an integer) between 0 and 40; suitably between 0 and 20 or between 0 and 10; suitably between 1 and 20; suitably between 2 and 12; suitably between 4 and 10; suitably 8.

m2 is suitably a number (most suitably an integer) between 0 and 39; suitably between 0 and 18; suitably between 0 and 10; suitably between 0 and 2; suitably 0.

mq is suitably a number (most suitably an integer) between 0 and 38; suitably between 0 and 17; suitably between 0 and 9; suitably between 0 and 2; suitably 0.

b1 is suitably a number (most suitably an integer) between 0 and 20; suitably between 1 and 20; suitably between 1 and 16; suitably between 12 and 16; suitably between 12 and 15; suitably 15 or 16.

b2 is suitably a number (most suitably an integer) between 0 and 20; suitably between 0 and 16; suitably between 0 and 8; suitably between 0 and 3; suitably between 1 and 4; suitably 0 or 1.

br is suitably a number (most suitably an integer) between 0 and 19; suitably between 0 and 15; suitably between 0 and 7; suitably between 0 and 2; suitably 0.

o1 is suitably a number (most suitably an integer) between 0 and 8, suitably between 0 and 4, suitably 0 or 1, most suitably 0.

o2 is suitably a number (most suitably an integer) between 0 and 7, suitably between 0 and 3, suitably 0 or 1, most suitably 0.

os is suitably a number (most suitably an integer) between 0 and 6, suitably between 0 and 2, suitably 0 or 1, most suitably 0.

In an embodiment, the primary metal complex is defined by Formula I or comprises units defined by Formula I:

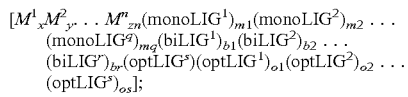

wherein:
- $M^1$ is a first metal species and x is the number of moles of $M^1$ per mole of primary metal complex, wherein x is a number between 1 and 16;
- $M^2$ is a second metal species and y is the number of moles of $M^2$ per mole of primary metal complex, wherein y is a number between 0 and 7;
- $M^n$ is an nth metal species and zn is the number of moles of each $M^n$ per mole of primary metal complex, wherein zn is a number between 0 and 6; suitably between 0 and 2; suitably 0;
- $monoLIG^1$ is a first monodentate ligand and m1 is the number of moles of $monoLIG^1$ per mole of primary metal complex, wherein m1 is a number between 0 and 20;

monoLIG$^2$ is a second monodentate ligand and m2 is the number of moles of monoLIG$^2$ per mole of primary metal complex, wherein m2 is a number between 0 and 10;

monoLIG$^q$ is a qth monodentate ligand and mq is the number of moles of each monoLIG$^q$ per mole of primary metal complex, wherein mq is a number between 0 and 2;

biLIG$^1$ is a first bidentate ligand and b1 is the number of moles of biLIG$^1$ per mole of primary metal complex, wherein b1 is a number between 1 and 20;

biLIG$^2$ is a second bidentate ligand and b2 is the number of moles of biLIG$^2$ per mole of primary metal complex, wherein b2 is a number between 0 and 16;

biLIG$^r$ is a rth bidentate ligand and br is the number of moles of each additional biLIG$^r$ per mole of primary metal complex, wherein br is a number between 0 and 2;

optLIG$^1$ is a first optional extra ligand and o1 is the number of moles of optLIG$^1$ per mole of primary metal complex, wherein o1 is a number between 0 and 4;

optLIG$^2$ is a second optional extra/terminal ligand and o2 is the number of moles of optLIG$^2$ per mole of primary metal complex, wherein o2 is a number between 0 and 3;

optLIG$^s$ is a sth optional extra/terminal ligand and os is the number of moles of each additional optional optLIG$^s$ per mole of primary metal complex; wherein os is a number between 0 and 2.

In an embodiment, the primary metal complex is defined by Formula Ia or comprises units defined by Formula I:

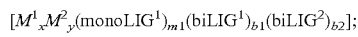

wherein:

M$^1$ is a first metal species and x is the number of moles of M$^1$ per mole of primary metal complex, wherein x is a number between 4 and 10;

M$^2$ is a second metal species and y is the number of moles of M$^2$ per mole of primary metal complex, wherein y is a number between 0 and 2;

monoLIG$^1$ is a first monodentate ligand and m1 is the number of moles of monoLIG$^1$ per mole of primary metal complex, wherein m1 is a number between 4 and 10;

biLIG$^1$ is a first bidentate ligand and b1 is the number of moles of biLIG$^1$ per mole of primary metal complex, wherein b1 is a number between 12 and 16;

biLIG$^2$ is a second bidentate ligand and b2 is the number of moles of biLIG$^2$ per mole of primary metal complex, wherein b2 is a number between 0 and 3.

Suitably, the sum of x and y is at least 2, more suitably at least 3, suitably at least 4, suitably at least 5, suitably at least 6, suitably at least 7, suitably about 8. Suitably, the sum of x and y is at most 16, suitably at most 12, suitably at most 10. Suitably x is at least 4, suitably at least 6, suitably at most 10, and is most suitably about 7. In a particular embodiment y is 0 (i.e. there is no second metal species at all), but preferably y is non-zero, suitably at least 1, and is most suitably about 1. Most suitably, x is 7+/−δ (i.e. δ=at most 10% of x, suitably at most 1% of x) and y is 1−/+δ. In a particular embodiment, M$_1$ is Cr$^{3+}$, M$_2$ is Ni$^{2+}$, the sum of x and y is between 7 and 10; and x is between 6 and 10. In a particular embodiment, M$_1$ is Cr$^{3+}$, M$_2$ is Ni$^{2+}$, x is about 7 and y is about 1.

Most suitably the primary metal complex comprises no further metal species beyond the first metal species (M$^1$) and optionally the second metal species (M$^2$), and thus zn is zero. However, in some examples, the primary metal complex may be doped, for instance, with small quantities of alternative metal species to judiciously vary the properties of the anti-scattering compound. In such embodiments, the sum of any or all zn values (z3+z4+ . . . +zn) is suitably less than the sum of x and y, suitably at least 5 times less (i.e. at most a fifth of the sum of x+y), suitably at least 10 times less, suitably at least 100 times less.

Suitably, the sum of:
(m1+m2++mq); (i.e. the sum of moles of monodentate ligand(s) per mole of complex)
2×(b1+b2++bq); (i.e. twice the sum of moles of bidentate ligand(s) per mole of complex)
o1×d (i.e. d times the moles of optional extra ligand(s) per mole of complex)

is less than or equal to 50, suitably less than or equal to 42, suitably less than or equal to 40, suitably more than or equal to 30, suitably more than or equal to 38, suitably about 40.

Suitably, the sum of m1, m2, . . . , and mq is at least 1, suitably at least 2, suitably at least 3, suitably at least 6, suitably at most 7, suitably at most 16, suitably at most 12, suitably at most 10, most suitably about 8. In preferred embodiments, there are no monodentate ligands beyond a first monodentate ligand (i.e. m2 and mq are both 0). In a particular embodiment, monoLIG$^1$ is fluoride (F). In a particular embodiment, monoLIG$^1$ is fluoride (F), m1 is between 2 and 9, and all of m2 and mq are 0, wherein suitably M$_1$ is Cr$^{3+}$, M$_2$ is Ni$^{2+}$, the sum of x and y is between 7 and 10; and x is between 6 and 10. In a particular embodiment, monoLIG$^1$ is fluoride (F), m1 is 3, and all of m2 and mq are 0 (i.e. no other monodentate ligands). In a particular embodiment, monoLIG$^1$ is fluoride (F), m1 is 8, and all of m2 and mq are 0 (i.e. no other monodentate ligands).

Suitably, the sum of b1, b2, . . . , and br is at least 6, suitably at least 10, suitably at least 14, suitably at most 22, suitably at most 20, suitably at most 18, most suitably about 16. In some embodiments, there are no bidentate ligands beyond a first and second bidentate ligand (i.e. all br are 0), and in some embodiments there are no bidentate ligands beyond a first bidentate ligand (i.e. b2 and br are both 0). In an embodiment, biLIG$^1$ is a carboxylate defined by the formula —O$_2$CR$_{B1}$ (or R$_{B1}$CO$_2$$^−$), wherein R$_{B1}$ is suitably an (optionally substituted) group such as a hydrocarbyl moiety (suitably a hydrocarbyl moiety devoid of basic or chelating groups), and is suitably selected from (1-12C)alkyl, (1-12C)alkenyl, (1-12C)alkynyl, (3-8C)cycloalkyl, (3-8C)cycloalkenyl, (1-3C)alkyl(3-8C)cycloalkyl, (1-3C)alkyl(3-8C)cycloalkenyl, aryl, (1-3C)alkylaryl, aryl(1-3C)alkyl. Suitably, R$_{B1}$ is (1-12C)alkenyl, (1-12C)alkynyl, (3-8C)cycloalkenyl, aryl, (1-3C)alkylaryl, or aryl(1-3C)alkyl. Most suitably R$_{B1}$ is (1-5C)alkenyl. In an embodiment, biLIG$^2$ is a carboxylate defined by the formula —O$_2$CR$_{B2}$ (or R$_{B2}$CO$_2$$^−$), wherein R$_{B2}$ is suitably a group comprising a basic or chelating group (e.g. a moiety with a lone pair of electrons that is free to co-ordinate to form a dative bond), and is suitably selected from optionally substituted heterocyclyl, heteroaryl, heterocyclyl(1-6C)alkyl, heteroaryl(1-6C)alkyl, or is selected from (1-12C)alkyl, (1-12C)alkenyl, (1-12C)alkynyl, (3-8C)cycloalkyl, (3-8C)cycloalkenyl, (1-3C)alkyl(3-8C)cycloalkyl, (1-3C)alkyl(3-8C)cycloalkenyl, aryl, (1-3C)alkylaryl, or aryl(1-3C)alkyl, substituted with one or more basic or chelating groups, for example, amino, alkylamino, dialkylamino, hydroxyl, (1-6C)alkoxy, carbonyl, immino, thio, thiocarbonyl, etc. Most suitably R$_{B2}$ is pyridyl, aminophenyl, N-(1-3C)alkylaminophenyl, N,N-di(1-3C)alkylaminophenyl, most suitably pyridyl, most suitably 4-pyridyl, most suitably biLIG$^2$ is isonicotinate. In a particular embodiment, biLIG$^1$ is an optionally substituted hydrocarbyl carboxylate (e.g. (1-6C)alkylcarboxylate, such as pivalate), biLIG$^2$ is an organic or optionally substituted hydrocarbyl carboxylate bearing at least one additional heteroatom (e.g. one capable of acting as a lewis base or ligand for chelating metal species external to the complex, e.g. isonicotinate), b1 is between 12 and 20 (most suitably 14-18, most suitably 15-16), b2 is between 0 and 4 (most suitably 0 or 1-3), wherein suitably $M_1$ is $Cr^{3+}$, $M_2$ is $Ni^{2+}$, the sum of x and y is between 7 and 10; and x is between 6 and 10, and wherein suitably monoLIG$^1$ is fluoride (F), m1 is between 2 and 9, and all of m2 and mq are 0.

Suitably, the sum of o1, o2, ..., and os is between 0 and 4, suitably between 0 and 2, most suitably between 0 and 1. In some embodiments, there are no optional extra/terminal ligands beyond a first optional extra/terminal ligand (i.e. all o2 and os are 0), In a particular embodiment, the sum of o1, o2, ..., and os is zero (i.e. there are substantially no optional extra/terminal ligands). Where one or more optional extra/terminal ligands are present, these may include a solvent molecule (be it monodentate, bidentate, or otherwise polydentate), such as H$_2$O, tetrahydrofuran, pyridine, etc. In certain embodiments, the primary metal complex comprises at least one extra/terminal ligands that is a polydentate ligand having a denticity greater than or equal to 3, suitably greater than or equal to 4, though suitably at most 6. Such polydentates may, for example, include N-(1-6C)alkyl-D-glucamine (e.g. N-methyl-D-glucamine). In a particular embodiment, optLIG$^1$ is defined by the formula Gluc-NH—R$_{O1}$, wherein Gluc-NH—R$_{O1}$ is N-(1-8C)alkyl-D-glucamine or a deprotonated form thereof, and wherein suitably R$_{O1}$ is (1-8C)alkyl, more suitably (1-2C)alkyl (e.g. methyl or ethyl). In such embodiments, suitably o1 is 1 whilst o2 and all os are zero.

In a particular embodiment, the primary metal complex is defined by or comprises units defined by the Formula II:

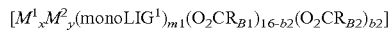

wherein:

$M^1$ is a trivalent metal ion as defined herein, most suitably $Cr^{3+}$;

$M^2$ is a divalent metal ion as defined herein, most suitably $Ni^{2+}$;

x is as defined herein (suitably x is 6, 7, 8, or 9, most suitably x is 7);

y is as defined herein (suitably y is 1 or 2, most suitably y is 1, though it may be 0 form homometallic polymetallic complexes have a metal of the same oxidation state, e.g. Cr(III));

monoLIG$^1$ is as defined herein (most suitably monoLIG$^1$ is fluoride, F);

m1 is as defined herein (most suitably m1 is 8);

R$_{B1}$ is as defined herein, though R$_{B1}$ is suitably a group devoid of basic or chelating groups, and is suitably selected from (1-12C)alkyl, (1-12C)alkenyl, (1-12C)alkynyl, (3-8C)cycloalkyl, (3-8C)cycloalkenyl, (1-3C)alkyl(3-8C)cycloalkyl, (1-3C)alkyl(3-8C)cycloalkenyl, aryl, (1-3C)alkylaryl, aryl(1-3C)alkyl;

R$_{B2}$ is as defined herein, though R$_{B2}$ is suitably a group comprising a basic or chelating group (e.g. a moiety with a lone pair of electrons that is free to co-ordinate to form a dative bond), and is suitably selected from optionally substituted heterocyclyl, heteroaryl, heterocyclyl(1-6C)alkyl, heteroaryl(1-6C)alkyl, or is selected from (1-12C)alkyl, (1-12C)alkenyl, (1-12C)alkynyl, (3-8C)cycloalkyl, (3-8C)cycloalkenyl, (1-3C)alkyl(3-8C)cycloalkyl, (1-3C)alkyl(3-8C)cycloalkenyl, aryl, (1-3C)alkylaryl, or aryl(1-3C)alkyl, substituted with one or more basic or chelating groups, for example, amino, alkylamino, dialkylamino, hydroxyl, (1-6C)alkoxy, carbonyl, immino, thio, thiocarbonyl, etc.;

b2 is as defined herein, though b2 is suitably 0, 1, 2, or 3; wherein suitably the sum of x and y is as defined herein, though most suitably the sum of x and y is 7, 8, 9, or 10 (most suitably 8).

In a particular embodiment, the primary metal complex is defined by or comprises units defined by the Formula IIa:

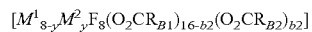

wherein:

$M^1$ is a trivalent metal ion as defined herein, most suitably $Cr^{3+}$;

$M^2$ is a divalent metal ion as defined herein, most suitably $Ni^{2+}$;

y is 0 or 1;

R$_{B1}$ is a group devoid of basic or chelating group, and is suitably selected from (1-12C)alkyl, (1-12C)alkenyl, (1-12C)alkynyl, (3-8C)cycloalkyl, (3-8C)cycloalkenyl, (1-3C)alkyl(3-8C)cycloalkyl, (1-3C)alkyl(3-8C)cycloalkenyl, aryl, (1-3C)alkylaryl, aryl(1-3C)alkyl;

R$_{B2}$ is a group comprising a basic or chelating group (e.g. a moiety with a lone pair of electrons that is free to co-ordinate to form a dative bond), and is suitably selected from optionally substituted heterocyclyl, heteroaryl, heterocyclyl(1-6C)alkyl, heteroaryl(1-6C)alkyl, or is selected from (1-12C)alkyl, (1-12C)alkenyl, (1-12C)alkynyl, (3-8C)cycloalkyl, (3-8C)cycloalkenyl, (1-3C)alkyl(3-8C)cycloalkyl, (1-3C)alkyl(3-8C)cycloalkenyl, aryl, (1-3C)alkylaryl, or aryl(1-3C)alkyl, substituted with one or more basic or chelating groups, for example, amino, alkylamino, dialkylamino, hydroxyl, (1-6C)alkoxy, carbonyl, immino, thio, thiocarbonyl, etc.;

b2 is 0, 1, 2, or 3.

In a particular embodiment, the primary metal complex is defined by or comprises units defined by the Formula IIb:

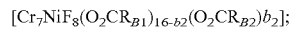

wherein R$_{B1}$, R$_{B2}$, and b2 are as defined herein, though most suitably R$_{B1}$ is t-butyl and R$_{B2}$ if present is 4-pyridyl.

In a particular embodiment, the primary metal complex is defined by or comprises units defined by the Formula IIc:

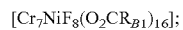

wherein R$_{B1}$ is as defined herein, though most suitably R$_{B1}$ is t-butyl.

In a particular embodiment, the primary metal complex is defined by or comprises units defined by the Formula IId:

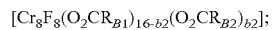

wherein R$_{B1}$, R$_{B2}$, and b2 are as defined herein, though most suitably R$_{B1}$ is t-butyl and R$_{B2}$ if present is 4-pyridyl.

In a particular embodiment, the primary metal complex is defined by or comprises units defined by the Formula IIe:

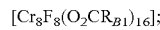

wherein R$_{B1}$ is as defined herein, though most suitably R$_{B1}$ is t-butyl.

In another embodiment, the primary metal complex is defined by or comprises units defined by the Formula III:

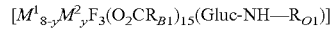

wherein:

$M^1$ is a trivalent metal ion as defined herein, most suitably $Cr^{3+}$;

$M^2$ is a divalent metal ion as defined herein, most suitably $Ni^{2+}$;

y is 0 or 1;

$R_{B1}$ is a group devoid of basic or chelating group, and is suitably selected from (1-12C)alkyl, (1-12C)alkenyl, (1-12C)alkynyl, (3-8C)cycloalkyl, (3-8C)cycloalkenyl, (1-3C)alkyl(3-8C)cycloalkyl, (1-3C)alkyl(3-8C)cycloalkenyl, aryl, (1-3C)alkylaryl, aryl(1-3C)alkyl;

Gluc-NH—$R_{O1}$ is N-(1-8C)alkyl-D-glucamine (i.e. $R_{O1}$ is (1-8C)alkyl, more suitably (1-2C)alkyl) or a deprotonated form thereof.

In another embodiment, the primary metal complex is defined by or comprises units defined by the Formula IIIa:

$$[Cr_7NiF_3(O_2CR_{B1})_{15}(Gluc\text{-}NH\text{—}R_{O1})]$$

wherein $R_{B1}$ and Gluc-NH—$R_{O1}$ are as defined herein, though most suitably $R_{B1}$ is t-butyl and $R_{O1}$ is methyl.

A previously mentioned, where the primary metal complex of the anti-scattering compound comprises one or more resist ligands (i.e. ligands to the primary metal complex which may be induced to crosslink with other such ligands, potentially in neighbouring primary metal complexes and/or neighbouring antiscattering compounds), any of the aforementioned ligands, whether monodentate, bidentate, or otherwise, may be replaced by any of the aforedescribed resist components. However, regardless of the number of resist ligands per primary metal complex, suitably the primary metal complex's overall co-ordination sphere is sufficiently populated (e.g. is not electron deficient, or is otherwise thermodynamically stable) by alternative ligands as defined herein. As such, one may envisage a primary metal complex comprising a mixture of resist ligands and any of the aforementioned ligands, though some of the aforementioned ligands may also serve as resist ligands (e.g. alkenoic acid and alkenoate ligands).

In a particular embodiment, the primary metal complex is a polymetallic cage complex comprising one or more ligands bearing a cross-linkable moiety (e.g. resist ligands), for instance, a moiety comprising a π-system. In a particular embodiment, the polymetallic cage complex comprises chromium ions and nickel ions. In a particular embodiment, the ligand(s) bearing a cross-linkable moiety are datively bonded to metal ions of the polymetallic complex, suitably via one or more lone-pair bearing heteroatoms, most suitably via a carboxylate, carboxylic acid, carboxylate ester, or carboxylic acid-amide moiety of said ligand(s). Suitably the cross-linkable moiety in question is an alkene or alkyne moiety, most suitably an alkene moiety, most suitably a terminal alkene moiety. Suitably cross-linkable moieties of neighbouring primary metal complexes can be cross-linked (e.g. via photolysis or via photolyically-induced reactions, optionally via intermediary species such as photoinitiators or photoacids) either directly (e.g. where an alkene of a ligand of one primary metal complex couples with an alkene of a ligand of a neighbouring primary metal complex) or indirectly, for instance, via an intervening resist cross-linker (e.g. where alkenes of ligands of two neighbouring primary metal complexes couple to a common resist cross-linker such as a suitable di-ene).

In a particular embodiment, the primary metal complex is defined by or comprises units defined by the Formula IIf:

$$[M^1_x M^2_y (O_2CR_{B1})_r]$$

wherein $M^1$ is a first metal species and x is the number of moles of $M^1$ per mole of primary metal complex (suitably x is a number between 4 and 10); $M^2$ is a second metal species and y is the number of moles of $M^2$ per mole of primary metal complex (suitably y is a number between 0 and 2); wherein $R_{B1}$ is an optionally substituted (1-20C)hydrocarbyl group comprising a π-system, suitably a terminal π-system; wherein r is an integer having a value of 1 or greater (suitably between 1 and 16); and wherein the units of Formula IIf optionally comprise one or more other associated ligands (i.e. datively bound within the complex).

In a particular embodiment, the primary metal complex is defined by or comprises units defined by the Formula IIg:

$$[Cr_7Ni(O_2CR_{B1})_r]$$

wherein $R_{B1}$ is an optionally substituted (1-20C)hydrocarbyl group comprising a π-system, suitably a terminal π-system; wherein r is an integer having a value of 1 or greater (suitably between 1 and 16);

and wherein the units of Formula IIg optionally comprise one or more other associated ligands (i.e. datively bound within the complex).

In a particular embodiment, the primary metal complex is defined by or comprises units defined by the Formula IIh:

$$[Cr_7NiF_8(O_2CR_{B1})_r]$$

wherein $R_{B1}$ is an optionally substituted (1-10C)hydrocarbyl group comprising an alkene or alkyne moiety, suitably a terminal alkene or alkyne moiety, most suitably an alkene moiety; wherein r is an integer having a value of 1 or greater (suitably between 1 and 16); and wherein the units of Formula IIh optionally comprise one or more other associated ligands (i.e. datively bound within the complex).

In a particular embodiment, the primary metal complex is defined by or comprises units defined by the Formula IIi:

$$[Cr_7NiF_8(O_2CR_{B1})_r]$$

wherein $R_{B1}$ is an optionally substituted (1-6C)hydrocarbyl group comprising an alkene moiety, suitably a terminal alkene or alkyne moiety, most suitably an alkene moiety; wherein r is an integer having a value of 1 or greater (suitably between 1 and 16); and wherein the units of Formula IIi optionally comprise one or more other associated ligands (i.e. datively bound within the complex).

In general, the more resist ligands per primary metal complex, the more sensitive the corresponding resist composition will be, since the rate of cross-linking is related to the likelihood of a fruitful collision between relevant cross-linking resist ligands.

Counterions

The primary metal complex may be neutral or charged (whether positively or negatively), depending on the balance and type of metal species and associated ligands within the complex. This is likewise the case for any additional metal complex(es) and any linker component(s). Moreover, the combination of primary metal complex(es), any linker component(s), and/or any additional metal complex(es), in their relevant stoichiometries may yield a net charge. As such, the anti-scattering compound may comprise one or more counterions (e.g. $C^1, C^2, \ldots, C^c$), suitably as defined herein. Such counterion(s) are suitably associated with the primary metal complex, one or more additional metal complex(es), a linker component, and/or a hybrid complex as a whole. A hybrid complex may be defined by or comprise units defined by Formula E:

$$(PMC)_{p-a}(AMC)_a(LINK)_l$$

wherein PMC, AMC, LINK, p, a, and l are as defined herein, suitably with respect to Formula D;

and a corresponding hybrid complex salt, with which the aforementioned counterions are associated, is suitably defined by or comprise units defined by Formula D:

$$(C^1_{i1}C^2_{i2}\ldots C^c_{ic})(PMC)_{p-a}(AMC)_a(LINK)_l$$

where Formula D and the constitutent parts thereof are as defined herein.

In the event that the hybrid complex of Formula E (or indeed of Formula B) is neutral, the anti-scattering compound may be free from counterions as defined herein, though this need not exclude instances where complexes or components of the hybrid complex act as counterions to each other.

The counterion(s) may be any suitable counterion(s), and may be either positively (countercations) or negatively (counteranions) charged depending on the polarity of the charge borne on species to which the counterions are intended to neutralise.

In preferred embodiments, the net charge of the primary metal complex is negative (i.e. producing an anionic complex), most suitably having a negative charge of about −1. Moreover, in preferred embodiments, the net charge of the hybrid complex (whether of Formula B or E) is negative.

As such, the anti-scattering compound suitably additionally comprises one or more countercations, suitably a single countercation (i.e. just $C^1$ but no $C^2 \ldots C^c$), to neutralise the negative charge of the relevant complex(es).

The countercation(s) may be any suitable cation(s). However, in preferred embodiments, the countercation(s) comprise (and preferably consist essentially of) a monovalent cation (i.e. +1 charged), suitably selected from an alkali metal cation or an ammonium-based cation (including any ammonium, primary ammonium, secondary ammonium, tertiary ammonium, quaternary ammonium cation, imidazolium), most suitably a cation selected from the group including $NH_3R_{cat1}^+$, $NH_2R_{cat1}R_{cat2}^+$, $Cs^+$, $Rb^+$, wherein $R_{cat1}$ and $R_{cat2}$ are each independently selected from (1-12C)alkyl (most suitably (1-4C)alkyl, especially ethyl or propyl). Dipropylammonium salts are particularly useful.

Linker Component (or Central Complex)

The anti-scattering compound may suitably comprise a linker component, though this is not mandatory. Suitably the linker component indirectly links (or associates) together two or more primary metal complexes and/or indirectly links (or associates) together one or more primary metal complexes with one or more additional metal complexes, suitably via the linker component. Suitably the linker component is capable of forming electrostatic and/or covalent bonds with two or more primary metal complexes and/or with one or more primary metal complexes and with one or more additional metal complexes.

Suitably, where a linker component is defined by reference to a radical species (e.g. halo) it may instead refer to an ionic form thereof (e.g. halide).

The linker component may comprise one or more, suitably two or more, Lewis basic moieties and/or one or more Lewis acidic moieties. As such, the linker component may comprise one or more, suitably two or more, electron pair donars and/or one or more, suitably two or more, electron pair acceptors. In preferred embodiments the linker component forms a bridge (or hub) between two or more primary metal complexes and/or between one or more primary metal complexes and one or more additional metal complexes, and as such the linker component suitably comprises at least one Lewis acid or base moiety which binds (suitably via a dative bond) one complex and at least one other Lewis acid or base moiety which binds (suitably via a dative bond) another complex.

The anti-scattering compound or hybrid complex (or salt thereof) may comprise one or more moles of linker component(s) (whether the same or different linker components, suitably the same) per mole of compound or hybrid complex, but most suitably the anti-scattering compound or hybrid complex (or salt thereof) comprises only one mole of linker component per mole of compound or hybrid complex. As such, the linker component most suitably serves, within a hybrid complex, as a common central hub to which (or with which) primary metal complex(es) and/or additional metal complex(es) (though most suitably just primary metal complexes) are connected (or associated). Suitably, this common central hub is surrounded by two or more primary metal complex(es) and/or additional metal complex(es), more suitably by four or more primary metal complex(es) and/or additional metal complex(es). As such, suitably the linker component comprises an appropriate number of lewis acid or base moieties to enable the linker component to bond (preferably via dative bonds) to all of its surrounding primary metal complex(es) and/or additional metal complex(es), suitably via dative bonds. However, in circumstances where the linker moiety is only associated with a single primary metal complex and no additional metal complexes, the linker component may be simply a terminal ligand, such as those selected from $optLIG^2$, such as a solvent molecule (e.g. water, THF, pyridine, or substitute pyridine).

The anti-scattering compound suitably comprises a hybrid complex defined by or comprises units defined by Formula E:

$$(PMC)_{p-a}(AMC)_a(LINK)_l$$

wherein l is 1; p is (suitably between 2 and 8, more suitably 2, 4, or 6, though p may be between 23 and 49); and a is between 0 and 7 (suitably 0).

The linker component, or LINK group/molecule, suitably provides one or more, preferably two or more, electron pair-donating and/or electron-pair accepting co-ordinating groups. Though in some embodiments, the linker component may comprise a mixture of electron pair-donating and electron pair-accepting co-ordinating groups, most preferably the linker component comprises either exclusively electron pair-donating or electron pair-accepting co-ordinating groups. Whether the linker component comprises electron pair-donating or electron pair-accepting co-ordinating groups suitably depends on the electron pair-dontaining or electron-pair accepting capacity of corresponding primary metal complexes and optional additional metal complexes (in particular the ligands thereof).

The or each linker component, especially where two or more PMCs or two or more PMCs/AMCs combined are associated with said linker component, may be or comprise units independently selected from:

i) a single atom, molecule, ion, or complex containing a single co-ordinating moiety capable of accepting or donating two or more lone pairs of electrons;

ii) a single molecule, ion, or complex (e.g. a multiple heteroatom-containing optionally substituted acyclic, cyclic, polycyclic, or macrocyclic molecule; or a Lewis acidic metal-centered compound or complex; or a metal-centered compound or complex attached to a leaving group or substitutable ligand) comprising two or more co-ordinating moieties (e.g. internal heteroatoms, such as nitrogen, oxygen, or sulphur, or external heteroatoms borne by optional substituents; or electron-deficient metal centers; or metal centers attached to a leaving group or substitutable ligand), each co-ordinating moiety being capable of accepting or donating one or more lone pairs of electrons;

iii) a molecule, ion, or complex defined by Formula IV:

$$Q\text{-}[CORE]\text{-}[W]_w$$

wherein:

[CORE] is absent or is the core of the linker component and comprises one or optionally more than one core groups;

Q is a group directly attached to [CORE] or to one or more core group(s) thereof, wherein Q comprises a co-ordinating moiety (suitably a co-ordinating moiety that co-ordinates to a primary metal complex);

each W is a group independently directly attached to [CORE] or to one or more core group(s) thereof, and optionally further attached to one or more other W groups or to Q, each of which W independently comprises a co-ordinating moiety (suitably a co-ordinating moiety that co-ordinates to a primary metal complex different to that associated with Q, or an additional metal complex); wherein w is an integer greater than zero.

The Q and one, more, or all of the W groups may be the same or different. However, even if the Q and one, more, or all of the W groups are different, they are suitably selected from the same pool of acceptable groups.

Where a linker component is a single atom, molecule, ion, or complex containing a single co-ordinating moiety capable of donating two or more lone pairs of electrons, suitably the single co-ordinating moiety comprises or consists of an oxygen, sulphur, or halo (particularly fluoro or chloro, especially fluoro) atom. For example, the linker component(s) may be or comprise a group selected from halide (preferably fluoro), oxo, oxide, hydroxide ($OH^-$), (1-6C)alkoxide, (2-6C)alkenyloxy, (2-6C)alkynyloxy, formyl, carboxy, (1-6C)alkoxycarbonyl, (2-6C)alkanoyl, (2-6C)alkanoyloxy, sulpho, sulphide, hydrogensulphide, (1-6C)alkylthio, (2-6C)alkenylthio, (2-6C)alkynylthio, thiocarbonyl, heterocyclyl containing at least one internal heteroatom selected from oxygen or sulphur, or (where appropriate) a deprotonated form or salt thereof; wherein any CH, $CH_2$, or $CH_3$ is optionally substituted.

Where a linker component is a single atom, molecule, ion, or complex containing a single co-ordinating moiety capable of accepting two or more lone pairs of electrons, suitably the single co-ordinating moiety comprises or consists of a Lewis acidic metal atom (which may include boron or silicon), or a metal atom attached to a leaving group or substitutable ligand. For example, the linker component(s) may be or comprise a group selected from a metal cation (e.g. a divalent metal cation), a Lewis acidic metal compound (suitably a Lewis acid metal compound, such as $AlCl_3$, $FeCl_3$, $ZnCl_2$, etc.), a Lewis acidic metal complex (suitably a Lewis acid or a complex with one or more free co-ordination sites, such as where the metal center has fewer than 18 electrons in its valence shell), and/or a metal compound or complex comprising a leaving group or substitutable ligand (suitably where the conjugate acid of said leaving group or substitutable ligand has a pKa in water at standard ambient temperature and pressure less than or equal to 1, suitably less than or equal to 0, suitably less than or equal to −1, more suitably less than or equal to −5). Suitable metal cations may include divalent (e.g. alkaline earth metal, transition metal (II), or $Sn^{2+}$ cations), trivalent (e.g. $Al^{3+}$, transition metal(III) or f-block metal(III) cations), or tetravalent ($Sn^{4+}$, $Pb^{4+}$, transition metal(IV) or f-block metal (IV) cations) cations, most suitably divalent cations. Suitably Lewis acidic metal compounds may include boron compounds (e.g. boron halides, alkoxides, etc.), silicon compounds (e.g. silane, silioxane, silicon halides, etc.), Lewis acidic metal compounds (e.g. $AlCl_3$, $FeCl_3$, $ZnCl_2$, etc.). Suitable Lewis acidic metal complexes or complexes comprising a leaving group or substitutable ligand may include carboxylate complexes such as dimetallic carboxylate complexes (e.g. $[M_2(O_2C-R)_4]$, where M may be $Cu^{2+}$, $Ru^{2+}$, $Rh^{2+}$), trimetallic carboxylate complexes (e.g. $[M_2M'O(O_2CR)_6]$, where M may be a trivalent metal ion, and M' may be a divalent metal ion), hexametallic carboxylate complexes (e.g. $[M'_4M_2O_2(O_2CR)_{12}]$ where M may be a trivalent metal ion, and M' may be a divalent metal ion), a dodecametallic complex (e.g. $[Ni_{12}(chp)_{12}(O_2CMe)_6(H_2O)_6]$ where chp=6-chloro-2-pyridonate), metal compounds whose metal center is bonded to a leaving group (e.g. a halide such as chloride, e.g. $AlCl_3$), metal complexes whose metal centre(s) are co-ordinated with a substitutable ligand such as halide, water, a solvent such as THF, pyridine, or even carboxylate.

Where a linker component is a single molecule, ion, or complex comprising two or more co-ordinating moieties, each being capable of donating one or more lone pairs of electrons, suitably each of the two or more co-ordinating moieties comprises or consists of an oxygen, nitrogen, sulphur, or halo (particularly fluoro or chloro, especially fluoro) atom. For example, the linker component(s) may be or comprise one or more, suitably two or more, groups selected from halide (preferably fluoro), amino, cyano, imino, enamino, (1-6C)alkylamino, di-[(1-6C)alkyl]amino, tri-[(1-6C)alkyl]amino, oxo, oxide, hydroxide ($OH^-$), (1-6C)alkoxide, (2-6C)alkenyloxy, (2-6C)alkynyloxy, formyl, carboxy, (1-6C)alkoxycarbonyl, (2-6C)alkanoyl, (2-6C)alkanoyloxy, sulpho, sulphide, hydrogensulphide, (1-6C)alkylthio, (2-6C)alkenylthio, (2-6C)alkynylthio, thiocarbonyl, heterocyclyl containing at least one internal heteroatom selected from nitrogen, oxygen or sulphur, heteroaryl containing at least one internal hetero atom selected from nitrogen, oxygen or sulphur (e.g. pyridyl), or (where appropriate) a deprotonated form or salt thereof; wherein any CH, $CH_2$, or $CH_3$ is optionally substituted. Any of the aforementioned groups may be linked directly to each other or indirectly linked via a [CORE] as defined herein to form a linker component.

Where a linker component is a single molecule, ion, or complex comprising two or more co-ordinating moieties, each being capable of accepting one or more lone pairs of electrons, suitably each of the two or more co-ordinating moieties comprises or consists of a Lewis acidic metal atom (which may include boron or silicon), or a metal atom attached to a leaving group or substitutable ligand. For example, the linker component(s) may be or comprise one or more, suitably two or more, groups selected from a metal cation (e.g. a divalent metal cation), a Lewis acidic metal compound (suitably a Lewis acid metal compound, such as $AlCl_3$, $FeCl_3$, $ZnCl_2$, etc., or a complexed derivative thereof), a Lewis acidic metal complex (suitably a Lewis acid or a complex with one or more free co-ordination sites, such as where the metal center has fewer than 18 electrons in its valence shell), and/or a metal compound or complex comprising a leaving group or substitutable ligand (suitably where the conjugate acid of said leaving group or substitutable ligand has a pKa in water at standard ambient temperature and pressure less than or equal to 1, suitably less than or equal to 0, suitably less than or equal to −1, more suitably less than or equal to −5). Suitable metal cations may include divalent (e.g. alkaline earth metal, transition metal (II), or $Sn^{2+}$ cations), trivalent (e.g. $Al^{3+}$, transition metal(III) or f-block metal(III) cations), or tetravalent ($Sn^{4+}$, $Pb^{4+}$, transition metal(IV) or f-block metal(IV) cations) cations, most suitably divalent cations. Suitably Lewis acidic compounds may include boron compounds (e.g. boron halides, alkoxides, etc.), silicon compounds (e.g. silane, silioxane, silicon halides, etc.), Lewis acidic metal compounds (e.g. $AlCl_3$, FeCl$_3$, ZnCl$_2$, etc.). Suitable Lewis acidic metal complexes or complexes comprising a leaving group or substitutable ligand may include carboxylate complexes such as dimetallic carboxylate complexes (e.g. [M$_2$(O$_2$C—R)$_4$], where M may be Cu$^{2+}$, Ru$^{2+}$, Rh$^{2+}$), trimetallic carboxylate complexes (e.g. [M$_2$M'O(O$_2$CR)$_6$], where M may be a trivalent metal ion, and M' may be a divalent metal ion), hexametallic carboxylate complexes (e.g. [M'$_4$M$_2$O$_2$(O$_2$CR)$_{12}$] where M may be a trivalent metal ion, and M' may be a divalent metal ion), a dodecametallic complex (e.g. [Ni$_{12}$(chp)$_{12}$(O$_2$CMe)$_6$(H$_2$O)$_6$] where chp=6-chloro-2-pyridonate), metal compounds whose metal center is bonded to a leaving group (e.g. a halide such as chloride, e.g. AlCl$_3$), metal complexes whose metal centre(s) are co-ordinated with a substitutable ligand such as halide, water, a solvent such as THF, pyridine, or even carboxylate. Any of the aforementioned groups may be linked directly to each other or indirectly linked via a [CORE] as defined herein to form a linker component.

Suitably the two or more co-ordinating moieties are capable of co-ordinating with two different electron donating or electron accepting species or complexes—for instance, the co-ordinating moieties are suitably sufficiently distal to allow each to independently bond to a separate species or complex.

Co-ordinating moieties may be capable of co-ordinating directly with (one of) the metal center(s) of the primary and/or additional metal complex(es) and/or may be capable of co-ordinating with (one of) the ligands associated with the primary and/or additional metal complex(es).

Where a linker component is a molecule, ion, or complex defined by Formula IV, the [CORE] may comprise one or more co-ordinating groups, but suitably any co-ordinating group present within the [CORE] are (substantially) unavailable for co-ordination with any species or complexes external to the linker component. In some embodiments, the [CORE] may be absent altogether and Q and the one or more W groups are directly linked to each other.

The [CORE] may be any suitable core allowing the Q group to co-ordinate with a primary metal complex whilst simultaneously allowing the or each W group to co-ordinate with either another primary metal complex or with an additional metal complex.

The [CORE] may comprise a single core group to which the Q group and the or each of the W group(s) are commonly attached. As such, the [CORE] may be a divalent or multivalent core group group (the valency of which depends on the value of w). Such a single core group (particularly applicable to linker component(s) with electron pair-donating capability) may be selected from:
a) a divalent or multivalent optionally substituted acyclic core group (e.g. optionally substituted (1-nC)alkylene, (1-nC)alkenylene, (1-nC)alkynylene optionally comprising one or more intervening heteroatoms or intervening heteroatom-containing moieties, i.e. where heteroroatoms or heteroatom-containing moieties are interspersed within the carbon chain);
b) a divalent or multivalent cyclic or polycyclic core group, for example, an optionally substituted cyclocarbon (e.g. cycloalkane), heterocycle (e.g. morpholine), arene (benzene, naphthalene), or heteroarene (pyridine, imidazole, indole);
c) a divalent or multivalent core group comprising at least one cyclic or polycyclic group (e.g. optionally substituted cyclocarbon, heterocycle, arene, or heteroarene) linked to one or more acyclic moieties and/or cyclic or polycyclic moieties;
d) a divalent or multivalent macrocyclic core group (which macrocyclic group may itself comprise one or more optionally substituted cyclocarbyl, heterocyclyl, aryl, and/or heteroaryl groups) (e.g. porphyrin or phthalocyanine).

A single core group may itself be or comprise a core metal complex or core cation-centred complex. Where a single core group is or comprises a core metal complex, suitably said core metal complex comprises a core ligand and at least one core metal species (suitably a central metal ion, such as Mg$^{2+}$). Suitably the core ligand comprises one or more atoms or groups (especially electron pair-donating atoms, such as nitrogen, oxygen, and/or sulphur) which are co-ordinated to one or more metal ions, for instance a central metal ion (e.g. Mg$^{2+}$). For example, a macrocyclic single core group may be or comprise a divalent or multivalent:

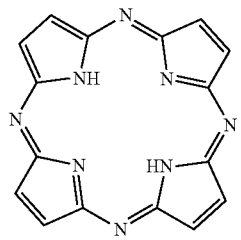 [SMILES: C1=Cc2nc1nc1ccc(nc3nc(nc4ccc(n2)[nH]4)C=C3)[nH]1]

or a salt thereof;
or may be a divalent or multivalent complex or salt thereof, such as:

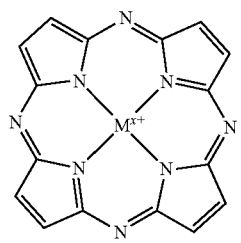

wherein M$^{x+}$ may be any suitable metal cation, especially a divalent metal cation, such as Mg$^{2+}$.

The linker component may comprise a single core, and may be selected from the group including a bridging di-imine (e.g. 4, 4'-bipyridyl, 1,2-dipyridylethene, 1,4-dipyridyltetrazine), a macrocycle (e.g. porphyrin or phthalocyanine) substituted with two or more pyridyl groups (i.e. a poly-pyridyl compound).

Where the [CORE] comprises a single core group, such as that defined above, the linker component suitably comprises Q and W groups with electron pair-donating co-ordinating moieties, such as those containing one or more heteroatoms, such as nitrogen, oxygen, and/or sulphur. However, it will be understood by the skilled person that a single core group may itself comprise one or more, suitably two or more, co-ordinating moieties (e.g. such as those containing one or more heteroatoms, such as nitrogen, oxygen, and/or sulphur) which may themselves be connected to Q and/or W groups which comprise electron pair-accepting moieties.

Suitably, each electron pair-donating Q and/or W group is selected from any suitable group comprising an internal or external heteroatom bearing a lone pair of electrons. Most suitably, the or each electron pair-donating Q and/or W group is independently selected from optionally substituted heterocyclyl, heteroaryl, heterocyclyl(1-6C)alkyl, heteroaryl(1-6C)alkyl, or is selected from (1-12C)alkyl, (1-12C)alkenyl, (1-12C)alkynyl, (3-8C)cycloalkyl, (3-8C)cycloalkenyl, (1-3C)alkyl(3-8C)cycloalkyl, (1-3C)alkyl(3-8C)cycloalkenyl, aryl, (1-3C)alkylaryl, or aryl(1-3C)alkyl, substituted with one or more basic or chelating groups, for example, amino, alkylamino, dialkylamino, hydroxyl, (1-6C)alkoxy, carbonyl, immino, thio, thiocarbonyl, etc. In an embodiment, the or each electron pair-donating Q and/or W group is independently selected from pyridyl, aminophenyl, N-(1-3C)alkylaminophenyl, N,N-di(1-3C)alkylaminophenyl, most suitably pyridyl, most suitably 4-pyridyl. For instance, in a particular embodiment, the linker is:

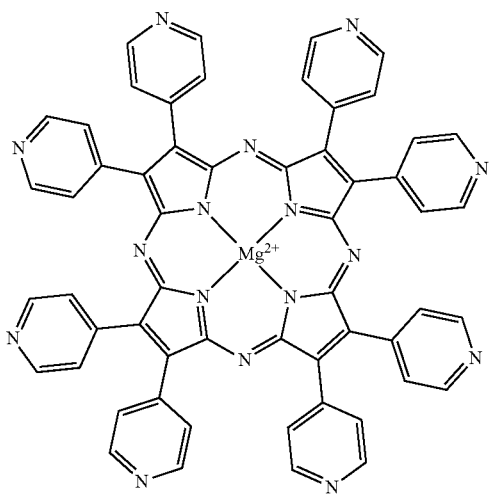

Suitably each pyridyl moiety is capable of co-ordinating with a primary metal complex.

The [CORE] may comprise a plurality of core groups which are indirectly linked together to form the [CORE] via the Q group and/or one or more of the or each of the W group(s). Such a [CORE] is especially relevant where one or more of the Q and/or W groups are metal-centered (which in this case includes boron- and silicon-centered as well as standard metal-centered; e.g. to provide a lewis acid/electron pair-accepting co-ordinating group). Each of such core groups may be independently selected from:
 a) a single atom, molecule, ion, or complex containing a single co-ordinating moiety capable of donating two or more lone pairs of electrons (e.g. $O^{2-}$, oxo);
 b) a single molecule, ion, or complex (e.g. a multiple heteroatom-containing optionally substituted acyclic, cyclic, polycyclic, or macrocyclic molecule) comprising two or more co-ordinating moieties each capable of independently donating an electron lone pair (e.g. internal heteroatoms, such as nitrogen, oxygen, or sulphur, or external heteroatoms borne by optional substituents) (e.g. carboxylate).

For instance, each core group may be independently selected from a single atom, molecule, ion, or complex that comprises or consists of an oxygen, sulphur, or halo (particularly fluoro or chloro, especially fluoro) atom; most suitably halide (preferably fluoro), oxo, oxide, hydroxide ($OH^-$), (1-6C)alkoxide, (2-6C)alkenyloxy, (2-6C)alkynyloxy, formyl, carboxy, (1-6C)alkoxycarbonyl, (2-6C)alkanoyl, (2-6C)alkanoyloxy, sulpho, sulphide, hydrogensulphide, (1-6C)alkylthio, (2-6C)alkenylthio, (2-6C)alkynylthio, thiocarbonyl, heterocyclyl containing at least one internal heteroatom selected from oxygen or sulphur, or (where appropriate) a deprotonated form or salt thereof; wherein any CH, $CH_2$, or $CH_3$ is optionally substituted.

For instance, each core group may be independently selected from a single molecule, ion, or complex comprising two or more co-ordinating moieties that comprise or consist of an oxygen, nitrogen, sulphur, or halo (particularly fluoro or chloro, especially fluoro) atom; most suitably that comprise or consist of two or more groups selected from halide (preferably fluoro), amino, cyano, imino, enamino, (1-6C)alkylamino, di-[(1-6C)alkyl]amino, tri-[(1-6C)alkyl]amino, oxo, oxide, hydroxide ($OH^-$), (1-6C)alkoxide, (2-6C)alkenyloxy, (2-6C)alkynyloxy, formyl, carboxy, (1-6C)alkoxycarbonyl, (2-6C)alkanoyl, (2-6C)alkanoyloxy, sulpho, sulphide, hydrogensulphide, (1-6C)alkylthio, (2-6C)alkenylthio, (2-6C)alkynylthio, thiocarbonyl, heterocyclyl containing at least one internal heteroatom selected from nitrogen, oxygen or sulphur, heteroaryl containing at least one internal hetero atom selected from nitrogen, oxygen or sulphur (e.g. pyridyl), or (where appropriate) a deprotonated form or salt thereof; wherein any CH, $CH_2$, or $CH_3$ is optionally substituted.

In a particular embodiment, each core group may be independently selected from a $biLIG^1$ group as defined herein, a $biLIG^2$ group as defined herein, or an $optLIG^1$ group as defined herein. In a particular embodiment, each core group is independently selected from a $biLIG^1$ group as defined herein or a $biLIG^2$ group as defined herein, most suitably a $biLIG^1$ group. Most suitably, the, each, or all of the core groups are a carboxylate or carboxylic acid, most suitably a carboxylate or carboxylic acid defined by the formula $—O_2CR_{B1}$ or defined by the formula $—O_2CR_{B2}$ (or $R_{B2}CO_2$), wherein $R_{B1}$ and $R_{B2}$ are suitably as defined herein, though most suitably $R_{B1}$ is (1-5C)alkyl most suitably $R_{B2}$ is pyridyl, aminophenyl, N-(1-3C)alkylaminophenyl, N,N-di(1-3C)alkylaminophenyl, Suitably, where [CORE] comprises a plurality of core groups, the core groups are the same.

By way of example, a linker whose [CORE] comprises a plurality of core groups may be defined by:

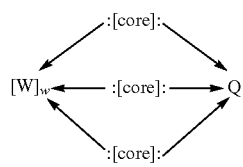

wherein each [core] is a core group independently defined as herein; and W and Q are electron pair-accepting Q and/or W groups as defined herein, and w is as defined herein.

Suitably, the or each electron pair-accepting Q and/or W group is a single atom, molecule, ion, or complex containing a co-ordinating moiety capable of accepting one or more, suitably two or more lone pairs of electrons. Suitably the relevant co-ordinating moiety comprises or consists of a Lewis acidic metal atom (which may include boron or silicon), or a metal atom attached to a leaving group or substitutable ligand. For example, the co-ordinating moiety may be or comprise a group selected from a metal cation (e.g. a divalent metal cation), a Lewis acidic metal compound (suitably a Lewis acid metal compound, such as $AlCl_3$, $FeCl_3$, $ZnCl_2$, etc.), a Lewis acidic metal complex (suitably a Lewis acid or a complex with one or more free co-ordination sites, such as where the metal center has fewer than 18 electrons in its valence shell), and/or a metal compound or complex comprising a leaving group or substitutable ligand (suitably where the conjugate acid of said leaving group or substitutable ligand has a pKa in water at standard ambient temperature and pressure less than or equal to 1, suitably less than or equal to 0, suitably less than or equal to −1, more suitably less than or equal to −5). Suitable metal cations may include divalent (e.g. alkaline earth metal, transition metal (II), or $Sn^{2+}$ cations), trivalent (e.g. $Al^{3+}$, transition metal(III) or f-block metal(III) cations), or tetravalent (Se, $Pb^{4+}$, transition metal(IV) or f-block metal(IV) cations) cations, most suitably divalent cations. Suitably Lewis acidic metal compounds may include boron compounds (e.g. boron halides, alkoxides, etc.), silicon compounds (e.g. silane, silioxane, silicon halides, etc.), Lewis acidic metal compounds (e.g. $AlCl_3$, $FeCl_3$, $ZnCl_2$, etc.). Suitable Lewis acidic metal complexes or complexes comprising a leaving group or substitutable ligand may include carboxylate complexes such as dimetallic carboxylate complexes (e.g. $[M_2(O_2C—R)_4]$, where M may be $Cu^{2+}$, $Ru^{2+}$, $Rh^{2+}$), trimetallic carboxylate complexes (e.g. $[M_2M'O(O_2CR)_6]$, where M may be a trivalent metal ion, and M' may be a divalent metal ion), hexametallic carboxylate complexes (e.g. $[M'_4M_2O_2(O_2CR)_{12}]$ where M may be a trivalent metal ion, and M' may be a divalent metal ion), a dodecametallic complex (e.g. $[Ni_{12}(chp)_{12}(O_2CMe)_6(H_2O)_6]$ where chp=6-chloro-2-pyridonate), metal compounds whose metal center is bonded to a leaving group (e.g. a halide such as chloride, e.g. $AlCl_3$), metal complexes whose metal centre(s) are co-ordinated with a substitutable ligand such as halide, water, a solvent such as THF, pyridine, or even carboxylate. However, in preferred embodiments, the or each electron pair-accepting Q and/or W group is independently a metal cation, suitably independently a divalent or trivalent metal cation, suitably as defined herein. Suitably Q may be different from at least one W group. Suitably, all Q and W groups may be the same.

In a particular embodiment, the linker is selected from:
  dimetallic carboxylate complexes (e.g. $[M_2(O_2C^R)_4]$ where M=Cu, Ru, Rh);
  trimetallic carboxylate complexes (e.g. $[M_2M'O(O_2CR)_6]$ where M=a trivalent metal ion, M'=a divalent metal ion;
  hexametallic carboxylate complexes (e.g. $[M'_4M_2O_2(O_2CR)_{12}]$ where M=a trivalent metal ion, M' a divalent metal ion);
  a dodecametallic complex such as $[Ni_{12}(chp)_{12}(O_2CMe)_6(H_2O)_6]$ where chp=6-chloro-2-pyridonate.

The linker component(s) may be independently selected from:
  A monoLIG$^1$ group as defined herein;
  a biLIG$^2$ group as defined herein;
  an optLIG$^1$ group as defined herein;
  a metal complex;
  a macrocycle optionally co-ordinate to a metal;
  dimetallic carboxylate complexes (e.g. $[M_2(O_2C^R)_4]$ where M=Cu, Ru, Rh);
  trimetallic carboxylate complexes (e.g. $[M_2M'O(O_2CR)_6]$ where M=a trivalent metal ion, M'=a divalent metal ion;
  hexametallic carboxylate complexes (e.g. $[M'_4M_2O_2(O_2CR)_{12}]$ where M=a trivalent metal ion, M' a divalent metal ion);
  a dodecametallic complex such as $[Ni_{12}(chp)_{12}(O_2CMe)_6(H_2O)_6]$ where chp=6-chloro-2-pyridonate.

a terminal ligand, e.g. $H_2O$, pyridine or a substituted pyridine, where n=1.
bridging di-imine, e.g. 4,4'-bipyridyl, 1,2-dipyridylethene, 1,4-dipyridyltetrazine other poly-pyridyl ligands, including pyridyls substituted around macrocycles such as porphyrins or phthalocyanines.

Linker may have other solvates or ligands (suitably inert) associated therewith, or may be a salt.

Secondary Electron Generator (SEG)

The resist compositions of the present invention may suitably comprise a "secondary electron generator" (SEG). The SEG is suitably a compound or component having a relatively high $Z_{eff}$ compared to other component(s) of the resist composition, and may also suitably have a relatively high density (suitably a high electron density) compared to other component(s) of the resist. The SEG suitably promotes secondary electron generation upon exposure to radiation, particularly ultraviolet radiation (e.g. eUV or UV). Secondary electrons generally scatter "laterally" (suitably 80° from an incident beam), thereby spreading the "write" effect, increasing the sensitivity of a resist and thereby decreasing the "dose" required from the primary radiation. As such, the secondary electron generator suitably performs the opposite role of an antiscattering agent.

The SEG may be a (substantially) separate or independent component within the resist composition (e.g. unattached to any other components within the resist component, for example, the antiscattering component); or the SEG may be attached, suitably via covalent and/or dative bonding, to one or more of the other component(s) of the resist compositions, for instance co-ordinatively attached to the antiscattering compound/component (this is especially appropriate where the SEG is a metal compound, one or more of whose counterions or ligands may be displaced by a dative bonding moiety of the antiscattering compound/component).

Patent publication WO 2015/145144 (by the same inventors/applicant) describes a range of suitable secondary electron generators, along with the principles underlying their use. Any of these SEGs may be incorporated within the resist compositions of the present invention, whether as a separate/independent component or attached to one of the other components (as per above). WO 2015/145144 is hereby incorporated by reference.

The secondary electron generator suitably is or comprises a compound (and SEG compound) or a group derived from such a compound (e.g. an SEG group may be datively bonded to another component) having an effective atomic number ($Z_{eff}$) greater than or equal to 15 (where optionally the $Z_{eff}$ calculation excludes any solvates, having a boiling point less than or equal to 150° C. at 100 kPa pressure, associated with said compound, suitably any solvates having a boiling point less than or equal to 120° C. at said pressure, suitably 105° C. at said pressure).

Where the SEG is in the form of an SEG group (e.g —HgCl or —HgI group datively bonded to another component, such as the antiscattering compound) derived from an SEG compound, the $Z_{eff}$ (or any other property and characteristic defined herein in relation to SEG compounds) may suitably be defined by reference to the $Z_{eff}$ (or corresponding property or characteristic) of the initial compound from which the SEG group is derived. However, alternatively, the $Z_{eff}$ (or any other property and characteristic defined herein in relation to SEG compounds) of a given SEG group may be defined by reference to the $Z_{eff}$ (or corresponding property or characteristic) of the SEG group itself (calculated by excluding the molecule to which it is attached, for instance, the antiscattering compound).

Suitably this $Z_{eff}$ is greater than or equal to 18, suitably greater than or equal to 23, suitably greater than or equal to 25, suitably greater than or equal to 30, suitably greater than or equal to 32, suitably greater than or equal to 40. Suitably this $Z_{eff}$ is less than or equal to 70, suitably less than or equal to 66, suitably less than or equal to 61, suitably less than or equal to 60, suitably less than or equal to 55. The secondary electron generator suitably has a higher $Z_{eff}$ than the antiscattering component, suitably at least 10 units higher, suitably at least 20 units higher, suitably at least 30 units higher.

Suitably, the secondary electron generator is or comprises a compound or group having a molecular weight less than or equal to 500 g/mol.

The secondary electron generator suitably is or comprises a metal compound (or metal group, such as —HgCl or —HgI, for instance when datively or covalently bonded to another compound). It cannot be or comprise an elemental metal (i.e. metal(0)). In fact, the resist composition is suitable (substantially) free of any metal (0)). Suitably any metal species of the metal compound are metal ions.

The compound(s) of the secondary electron generator (or compound(s) from which SEG group(s) is derived) suitably has a density greater than that of the base polymeric component. The compound(s) of the secondary electron generator suitably has a density greater than or equal to 1.7 g/cm$^3$, suitably greater than or equal to 2 g/cm$^3$, suitably greater than or equal to 2.5 g/cm$^3$, suitably greater than or equal to 3 g/cm$^3$, suitably greater than or equal to 4 g/cm$^3$, more suitably greater than or equal to 4.1 g/cm$^3$, suitably greater than or equal to 4.5 g/cm$^3$, more suitably greater than or equal to 4.7 g/cm$^3$, most suitably greater than or equal to 5 g/cm$^3$. The compound(s) of the secondary electron generator suitably has a density less than or equal to 9 g/cm$^3$, suitably less than or equal to 8.5 g/cm$^3$, suitably less than or equal to 8 g/cm$^3$. In a particular embodiment, the compound(s) of the secondary electron generator suitably has a density between 3.5 and 8.3 g/cm$^3$. Suitably the density is at least 2 times higher than the density of the antiscattering component, suitably at least 3 times higher.

Suitably any metal compound(s) of the secondary electron generator comprises a metal species which has an oxidation state of +1 or higher, suitably +2 or higher, suitably +3 or higher. Suitably any metal compound(s) of the secondary electron generator comprises a metal species which has an oxidation state of +4 or lower. Suitably any metal compound(s) of the secondary electron generator comprises a metal species which has an oxidation state of +3.

Suitably any metal compound(s) of the secondary electron generator comprises a single metal species or otherwise a predominant metal species (i.e. metal species constituting at least 50 wt % of the total metal species, suitably at least 80 wt %, suitably at least 90 wt %, suitably at least 95 wt %). The metal species or metal ions (whether single or predominant) of such metal compound(s) of the secondary electron generator suitably have an oxidation state of +1 or higher, suitably +2 or higher, suitably +3 or higher. The metal species or metal ions (whether single or predominant) of such metal compound(s) of the secondary electron generator suitably have an oxidation state of +4 or lower. The metal species or metal ions (whether single or predominant) of such metal compound(s) of the secondary electron generator suitably have an oxidation state of +3. In an embodiment, the metal species or metal ions of such metal compound(s) of the secondary electron generator have an oxidation state of +2.

Any metal compound(s) of the secondary electron generator suitably comprises a metal species (or a single or predominant metal species) having an atomic number (Z) greater than or equal to 21 (i.e. scandium or heavier). Any metal compound(s) of the secondary electron generator suitably comprises a metal species (or a single or predominant metal species) having an atomic number (Z) greater than or equal to 22 (i.e. titanium or heavier). Any metal compound(s) of the secondary electron generator suitably comprises a metal species (or a single or predominant metal species) having an atomic number (Z) greater than or equal to 39 (i.e. yttrium or heavier). Any metal compound(s) of the secondary electron generator suitably comprises a metal species (or a single or predominant metal species) having an atomic number (Z) greater than or equal to 49 (i.e. indium or heavier). Any metal compound(s) of the secondary electron generator suitably comprises a metal species (or a single or predominant metal species) having an atomic number (Z) greater than or equal to 57 (i.e. lanthanum or heavier). Any metal compound(s) of the secondary electron generator suitably comprises only metal species (or a single or predominant metal species) having an atomic number (Z) less than or equal to 82 (i.e. lead or lighter). Any metal compound(s) of the secondary electron generator suitably comprises only metal species (or a single or predominant metal species) having an atomic number (Z) less than or equal to 80 (i.e. mercury or lighter). The metal species of the metal compound(s) may suitably be a d-block, p-block, or f-block metal species, or a mixture thereof. Suitably the metal compound(s) is non-radioactive.

Suitably the secondary electron generator is or comprises a metal halide, or a complex thereof (e.g. HAuCl$_4$). Suitably the secondary electron generator is a metal (I), metal (II), metal (III), or metal (IV) halide, or a complex thereof. Suitably the secondary electron generator is a metal (III) halide or a metal(I) halide, or a complex thereof. Suitably the secondary electron generator is a metal chloride, suitably a metal (I), metal (II), metal (III), or metal (IV) chloride. Suitably the secondary electron generator is a metal chloride, suitably a metal (I) or a metal (III) chloride.

The secondary electron generator may be a metal(II) halide (e.g. HgCl$_2$), or a complex thereof (e.g. —HgCl when datively co-ordinated to an antiscattering component). In a particular embodiment, the secondary electron generator is a metal(11) chloride.

The secondary electron generator may suitably be selected from the group including, AlCl$_3$, TiCl$_3$, TiCl$_4$, CrCl$_3$, GaCl$_3$, YCl$_3$, MoCl$_3$, AgCl, InCl$_3$, SbCl$_3$ HfCl$_3$ TaCl$_3$, WCl$_3$, OsCl$_3$, IrCl$_3$, AuCl, AuCl$_3$, HAuCl$_4$, HgCl$_2$, CeCl$_3$, NdCl$_3$ ErCl$_3$, OSO$_4$ or any suitable complex (including any suitable salt or salt complex) thereof. In a particular embodiment, the metal compound is chloroauric acid (hydrogen chloroaurate, HAuCl$_4$) or the hydrate thereof (HAuCl$_4$.4H$_2$O). In another embodiment, the metal compound is sodium chloroaurate (NaAuCl$_4$) or a hydrate thereof (e.g. NaAuCl$_4$.2H$_2$O). In a particular embodiment, the metal compound is a mercury (II) halide. In a particular embodiment, the metal compound is a mercury dichloride. In a particular embodiment, the metal compound is a mercury diiodide.

The secondary electron generator is suitably non-particulate, especially within the resist composition where it is suitably dissolved within the solvent. The secondary electron generator is suitably soluble in the resist composition.

This enables its uniform distribution in the ultimately applied resist coating, and may facilitate metal-organic nanocomposite coating formation.

In the context of the present invention, the SEG is suitably incorporated to increase the resist sensitivity to the relevant exposure radiation without (substantially) adversely affect the resolution on beneficial properties imparted by the antiscattering compound/component. This can be achieved by not using an excessive quantity of secondary electron generator. Alternatively or additionally this can be achieved through judiciously attaching the secondary electron generator to another component of the resist composition, suitably prior to formation of the final resist composition. In such embodiments, the secondary electron generator may be in the form of an SEG group, suitably an SEG group attached to another resist component (e.g. antiscattering compound).

In a particular embodiment, the secondary electron generator is attached to the antiscattering compound—suitably one or more secondary electron generator(s) may be attached to one or more antiscattering compounds. In such embodiments, one or more secondary electron generator(s) is suitably covalently or datively bonded to one or more antiscattering compounds, suitably via one or more ligands associated with the antiscattering compound(s). Suitably a "raw" antiscattering compound (i.e. without any SEG group(s) attached) is reacted or otherwise mixed with a secondary electron generator compound to associate the antiscattering compound with or attach the antiscattering compound to the secondary electron generator. The resulting secondary electron generator may thus be an SEG group derived from the original SEG compound. Such a reaction may involve the displacement of one or more groups, counterion, or ligands of the initial secondary electron generator compound, by a co-ordinating or bonding group within the antiscattering compound. Alternatively, a secondary electron generator compound may remain intact and form a dative bond with the antiscattering compound without any displacements—for instance the secondary electron compound may act as a lewis acid.

By way of example, an antiscattering compound (or precursor thereof), suitably a polymetallic cage-based antiscattering compound comprising one or more ligands bearing a free lone pair of electrons (e.g. such as an amine, imine, pyridine or such like, for example nicotinic acid), may be reacted with a secondary electron generator compound, for example a mercury (II) dihalide, to yield an antiscattering-SEG complex comprising the antiscattering compound covalently or datively bonded to the secondary electron generator compound or a secondary electron generator group derived therefrom, for instance a corresponding mercury (II) monohalide group (—HgX).

In a particular embodiment, the antiscattering compound is a polymetallic cage, suitably as defined herein, comprising one or more ligands bearing one or more lone pair(s) of electrons (suitably a nitrogen centre bearing a lone pair, such as an amine, imine, pyridine, amide, or such like), and a secondary electron generator group (suitably derived from a compound that is either a lewis acid or comprises displacable counterions, ligands, or groups) is datively bonded to the antiscattering compound via said lone pair(s) of electrons. In an alternative embodiment, the secondary electron generator group may be attached to the antiscattering compound in the opposite manner, for instance, wherein the secondary electron generator compound comprises one or more ligands bearing one or more lone pair(s) of electrons which form dative bonds with a metal centre of the antiscattering compound.

In a particular embodiment, the antiscattering compound is a polymetallic cage comprising one or more nicotinic acid ligands per molecule of antiscattering compound, and one or more mercury (II) halide secondary electron groups (suitably mercury monohalides) are respectively datively bonded to the pyridyl moiety of the nicotinic acid ligands.

Chemically bonding (e.g. via covalent or dative bonds) secondary electron generator(s) to the antiscattering compound is particularly advantageous because it introduces sporadic (and suitably regular and well defined) regions of high electron density, which promotes localised scattering to increase resist sensitivity, without undermining the benefits of having a generally low density resist composition that promotes high resolution lithography.

Photosensitive Component

The resist composition/coating may comprise a photosensitive component, such as a photoinitiator, photoacid, or photosensitiser, suitably a component that facilitates reactivity of transformations of the resist component(s) of the resist composition.

In some embodiments, the resist component may be or otherwise contain or comprise a photosensitive component. For instance, some resist components (e.g. those capable of undergoing photolytic reactions without the assistance of additional photoinitiators, photocatalysts and the like) may be photolytically reactive in their own right (though this may depend on the relevant incident wavelength of the radiation source). As such, the resist composition may suitably be (substantially) free of a photoacid or a photoinitiator.

However, the photosensitive component may be a separate photoinitiator or photoelectron generator. Such a photoinitiator may be a compound that converts absorbed light energy, UV or visible light, into chemical energy in the form of initiating species, viz., free radicals or cations. Based on the mechanism by which initiating radicals are formed, photoinitiators are generally divided into two classes:

Type I: photoinitiators which undergo a unimolecular bond cleavage upon irradiation to yield free radicals;

Type II photoinitiators which undergo a bimolecular reaction where the excited state of the photoinitiator interacts with a second molecule (a coinitiator) to generate free radicals.

Suitable photosensitive component(s) for use within resist compositions/coatings of the invention may include:

Acetophenone; Anthraquinone; Anthraquinone-2-sulfonic, sodium salt monohydrate; Benzil; Benzoin; Benzoin ethyl ether; Benzoin isobutyl ether; Benzoin methyl ether; Benzophenone; Benzophenone/1-Hydroxycyclohexyl phenyl ketone; Benzophenonetetracarboxylic dianhydride; 4-Benzoylbiphenyl; Camphorquinone; 2-Chlorothioxanthen; (Cumene)cyclopentadienyliron(II) hexafluorophosphate; 2,2-Diethoxyacetophenone; 2,2-Dimethoxy-2-phenylacetophenone; 4-(Dimethylamino)benzophenone; 2,5-Dimethylbenzophenone; 4-Ethoxyacetophenone; Ferrocene; 4-Hydroxyacetophenone; 3-Hydroxyacetophenone; 2-Methylbenzophenone; 3-Methylbenzophenone; Methylbenzoylformate; 2-Methyl-4'-(methylthio)-2-morpholinopropiophenone; Phenanthrenequinone; 4'-Phenoxyacetophenone; Thioxanthen-9-one; Triarylsulfonium hexafluoroantimonate salts; Triarylsulfonium hexafluorophosphate salts.

In a particular embodiment, the photosensitive component is selected from the group consisting of: 2,2-diethoxyacetophenone and tris(4-tert-butylphenyl)sulfoniumtriflate.

The decision to use photosensitive components within resist components of the invention may depend upon a number of factors, for instance, incident wavelength, required sensitivity, required resolution, inherent photolytic reactivity of relevant resist components, etc.

In a particular embodiment, the resist composition is (substantially) free of any additional photosensitive component(s) (notwithstanding any inherent photosensitivity of the resist component(s), which is suitably desirable), or else the resist composition comprises no more than 1 part by weight (pbw) additional photosensitive component(s) per 100 pbw of the combined weight of anti-scattering component(s) and resist component(s), suitably no more than 1 pbw additional photosensitive component(s) per 500 pbw of the combined weight of anti-scattering component(s) and resist component(s), suitably no more than 1 pbw additional photosensitive component(s) per 1000 pbw of the combined weight of anti-scattering component(s) and resist component(s).

Resist Cross-Linker

The resist composition may suitably further comprise a resist cross-linker, which is suitably a cross-linking component that reacts with the resist component (e.g. during exposure or during post-exposure processing) to facilitate cross-linking between resist components or between a resist component and another component. Where a resist component is said to be capable of reacting with another resist component, such a reaction may be indirect and may involve an intervening resist cross-linker. Suitable cross-linkers are known in the art.

A cross-linking agent suitably facilitates formation of a developer-insoluble resist following radiation exposure.

Any suitably cross-linking agent may be used, though most advantageously the cross-linking agent is judiciously selected for maximum compatibility with the radiation source and the resist composition and components thereof.

In some embodiments, the cross-linking agent is dipentaerythriolpentaacrylate (DPEPA) or pentaerythritoltetraacrylate (PET), or any other suitable miscible multifunctional acrylate and/or mixtures thereof. Other crosslinking agents include epoxies (SU8) or if the copolymer used is for example polyhydroxystyrene a suitable photacid generator maybe employed to bring about a solubility change.

Plasmon Component

The resist composition/coating may comprise a Plasmon component. A Plasmon component is suitably a component or material that gives rise to surface Plasmon resonance (SPR) effects on a surface coated with a resist composition of the invention. These Plasmon resonance effects can facilitate high-resolution lithography because surface plasmons can have very low wavelengths and inherit the capacity to confine incident radiation to extremely small dimensions, as reported in the literature (e.g. Lewis S et al, "High density self assembled nanoparticle film with temperature-controllable interparticle spacing for deep sub-wavelength nanolithography using localized surface Plasmon modes on planar silver nanoparticle tunable grating", *Microelectronic Engineering* 85 (2008) 486-491).

Surface Plasmon resonance is a phenomenon well known in the art involving radiation-stimulated (e.g. UV or light) resonant oscillation of conduction band electrons located at interfaces between materials of differing permittivities (typically negative and positive permittivity materials) Resonance is induced by photons whose frequency matches the natural frequency of surface electrons oscillating against the restoring force of positive nuclei.

As such, a Plasmon component is a component that gives rise to the aforementioned SPR effects. Suitably the Plasmon component is particulate, suitably nanoparticulate. As such, the resist composition may be a colloidal dispersion or suspension of such a Plasmon component. Resulting coatings thus suitably include a thin layer of nanoparticulate Plasmon component (i.e. a nanoparticle film).

In some embodiments, the resist composition itself may not contain the plasmon component, but instead a plasmon component may be separately coated upon the relevant substrate surface (as part of a separate Plasmon coating composition), preferably over a pre-resist-coated surface thereof. Multiple Plasmon coatings may be applied if necessary to further improve lithographic resolution.

Any suitable Plasmon component may be used. Most suitably the Plasmon component comprises metal nanoparticles, for instance, silver or gold nanoparticles.

Particular Embodiments

In a particular embodiment, the resist composition comprises an antiscattering compound that is covalently or datively bonded to a secondary electron generator, wherein the antiscattering compound is suitably a polymetallic cage associated with one or more lone-pair bearing ligands which form a dative bond with the secondary electron generator, wherein the secondary electron generator is a metal compound, metal-containing group or fragment, or metal species having a $Z_{eff}$ greater than or equal to 25.

In a particular embodiment, the resist composition comprises an antiscattering-secondary electron generating hybrid compound (or complex) (AS-SEG hybrid), wherein the AS-SEG comprises:
  a polymetallic cage comprising one or more metal species (suitably at least two metal species, most suitable chromium and nickel) and a set of associated ligands, wherein at least one of the ligands comprises a dative lone pair of electrons, and at least one of the ligands comprises a π-system or π-bond capable of forming crosslinkages with neighbouring polymetallic cages;
  a secondary electron generating group bonded to the polymetallic cage via a dative lone pair of electrons borne by one of the ligands of the polymetallic cage, the secondary electron generating group comprising a metal-centred (suitably a metal different from any within the polymetallic cage and suitably with a higher atomic number) compound or group, suitably a metal halide.

Lithography Using Resist Compositions of the Invention

The present invention provides a method of performing lithography, the method comprising:
  i) providing a resist-coated substrate as defined herein or applying a resist coating to a substrate;
  ii) exposing part(s) of the resist coating to radiation to provide an exposed resist coating;
  iii) developing the exposed resist coating to generate a resist pattern layer, the resist pattern layer comprising: developer-insoluble coating portions of the resist coating (i.e. ridges); and an array of grooves extending through the resist pattern layer;
  iv) optionally modifying the substrate, substrate surface, or part(s) thereof, underlying the resist pattern layer;
  v) optionally removing the resist pattern layer to provide a modified substrate;
  vi) optionally repeating, one or more times, step iv) and/or steps i)-v) (optionally with an alternative resist coating, such as a standard photoresist, instead of the resist coating; and optionally using alternative radiation during exposure) upon the modified substrate;
wherein step (i) of the method is optionally preceded by performing steps (i) to (vi) (i.e. pre-steps (i)-(vi)), optionally repeated one or more times, using either a resist coating or an alternative resist coating and using either electromagnetic radiation or alternative radiation during exposure;
wherein the resist coating comprises an optionally dried and/or cured resist composition as defined herein.

Suitably the method involves at least one cycle of photolithography, suitably with the resist coating of the invention. Suitably such photolithography may be implemented using a photomask, be it a photomask generated by a method of the invention, or a standard photomask.

Step (i) of the method is optionally preceded by performing steps (i) to (vi) (i.e. pre-steps (i)-(vi)), optionally repeated one or more times, using either a resist coating or an alternative resist coating and using either electromagnetic radiation or alternative radiation during exposure;

The resist coating suitably comprises or consists essentially of an optionally dried and/or cured resist composition as defined herein. The resist coating may, however, comprise one or more coating layers, at least one of which is a resist coating of the invention. In an embodiment, the resist coating may comprise one or more additional coatings thereon (e.g. a Plasmon coating).

The invention further provides an imaged substrate obtainable by, obtained by, or directly obtained by this method.

Such methods may be used for imaging, for preparing patterned substrates, for selectively modifying a surface of a substrate, and for manufacturing a multi-layered substrate (e.g. integrated circuit), suitably as defined herein.

In a particular embodiment, the above method is used in the production of an integrated circuit (which is an example of a multi-layered substrate) or plurality thereof (e.g. on a wafer). The skilled person is well aware of standard manufacturing processes used in the production of integrated circuits. The method of the invention may be used to produce one or more layers of an integrated circuit, and in some embodiments may be used to produce all layers. However, since high resolution may only be required for one or some resolution-critical layers (e.g. if resolution is not important for every layer), alternative lithographic methods may be involved in the production of other layers (e.g. standard photolithography). In this manner, the lithographic methods of the invention may complement other forms of lithography (e.g. existing photolithographic techniques) in the fabrication of integrated circuits.

Substrate

The substrate upon which lithography is performed may be any suitable substrate.

The substrate is suitably a single solid body, or a portion thereof. The substrate is suitably in the form of a (substantially rigid) plate, wafer, or sheet, most suitably a wafer.

Since, in accordance with the methods of the invention, certain processing steps may be "repeated" (including steps which refer to a "substrate"), the "substrate" may refer to the initial "input substrate" (i.e. before any method steps of the invention are performed) or a "modified substrate" (following certain method steps). As such, in principle the "substrate" may be any substrate (including partially fabricated products or integrated circuits) which is suitable for processing via lithography.

The substrate (whether the input substrate or modified substrate) is suitably either part of a pre-formed resist-coated substrate or is a substrate to which a resist coating is applied (e.g. in step i) of many of the methods disclosed herein). As such, the substrate may be defined (whether in terms of its nature, parameters, material form, etc.) without reference to the resist coating itself. The substrate or modified substrate may be planarized prior to coating with a resist coating.

In some embodiments, the substrate (or part thereof) to which the method(s) of the invention is applied is incorporated into a final (printed) product (e.g. integrated circuit), though this may itself be incorporated into products (e.g. circuit boards and/or electronic devices). In other words, the "imaged substrate" may be or become a consumable product or may otherwise be or become incorporated into a consumable product. Such consumable products include an integrated circuit, integrated circuit die or wafer, integrated circuit package, a circuit board, or an electronic device or system.

In some embodiments, however, the substrate (or part thereof) to which the method(s) of the invention is not incorporated into a final (printed) product (e.g. integrated circuit) but is rather incorporated into a tool, for example a lithographic mask (whether positive or negative) such as a photomask for use in photolithography, used to produce such a final (printed) product. In other words, the "imaged substrate" may be a tool for producing a consumable product. As such, the advantages of the invention (e.g. high resolution) may be imparted to a lithographic tool (e.g. a lithographic mask with high-resolution detail), which may thereafter be imparted to a final (printed) product made using said tool. As such, ultra high-resolution photolithography (as per the invention) may be used to produce a corresponding ultra high-resolution lithographic mask (e.g. photomask) which may in turn be used in ultra high-resolution lithography, such as photolithography, to produce ultra high-resolution integrated circuits (or one or more ultra high-resolution layers thereof). As such, the invention provides a method of manufacturing a lithographic mask and a lithographic mask (e.g. photomask) as defined herein; as well as a use of such a lithographic mask in the production of an integrated circuit, integrated circuit die or wafer, integrated circuit package, a circuit board, or an electronic device or system).

The substrate suitably comprises or consists essentially of a substrate base material.

The substrate base material may comprise or consist essentially of any suitable material for use in the method(s) of the invention. The substrate base material (and suitably also the substrate base layer as a whole) is suitably a single substance (element or compound) or a single composite material (mixture of two or more elements and/or compounds). However the substrate base material may be a multi-layered composite material.

Where the substrate (or part thereof) is not incorporated into a final (printed) product (e.g. integrated circuit) but is rather incorporated into a tool (e.g. lithographic mask), suitably the substrate base material is a material appropriate for the tool in question. Suitably, the substrate base material is a lithographic plate (potentially comprising one or more layers of one or more materials). Where the tool is a lithographic mask (e.g. a photomask), the substrate base material may be (substantially) transparent or (substantially) non-transparent to the relevant radiation (e.g. UV or visible light, if a photomask), depending on the ultimate nature of the mask. For instance, a substrate base material that is (substantially) transparent to the relevant radiation may be used where a lithographic mask is formed through generating opaque regions on the substrate base material during the mask manufacturing process (e.g. non-removed resist coating may provide opaque regions, or opaque regions may be generated by judicious surface modifications). Alternatively, a substrate base material that is (substantially) opaque or non-transparent to the relevant radiation may be used where a lithographic mask is formed through generating transparent regions on the substrate base material during the mask manufacturing process (e.g. where the process involves surface modifications which remove portions of substrate base material—e.g. via etching). In other embodiments, the substrate base material may be a laminated composite, comprising at least one layer of material which is (substantially) transparent to the relevant radiation (e.g. glass, transparent plastics) and at least one layer of material which is (substantially) opaque to the relevant radiation—under such circumstances, the process of manufacturing a lithographic mask may involve removal or regions of opaque material to leave transparent portions.

Lithographic masks, such as photomasks may comprise a layer of transparent fused silica covered by a pattern defined with a chrome metal-absorbing film, the pattern having been generated in accordance with methods of the invention to thereby afford high resolution patterns. Such masks may then be used in lithographical methods of the invention to produce high-resolution products, such as integrated circuits.

Where the substrate (or part thereof) is to be incorporated into a final (printed) product, suitably the substrate base material is a material appropriate for the product in question. In a particular embodiment, the base substrate is an electronic component substrate. A suitable electronic component substrate may include a substrate comprising or be (substantially) made of silicon (e.g. a silicon wafer), copper, chromium, iron, aluminium, or glass. The base substrate may itself comprise a surface coating, e.g. as an undercoat to the resist coating to be applied thereto. In a particular embodiment the base substrate is a silicon substrate. The substrate base material may comprise or consist essentially of a semiconductor material, most suitably silicon, most suitably a single monolithic silicon crystal. Most suitably, the substrate base layer is a silicon wafer. Suitably, where the resist coatings and compositions of the invention are used in the fabrication of integrated circuits, the input substrate may be a partially-fabricated integrated circuit, wherein some layers of the integrated circuit have already been formed (optionally with or without using the resist coating or composition of the invention—other layers may be formed using traditional IC fabrication techniques, such as standard photolithography). Furthermore, after the resist coatings of the invention have been used (and suitably removed) during the fabrication of part of an integrated circuit, further layers of the integrated circuit may be formed (optionally with or without using the resist coating or composition of the invention—again other layers may be formed using traditional IC fabrication techniques, such as standard photolithography)

The substrate may consist essentially of a substrate base material (e.g. where the input substrate is yet to be modified, for example, via surface oxidation, lithography and/or other substrate modification step(s)).

However, alternatively the substrate (which may include the input substrate) suitably comprises a substrate base material (suitably consisting essentially of substrate base material) that has been subject to modification (e.g. a modified substrate). Such a modified substrate may include a substrate base material that has been modified by a pre-processing or pre-coating step (e.g. thermal oxidation of a surface, e.g. to produce a silicon oxide insulation layer prior to coating with a resist coating) before being subjected to the method(s) of the invention; otherwise modified prior to being subjected to the method(s) of the invention (e.g. a partially formed integrated circuit formed using alternative technologies, e.g. using photolithography); or else modified during or after the substrate has been subjected to the method(s) (or some of the step(s) thereof) of the invention. Each further substrate layer suitably comprises or consists essentially of a further substrate material, which may be the same as or different from the substrate base material. In a particular embodiment, one nor more of the further substrate layers comprises or consists essentially of the substrate base material, albeit not necessarily part of the substrate base layer.

Suitably the substrate base layer is disposed towards (or at) the base of the substrate, suitably relative to an exposure surface thereof (i.e. the surface whose resist coating is to be exposed to radiation—this may be considered a top of the substrate, regardless of the ultimate orientation of the resist-coated substrate during processing).

Suitably the method(s) of the invention involve generating additional layer(s) (including partial layer(s)) upon the substrate base layer and optionally thereafter upon each other; incorporating additional layer(s) within either the substrate base layer or any further substrate layer(s) (e.g. via doping); and/or removing part(s) of the substrate base layer and/or part(s) of further substrate layer(s) (e.g. via etching). Suitably the method(s) of the invention produce a multi-layered substrate comprising a substrate base material towards (or at) the bottom thereof. The substrate base layer is suitably the foundation upon which the other layers are built.

In preferred embodiments, the input substrate comprises a substrate base layer underlying a layer of oxidised (preferably thermally oxidised) substrate base material. In a particular embodiment, the input substrate comprises a wafer of silicon (suitably a single crystal of silicon) underlying a silicon oxide (or silicon dioxide) layer.

As will be appreciated by the skilled person, where a lithographic mask (e.g. photomask), be it a standard photomask or one formed by the method(s) of the invention, is used in subsequent lithography (e.g. to form an alternative imaged substrate, multi-layered substrate, integrated circuit, etc.), the same substrate base material (e.g. silicon wafer) may be used. Moreover the same lithographic methods defined herein may be used, though alternative resist coating(s), lithographic methods (e.g. exposure and development methods) may be used with the lithographic mask instead of or in addition to (e.g. in repeated steps) the resist coating(s) and specific method steps of the invention.

Although the methods of the invention are especially applicable for the production of silicon-based integrated circuits, and products derived therefrom, the present invention will be equally applicable to future materials used in the construction of electronic components—for instance graphene based materials.

Resist-Coated Material and its Formation

The present invention provides a resist-coated material, and a method of forming a resist-coated material, as defined herein. A resist-coated material or substrate is a "substrate" as defined herein with a resist coating on a surface (or part of a surface) thereof.

The resist-coated material suitably involves coating the input substrate with a resist composition as defined herein, and optionally thereafter curing and/or drying the coating, to form a coating of resist composition upon the substrate.

Coating the input substrate, which suitably involves applying the resist composition to a surface(s) of the input substrate, may be performed by any number of methods well known to the person skilled in the art. Applying a resist coating to a substrate (be it a single body of substrate base material, a multilayered substrate, an input substrate, or a modified substrate) suitably involves applying a resist composition (suitably as defined herein, though alternative resist compositions outside the scope of the invention may be used in addition, so long as the resist composition of the invention is used at least once in the method(s) of the invention) to a surface (or part of a surface) thereof and optionally thereafter curing and/or drying the applied resist composition to form the resist coating. The resist composition may be applied in any suitable manner though most suitably the resist composition is applied via dipping, spraying, brushing, roller coating, and/or spin coating. Most preferably the resist composition is applied to the substrate via spin coating, which is especially suitable during the fabrication of integrated circuits. In a particular embodiment, the resist composition is applied to the base substrate or input substrate via spin-coating (e.g. using a spinner), suitably to thereby form a resist spin-coated input substrate. Most suitably the applied resist composition is cured and/or dried (suitably through baking). The resist coating suitably has a (substantially) uniform thickness. The skilled person is well versed in how to apply a resist coating to a substrate prior to lithography.

Where a substrate is said to comprise or be coated by a coating, such as a resist coating, said coating suitably covers a surface (or part thereof) of said substrate.

After coating the base substrate or input substrate with the resist composition, the coating is preferably cured and/or dried. Suitably, the coating is dried at a temperature and pressure and for a time suitable to form a resist film upon the base substrate or input substrate. The temperature (and pressure, especially where reduced pressure is used) may be chosen for compatibility with the particular solvent of the resist composition (e.g. to boil off the solvent). In a particular embodiment, the coating (or coated-base substrate or coated-input substrate) is baked at atmospheric pressure (approximately 1 Bar) and a temperature between 60 and 200° C. (more suitably between 80 and 180° C.) for between 30 seconds and 5 minutes (suitably between 90 and 150 seconds, suitably around 120 seconds). Suitably such curing/drying may remove some, most, or all solvent(s) present in the resist composition. Where the anti-scattering compound(s) are associated with a solvate, suitably some, most, or all of said solvate is removed by said curing and/or drying.

The average thickness of the coating is suitably 10-500 nm, suitably 50-200 nm. The maximum thickness of the coating is suitably 1000 nm, suitably 500 nm. The minimum thickness of the coating is suitably 5 nm, suitably 20 nm. The technology of the present invention allows effective, high quality patterning of extremely thin resist coatings.

The resist coatings of the invention provide good adhesion to base substrates and input substrates, especially those suitable for electronic components.

Exposure and Radiation

Exposing part(s) of the resist coating to radiation provides an exposed resist coating.

Exposing part(s) of the coating of the resist-coated material to radiation suitably involves selectively exposing said part(s), whilst other part(s) are selectively non-exposed. As such, the method suitably excludes exposing all of the coating to radiation.

Selective exposure of part(s) of the coating may involve direct irradiation of the relevant part(s) with a focused or targeted beam (e.g. such as an electron beam or laser beam, e.g. a UV-laser beam) or blanket flood exposure (i.e. unfocussed/untargeted) exposure of the coating through a mask (e.g. photomask, preferred when using photoresists) comprising pre-determined apertures corresponding with the position of the exposed part(s) of the coating. The particular exposure technique used may depend on the particular radiation being employed.

Suitably the exposed part(s) of the coating undergo a transformation, suitably a chemical transformation, suitably which changes the solubility properties thereof (suitably in relation to a pre-determined developing medium, for example, one of the developing media described herein), suitably whether before or after an optional post-exposure bake, suitably even before any such post-exposure bake.

Suitably, parts of the coating which are "radiation-exposed" have different solubility properties to parts of the coating which are not "radiation-exposed". This solubility differential suitably allows for development and selective removal of either the "radiation-exposed" or "non-radiation-exposed" parts of the coating (depending on whether the resist is positive or negative tone resist).

Exposure of the coating may lead directly to a developable substrate (i.e. a substrate which can undergo development to produce a patterned substrate). However, additional subsequent processing steps may be employed. Suitably, radiation exposure of the coating may be followed by a post-exposure bake. The post-exposure bake may comprise baking at a temperature and pressure and for a time suitable to form a developable substrate. The temperature (and pressure, especially where reduced pressure is used) may be chosen for compatibility with the particular solvent of the resist composition (e.g. to boil off the solvent). In a particular embodiment, the exposed coating (or exposed coated-base substrate or exposed coated-input substrate) is baked at atmospheric pressure (approximately 1 Bar) and a temperature between 60 and 200° C. (more suitably between 80 and 180° C.) for between 30 seconds and 5 minutes (suitably between 90 and 150 seconds, suitably around 120 seconds).

Any radiation suitable for use with resist compositions may be used. Suitably resist compositions are formulated for exposure with particular radiation, so the radiation may be selected based on the resist composition question. Suitably the radiation in question is either electromagnetic radiation (especially ultraviolet) or an electron beam. Preferably the radiation is electromagnetic radiation.

Suitably the electromagnetic radiation comprises radiation of wavelengths between 10 nm and 1000 nm, suitably between 50 nm and 700 nm, suitably between 100 nm and 400 nm, suitably between 150 and 300 nm, suitably between 170 and 280 nm. Most suitably the electromagnetic radiation is ultra-violet radiation. The electromagnetic radiation may suitably comprise radiation of wavelengths between 10 and 30 nm, suitably between 11 and 20 nm, suitably between 12 and 15 nm.

Suitably wherever "radiation" is said to have a stipulated wavelength or stipulated wavelength range, suitably this stipulated wavelength or wavelength range constitutes at least 20% of the overall intensity of said "radiation", suitably at least 50%, suitably at least 80%, or suitably substantially all of said "radiation".

Developing the Resist Coating and the Developing Medium

The present invention provides a patterned substrate, and a method for its preparation (e.g.

developing an exposed resist-coated material), as defined herein. Suitably, "development" forms grooves within the resist coating to thereby form a pattern layer.

The step of developing the exposed resist coating generates a resist pattern layer comprising developer-insoluble coating portions of the resist coating (i.e. ridges) and an array of grooves extending through the resist pattern layer. In certain embodiments, a surface of the substrate underlying the resist pattern layer is exposed in/by the grooves, though is suitably masked by the ridges.

Developing the exposed resist-coated material is suitably performed with a developing medium. As such, the exposed resist-coated material, or at least the exposed coating thereof, is suitably contacted with (e.g. washed with and/or immersed within) a developing medium (which is suitably liquid) in a manner sufficient to remove (suitably through dissolving) either the exposed part(s) (for positive resists) or non-exposed part(s) (for negative resists) of the coating of the resist composition. Most suitably the developing medium suitably removes non-exposed part(s).

As aforementioned, exposure of the resist-coated material generally causes exposed part(s) of the coating to have a different solubility (suitably in relation to a pre-determined developing medium) to non-exposed part(s) of the coating. This solubility differential between the exposed and non-exposed part(s) of the coating is instrumental in facilitating subsequent development of the exposed coated-resist material. As such, either the exposed or non-exposed part(s) of the coating may be selectively removed (preferably dissolved or otherwise mobilised) to transform the coating into a pattern layer comprising an array of grooves extending through the pattern layer (i.e. through what was the original coating). The grooves of the pattern layer then correspond with the part(s) of the coating that have been removed, whereas the ridge/protrusion (i.e. non-groove) part(s) of the pattern layer correspond with the part(s) of the coating that remain. The pattern layer (suitably the non-groove part(s) thereof) therefore suitably comprises ridges or protrusions (i.e. between the grooves) which are either exposed part(s) (for positive resists) or non-exposed part(s) (for negative resists) of a coating of the resist composition.

The specific developing conditions may be tuned, for instance, to optimise the quality of the resulting patterned substrate, or optimise the developing process (whether in the interests of cost, speed, or ultimate product quality). Developing times (for instance, the time if immersion of the exposed coating) may, for example, be optimised to maximise removal of the part(s) of the coating intended for removal and to minimise removal or damage of part(s) of the coating intended to remain. Likewise, the developing medium may be tuned to optimise either or both the developing process or the resulting product.

Suitably, after developing, the method of preparing a patterned substrate comprises rinsing the pattern layer, suitably with a rinse medium, which suitably comprises an organic solvent.

Suitably, after developing, and optionally after rising, the method further comprises drying (or baking) the patterned substrate.

The developing medium itself may be any suitable developing medium known in the art. Suitably the developing medium complements the resist composition (or coating thereof). Most suitably the developing medium complements the solubility properties of the resist composition and its post-exposed counterpart, suitably to optimize contrast (i.e. the differential solubility and/or solubilization rates) between exposed and unexposed parts of the resist coating.

Where the resist composition (or coating thereof) is a negative resist, the developing medium suitably comprises a solvent within which the anti-scattering component and/or resist component is (substantially) soluble, or is at least more soluble than a post-exposed counterpart of the anti-scattering compound and/or resist component. Where the resist composition (or coating thereof) is a positive resist, the developing medium suitably comprises a solvent within which the anti-scattering compound and/or resist component is (substantially) insoluble, or at least less soluble than a post-exposed counterpart of the anti-scattering compound and/or resist component.

The developing medium may or may not dissolve all components of the exposed or non-exposed (depending on whether positive or negative resist) resist composition (or a coating thereof) intended for removal by development, but any insoluble (or less soluble) components may still be removed in slurry, suspension or dispersion following dissolution (or partial dissolution) of the resist component or post-exposed counterpart thereof with which said insoluble components are mixed.

The developing medium for the resist coatings of the invention suitably comprise or consist of an organic solvent, suitably a non-polar organic solvent, suitably which is an organic compound. The organic solvent is suitably selected from one or more hydrocarbon solvents, suitably one or more (4-12C)hydrocarbon solvents. For example, the organic solvent may be selected from one or more of pentane, hexane, octane, decane, 2, 2, 4-trimethylpentane, 2, 2, 3-trimethylpentane, perflurohexane and perfluronpetane and aromatic hydrocarbon solvents, such as toluene, ethylmethpropylbenzene, dimethylbenzene, ethyldimethylbenzene and dipropylbenzene). In a particular embodiment, the developing medium for resist coatings of the invention is hexane. In a particular embodiment, the developing medium for resist coatings of the invention is MTBE.

The pattern layer may be considered to comprise an array of grooves extending through the pattern layer (i.e. a groove pattern) and an array of ridges/protrusions (i.e. the non-groove part(s) of the pattern layer). The ridges suitably correspond with developer-insoluble coating portions whereas the grooves suitably correspond with developer-soluble coating portions (i.e. which are removed upon developing).

The aspect ratio of the grooves (i.e. width/height ratio) may be suitably greater than or equal to 1:1, suitably greater than or equal to 5:1, suitably greater than or equal to 10:1, and impressively an aspect ratio of greater than or equal to 15:1 or even greater than or equal to 20:1 may be achieved. The technology underlying the present invention allows extremely high aspect ratios to be achieved, especially where an anti-scattering compound is employed.

Further Processing of Patterned/Developed Substrate

After developing the exposed resist coating, the surface of the substrate underlying the patent layer may be selectively modified in any one or more of a number of ways. Since the step of selectively modifying the substrate, substrate surface, or part(s) thereof, may be repeated indefinitely (before or after removing any residual resist pattern layer, and optionally after further lithography stages), one or more successive selective substrate/surface modification steps may ensue, which may optionally be selected from any of those detailed herein, or a combination thereof.

Suitably the part(s) of the substrate/surface modified during such selective modification are the part(s) exposed by or underlying the grooves in the pattern layer (i.e. the underlying surface to be modified may be exposed/visible or have only a relatively thin layer of resist remaining thereupon).

Selectively modifying the substrate/surface may involve removing part(s) of the substrate/substrate surface, adding or depositing a material to (or upon) the substrate/substrate surface, and/or changing part(s) of the substrate/substrate surface.

Modifying the substrate/surface may by removing part(s) of the substrate/substrate surface may, for instance, involve etching the substrate/surface. In the context of integrated circuit fabrication, typically such etching is performed to remove an insulating material (e.g. silicon oxide/dioxide layer, e.g. suitably which protects underlying conductive material), suitably to thereby uncover an underlying conductive material (e.g. silicon). Alternatively or additionally, etching may involve etching a conductive material (e.g. silicon)—e.g. capacitors may be produced via trenches etched deep into a silicon surface.

In the context of manufacturing a lithographic mask (e.g. a photomask), such etching may remove an opaque material or layer to reveal an underlying transparent material through which radiation may pass (e.g. during lithographic exposure through said resulting lithographic mask).

Etching would suitably selectively etch the part(s) of the substrate/surface underlying the groove(s) of the pattern layer rather than the part(s) of the substrate/surface underlying the ridges (which are essentially protected).

Modifying the substrate/surface by changing part(s) of the substrate/substrate surface may, for instance, involve altering the transparency properties of the substrate/surface (e.g. in producing a lithographic mask) or altering the electrical properties of the substrate/surface (or the relevant part(s) thereof) (e.g. when producing an integrated circuit). Altering the electrical properties of the substrate/surface is particularly applicable where the underlying substrate/surface being modified (e.g. that exposed by the grooves) is a semiconductor (e.g. silicon). Alteration of the substrate/surface(s) electrical properties may involve "doping" of the relevant part(s) of the substrate/surface. Doping is a well known phenomenon in the field of semiconductor technology, and facilitates the creation of electronic components within an integrated circuit (e.g. diodes, logic gates, transistors, etc.). Such doping can be performed using techniques well known in the art, such as diffusion (e.g. where a dopant is diffused into the substrate so that it becomes embedded therein), ion implantation (e.g. where an ion beam implants ions into the substrate).

Doping can, however, be achieved through pre-deposition, such as by epitaxial growth of a doped deposit (e.g. epitaxial growth of an Si—Ge layer).

Modifying the substrate/surface by changing part(s) of the substrate/substrate surface may alternatively or additionally involve forming an insulation layer (or isolation layer), or gate, suitably by transforming part(s) of the substrate/surface—e.g. through thermal oxidation (e.g. thermal oxidation of a conductor, such as silicon, produces the insulator silicon dioxide).

Modifying the substrate/surface by adding or depositing a material to (or upon) the substrate/substrate surface may, for instance, involve deposition of an insulating material, for instance, to isolate an electronic component or conductive element. Alternatively it may involve deposition of a conductive material (e.g. metal plating etc.).

Any, some, or all of the aforementioned surface modification steps may be deployed (suitably in succession, though optionally interspersed with lithographic steps—e.g. re-coating, re-exposure, re-development) to form a multi-layered substrate, such as an integrated circuit (e.g. die or wafer).

Suitably, at a certain stage (e.g. following one or more surface modifications), one or more resist pattern layers (which may or may not be a resist pattern layer) are removed. A variety of techniques known in the art may be deployed for such removal (e.g. chemical removal, physical removal, thermal treatment, radiative removal or plasma ashing, or a combination), though plasma ashing may be employed in the context of integrated circuit fabrication. Alternatively, the residual resist pattern layer(s) may be removed with a solvent (e.g. through dissolution) or via a selective etching process.

In some embodiments, once a resist pattern layer is removed, the entire modified surface may be treated/modified in toto.

Step (vi) allows for repetition of a surface modification step, so that successive surface modification steps may be performed (before and/or after pattern layer removal). In addition, step (vi) allows all lithography steps (steps i)-iii))), further surface modification steps (step iv)), and optional pattern layer removal (step v)) steps, to be repeated any number of times. So long as the method comprises at least one step involving a resist composition/coating of the invention or at least one step involving a tool (e.g. lithographic mask) of the invention, any or all of the repeated steps may employ an alternative resist coating (during exposure) instead of the resist coatings of the invention. Alternatively, any or all of the repeated steps may employ the resist coating of the invention. It should therefore be evident that the repeating steps are not limited, and permit a multiplicity of method steps outside the scope of the invention, suitably in the production of integrated circuits and the like.

In the context of fabricating an integrated circuit, selectively modifying the substrate/surface (or part(s) thereof) may involve front-end-of-line (FEOL) processing (e.g. formation of electronic components, such as transistors, directly in the substrate, i.e. silicon). In fact, steps (i) to (vi) may collectively constitute front-end-of-line (FEOL) processing. It will be appreciated that a multi-layered substrate, of which an integrated circuit is an example, can be fashioned by multiple repeat steps and optionally also pre-steps.

The aforementioned processing options and features may apply equally to a method of manufacturing a lithographic mask (though features relating to integrated circuit fabrication are obviously not especially applicable to the creation of a lithographic mask), a method of performing lithography (using a lithographic mask formed by a method of the invention), a method of manufacturing a multi-layered substrate, or a method of fabricating an integrated circuit die or an integrated circuit wafer comprising a plurality of integrated circuit dice.

Typically, step (vi) may be followed by one or more finishing steps, such as back-end-if-line (BEOL) processing (as used in the fabrication of integrated circuits). This may involve conductively interconnecting electronic components and/or providing external contact terminals.

It will be evident that any number of pre-steps may precede step (i) of this method. In a particular embodiment, the input substrate is itself a partially built integrated circuit die (or wafer of dice) which has already been subjected to a plurality of pre-treatment steps.

Integrated Circuit Wafers and Dice

The present invention provides a method of fabricating an integrated circuit die or an integrated circuit wafer comprising a plurality of integrated circuit dice, the or each die comprising a plurality of electronic components, wherein the method comprises:

i) providing a resist-coated substrate as defined herein or applying a resist coating to a substrate; and
ii) exposing part(s) of the resist coating to radiation to provide an exposed resist coating;

OR i) providing a resist-coated substrate or applying a resist coating to a substrate (the resist coating may be any resist coating suitable for exposing via a lithographic mask, e.g. a photoresist); and
ii) exposing part(s) of the resist coating, through a lithographic mask (e.g. photomask) as defined herein (or obtainable by a method defined herein), to radiation (e.g. UV or visible light) to provide an exposed resist coating;

AND iii) developing the exposed resist coating to generate a resist pattern layer, the resist pattern layer comprising: developer-insoluble coating portions of the resist coating (i.e. ridges); and an array of grooves extending through the resist pattern layer;
iv) modifying the substrate, substrate surface, or part(s) thereof, underlying the resist pattern layer (this may involve conductively interconnecting the electronic components of the or each die with conductor(s));
v) removing the resist pattern layer to provide a modified substrate;
vi) optionally repeating, one or more times, step iv) and/or steps i)-v) (with either a resist coating of the invention or an alternative resist coating; with or without a lithographic mask; and with either radiation applicable to resist coatings of the invention or alternative radiation) upon the modified substrate;
vii) optionally conductively interconnecting the electronic components of the or each die with conductor(s) (if not already performed during one or more substrate/substrate-surface modifying steps) to provide an integrated circuit with external contact terminals;
viii) optionally performing one or more further finishing steps;
ix) optionally separating an integrated circuit die from a wafer comprising a plurality of integrated circuit dice.

Step (i) of the method is optionally preceded by performing steps (i) to (vi) of this method (i.e. pre-steps (i)-(vi), optionally using either of the two step (i)/(ii) combinations) and/or performing steps (i) to (vi) of the method of performing lithography, optionally repeated one or more times, using either a resist coating of the invention or an alternative resist coating, along with appropriate exposure radiation.

The resist coating suitably comprises an optionally dried and/or cured resist composition; wherein the resist composition comprises an anti-scattering compound.

In a particular embodiment, steps (i) and (ii) comprise:
i) providing a resist-coated substrate as defined herein or applying a resist coating to a substrate; and
ii) exposing part(s) of the resist coating to radiation to provide an exposed resist coating;

Features, including optional, suitable, and preferred features, relating to this method of fabricating an integrated circuit die or an integrated circuit wafer comprising a plurality of integrated circuit dice are described in relation to a method of performing lithography hereinbefore.

However, it is important to appreciate that the fabrication of integrated circuit dies or dice may involve many processing steps, and may involve the production of a multi-layered substrate.

As will be appreciated by those skilled in the art, producing an integrated circuit (for inclusion in a circuit board) typically involves wafer processing (i.e. processing of a silicon wafer), die preparation (e.g. cutting/separating individual dice from the processed wafer), integrated circuit packaging (where each dice is package so that it may be used in an circuit board), and suitably also integrated circuit testing.

Though wafer processing is well understood in the art, it is worth noting that in certain embodiments wafer processing comprises wet cleaning; photolithography; ion implantation; dry etching and/or wet etching; plasma ashing; thermal treatment (e.g. annealing or thermal oxidation); chemical vapour deposition (CVD), physical vapour deposition (PVD), molecular beam epitaxy (MBE), and/or electrochemical deposition (ECD); wafer testing (e.g. to validate electrical performance); and wafer backgrinding (to reduce thickness of the wafer and resulting die and chip). The methods, resist compositions/coatings, and lithographic masks of the invention are suitably used at least once during wafer processing. Where a resist coating is used during wafer processing, suitably at least one lithography operation (which combines substrate resist coating, exposure, and development) is replaced by a lithography operation that uses a resist coating of the invention in place of the usual resist. Where a lithographic mask, produced using a resist coating of the invention, is used during wafer processing, suitably at least one photolithography operation is replaced by a lithography operation (which may itself involve photolithography or any other type of lithography, including eBeam, though most preferably photolithography) that utilises said lithographic mask during exposure. However, it will be appreciated that the benefits of the invention may be realised even if the resist coating or lithographic mask of the invention is used only once (or to produce only a single layer or only a single electronic component or single set of electronic components), and conceivably any further lithography operations (e.g. photolithography) may employ standard techniques known in the art of fabricating integrated circuits. Hence the methods of the invention provide the option for any or all repeat steps (and even any or all of any pre-steps) to be performed without the coating or lithographic mask of the invention.

As aforementioned, steps (i)-(vi) of the method may constitute front-end-of-line (FEOL) processing. Optionally, this processing does, at least to an extent, involve conductively interconnecting the electronic components of the or each die. However, most suitably, steps vii) to ix) constitute back-end-of-line (BEOL) processing.

Suitably conductively interconnecting the electronic components involves metallisation. Suitably, conductively interconnecting the electronic components involves creating metal interconnecting wires isolated by one or more dielectric (i.e. insulating) layers, where the insulating material is typically silicon dioxide (typically formed by thermal oxidation of silicon) or a silicate glass, though the material is not limited.

Metallisation may involve generating a network of metal wires, such as copper or aluminium wires. Such a process may suitably involve: a) blanket coating of a modified substrate with a metal (e.g. copper or aluminium), patterning (e.g. using lithography to generate a resist pattern layer), etching the metal underlying a resist pattern layer (i.e. to produce discrete metal wires), and forming or depositing an insulating material over the metal wires. It will be appreciated that, for instance, where multiple layers of metal wires are required to generate a viable integrated circuit, some or all of such metal wire layers may be formed instead during a surface modification step, which may involve this same procedure.

After a wafer of dice is produced, die cutting may ensure to separate all of the dies ready for packaging.

Wafers and dice produced by the method of the invention are characterised by high performance owing, not least, to the high resolutions obtained. They may also be smaller than standard IC dice.

Integrated Circuit Packages

The skilled person in the field of integrated circuits is well able, using standard workshop techniques, to produce an integrated circuit package from an integrated circuit die. However, the present invention provides an a method of manufacturing an integrated circuit package, the integrated circuit package comprising a plurality of pins and an integrated circuit die with external contact terminals conductively connected to the corresponding plurality of pins, wherein the method comprises:
i) providing an integrated circuit die as defined herein or fabricating an integrated circuit die by a method of fabricating an integrated circuit die as defined herein;
ii) attaching the integrated circuit die to a package substrate, wherein the package substrate comprises electrical contacts, each of the electrical contacts being optionally connected or connectable to a corresponding pin;
iii) conductively connecting each of the external contact terminals of the integrated circuit die to corresponding electrical contacts of the package substrate;
iv) optionally (and if necessary) connecting the electrical contacts of the package substrate to corresponding pins;
v) encapsulating the integrated circuit die.

Conductively Connecting Die and Package Substrate

Typically the method involves conductively connecting a die to a package substrate by one of a variety of methods known in the art, such as wire bonding, thermosonic bonding, flip chip, wafer bonding, or tab bonding.

Connecting pins render IC's practical and straightforward to incorporate into a circuit board. Therefore, the method suitably involves electrically connecting the IC package pins to the die via appropriate contacts. Typically, the connecting pins are part of an encapsulation device, and so this step may be combined with encapsulation step.

Dice can be air/moisture sensitive, hence why they are usually encapsulated. An encapsulated IC package is suitably baked, plated, laster marked, and trimmed. Finally, an IC package is suitably electronically tested for quality assurance.

Circuit Boards, Electronic Devices or Systems

Suitably, a circuit board incorporating an integrated circuit package (with a plurality of pins) of the invention may be readily produced by simply conductively connecting the integrated circuit package to a circuit board.

Furthermore, said circuit board may be readily incorporated into an electron device or system as defined herein. As such, consumer products that are or incorporate an electronic device or system of the invention, reap the benefits of the high resolution (and other notable advantages) integrated circuits afforded by methods of the invention, and the novel resist coatings described herein.

EXAMPLES

Materials and Equipment

Unless stated otherwise, all reagents and solvents were commercially available and used as received. Elemental analyses were performed by departmental services at The University of Manchester. Carbon, nitrogen and hydrogen analysis was performed using a Flash 200 elemental analyser. Metal analysis was performed by Thermo iCap 6300 Inductively Coupled Plasma Optical Emission Spectroscopy (ICP-OES).

Silicon wafer substrates (wafers 500 μm thick) 10 mm×10 mm were commercially sourced from University wafer.com and used as supplied.

The spin-coating equipment included an SCS G3P-8 spin coater, with an 8 inch bowl and spin speeds of 100 to 10000 rpm.

Post-developed patterned substrates were inspected and analysed using a Leica optical microscope using a 10× objective lens.

UV exposure is performed using a UV Crosslinker AH light box with five 254 nm bulbs. These bulbs had a light exposure profile of an exposure width of 11 nm which covers the 248 nm radiation line. The 193 nm exposure was performed using a pulsed laser with a wavelength of 193 nm. The gases using were a mix of Argon and Fluorine. The pulses were 100 mS where in each pulse the 193 nm photons were illuminated for a period of 10 nS. The laser power was measured to be 18.8 mW.

Example 1—Preparation of Anti-Scattering Compounds

In general, a resist composition of the invention (e.g. photoresist) may be produced by forming a composition that includes an anti-scattering compound as defined herein. Suitably the composition also comprises a coating solvent to enable the anti-scattering compound to be applied as a resist coating.

Since the anti-scattering compound suitably includes a low-density, high molecular weight polymetallic cage (since such structures produce less scattering owing to the amount of empty space within such cage structures), any polymetallic cage may be used to obtain the relevant beneficial effect. By way of guidance to the skilled person, suitable structures may include any polymetallic cage complexes the same or similar to those disclosed in G. F. S. Whitehead, F. Moro, G. A. Timco, W. Wernsdorfer, S. J. Teat and R. E. P. Winpenny, "A Ring of Rings and Other Multicomponent Assemblies of Clusters", *Angew. Chem. Int. Ed.*, 2013, 52, 9932-9935. This literature described the synthesis of such polymetallic cages, and it would be straightforward for the skilled person to adapt the procedures disclosed therein to produce a wide range of potential anti-scattering compounds.

Generally, the polymetallic cages are formed by mixing the relevant inorganic salts (containing the metal(s) intended for incorporation into the cages) with the relevant ligands, typically carboxylic acids along with a fluoride salt (for example through an adaptation of the procedures disclosed in G. A. Timco et al, *Nat. Nanotechnol.* 2009, 4, 173-178). In some cases the polymetallic cages can act as a Lewis acid (i.e. capable of co-ordinatively accepting one or more electron pairs), and can be mixed with a suitable complementary Lewis base linker (e.g. pyridyl-substitute porphyrin) to produce an overall complex, suitably in which a plurality of the metal cages surrounds the linker. Alternatively, the polymetallic cages can act as a Lewis base (i.e. capable of co-ordinatively donating one or more electron pairs), suitably by virtue of basic moieties present within one or more of the associated ligands of the cage, and can be mixed with a suitable complementary lewis acid linker (e.g. optionally another metal-centered cage structure which is either Lewis acidic or has substitutable ligands). Suitably the Lewis acid and Lewis base components of the anti-scattering compound may be mixed in a stoichiometric ratio that produces a linker surrounded by a desired number of primary metal complexes.

Moreover, co-pending International Patent Application No. PCT/GB2015/052204 (Filed 30 Jul. 2015), which is hereby incorporated by reference, discloses a wide range of suitable polymetallic cage compounds.

By way of Example, $[H_2NR_2][Cr_7NiF_8(2\text{-Methyl-4-pentenoate})_{16}]$ metal cage complex is produced by co-mixing 28 mole equivalents of chromium (III) fluoride with 2.7 mole equivalent of nickel (II) inorganic salt and 137 mole equivalents of 2-Methyl-4-pentenoic acid in the presence of 11 mole equivalents of a secondary amine, suitably di-propylamine. A modification of the procedure disclosed in F. K. Larsen et al., Synthesis and Characterisation of Heterometallic {Cr$_7$M} Wheels, *Angew. Chem. Int. Ed.* 42, 101-105 (2003).

Example 1A—Preparation of Metal Cage Complex $[H_2NPr_2][Cr_7NiF_8(2\text{-Methyl-4-pentenoate})_{16}]$ The primary metal complex, $[H_2NR_2][Cr_7NiF_8(2\text{-Methyl-4-pentenoate})_{16}]$ metal cage complex, can be produced by co-mixing 28 mole equivalents of chromium (III) fluoride with 2.7 mole equivalent of nickel (II) inorganic salt and 137 mole equivalents of 2-Methyl-4-pentenoic acid in the presence of 11 mole equivalents of a secondary amine, suitably di-propylamine. A modification of the procedure disclosed in F. K. Larsen et al., Synthesis and Characterisation of Heterometallic {Cr$_7$M} Wheels, *Angew. Chem. Int. Ed.* 42, 101-105 (2003). The mixture is heated with stirring at 140° C. for 5 h, during which time chromium fluoride dissolved and a green crystalline product formed. The flask was cooled to room temperature and 50 ml of acetone added with stirring. The crystalline product was filtered, washed with a large quantity of acetone, dried in air and recrystallized from toluene to give $[H_2NPr_2][Cr_7NiF_8(2\text{-Methyl-4-pentenoate})_{16}]$.

Elemental analysis (%): calcd for $C_{102}H_{160}Cr_7F_8NNiO_{32}$: Cr 14.63, Ni 2.36, C 49.26, H 6.48, N 0.56. found: Cr 14.51, Ni 2.07, C 49.41, H 6.79, N 0.50. ESI-MS (sample dissolved in THF, run in MeOH): m/z: 2487[M+H]$^+$; 2509 [M+Na]$^+$.

The Cr$_7$Ni(2-Methyl-4-pentenoate)$_{16}$ metal cage complex, which suitably acts as a Lewis acid, may optionally be mixed with a variety of Lewis base linker components (e.g. a central electron-donating hub) to produce various antiscattering compounds of different molecular weight, density, and mean ionisation potential. The mixture is then concentrated to afford the final anti-scattering compound, which includes a relevant linker (e.g. porphyrin) surrounded by a number of the metal cages. However, in the present case, Lewis base linkers were not used, and instead the resist compositions tested thus far have been primary metal complexes. However, the principles and benefits can be readily extrapolated.

$[(C_3H_7)_2NH_2Cr_7NiF_8(4\text{-pentenoate})_{16}]$: CrF$_3$.4H$_2$O (3.0 g, 16.5 mmol), [2NiCO$_3$.3Ni(OH)$_2$.4H$_2$O] (0.4 g, 6.8 mmol), dipropylamine (0.7 g, 6.9 mmol) and 4-pentenoic acid (15.0 g, 150.0 mmol) were heated with stirring at 120° C. for 20 h. During this time chromium fluoride dissolved and a green crystalline product formed. The flask was cooled to room temperature and 50 ml of water/acetonitrile (9/1) was added with stirring. The crystalline product was filtered, washed with a large quantity of water/acetonitrile (9/1), and the obtained oily product was stirred overnight with a solution of 10 g of potassium carbonate dissolved in 600 mL of water. The precipitated was collected by filtration, washed with water, dried in air and purified by flash chromatography using hexane:dichloromethane 1:1 up to 1:4 afforded the green product. Yield: 2.14 g (40%). Elemental analysis (%): calcd for $C_{86}H_{128}Cr_7F_8NNiO_{32}$: Cr 16.09, Ni 2.59, C 45.66, H 5.70, N 0.62. found: Cr 15.81, Ni 2.29, C 45.95, H 5.99, N 0.53. ESI-MS (sample dissolved in THF, run in MeOH): m/z: 2266[M+H]$^+$; 2288 [M+Na]$^+$.

Example 1B—Preparation of Metal Cage Complex $[H_2NPr_2][Cr_7NiF_8(2\text{-Methyl-4-pentenoate})_{16}]$ with a Central Diallylamine Molecule $[(C_3H_5)_2NH_2Cr_7NiF_8(2\text{-Methyl-4-pentenoate})_{16}]$ CrF$_3$.4H$_2$O (3.0 g, 16.5 mmol), [2NiCO$_3$.3Ni(OH)$_2$.4H$_2$O] (0.4 g, 6.8 mmol), diallylamine (0.7 g, 7.2 mmol) and 2-Methyl-4-pentenoic acid (15.0 g, 131.5 mmol) were heated with stirring at 140° C. for 14 h. During this time chromium fluoride dissolved and a green crystalline product formed. The flask was cooled to room temperature and 50 ml of water/acetonitrile (1/1) was added with stirring. The crystalline product was filtered, washed with a large quantity of acetonitrile/water (1/1), and the obtained oily product was stirred overnight with a solution of 15 g of potassium carbonate dissolved in 600 mL of water. The precipitated was collected by filtration, washed with water and acetonitrile, dried in air and purified by flash chromatography using dichlomethane:diethyl ether (Et$_2$O) 10:1 up to 5:1 afforded the green product. Yield: 2.06 g (35%). Elemental analysis (%): calcd for $C_{102}H_{156}Cr_7F_8NNiO_{32}$: Cr 14.66, Ni 2.36, C 49.34, H 6.33, N 0.56. found: Cr 14.30, Ni 2.11, C 49.61, H 6.59, N 0.49. ESI-MS (sample dissolved in THF, run in MeOH): m/z: 2483[M+H]$^+$; 2505 [M+Na]$^+$.

Example 2—Preparation of Resist Compositions

The anti-scattering compounds of Examples 1A and 1B may be considered antiscattering-resist hybrid compounds, since they incorporate both an anti-scattering component (i.e. the overall low-density metal cage compound) and resist components (i.e. 2-Methyl-4-pentenoate resist ligands which bear terminal alkene groups which are cross-linkable).

As such, various resist compositions were formed and tested for effectiveness.

Figure 13:
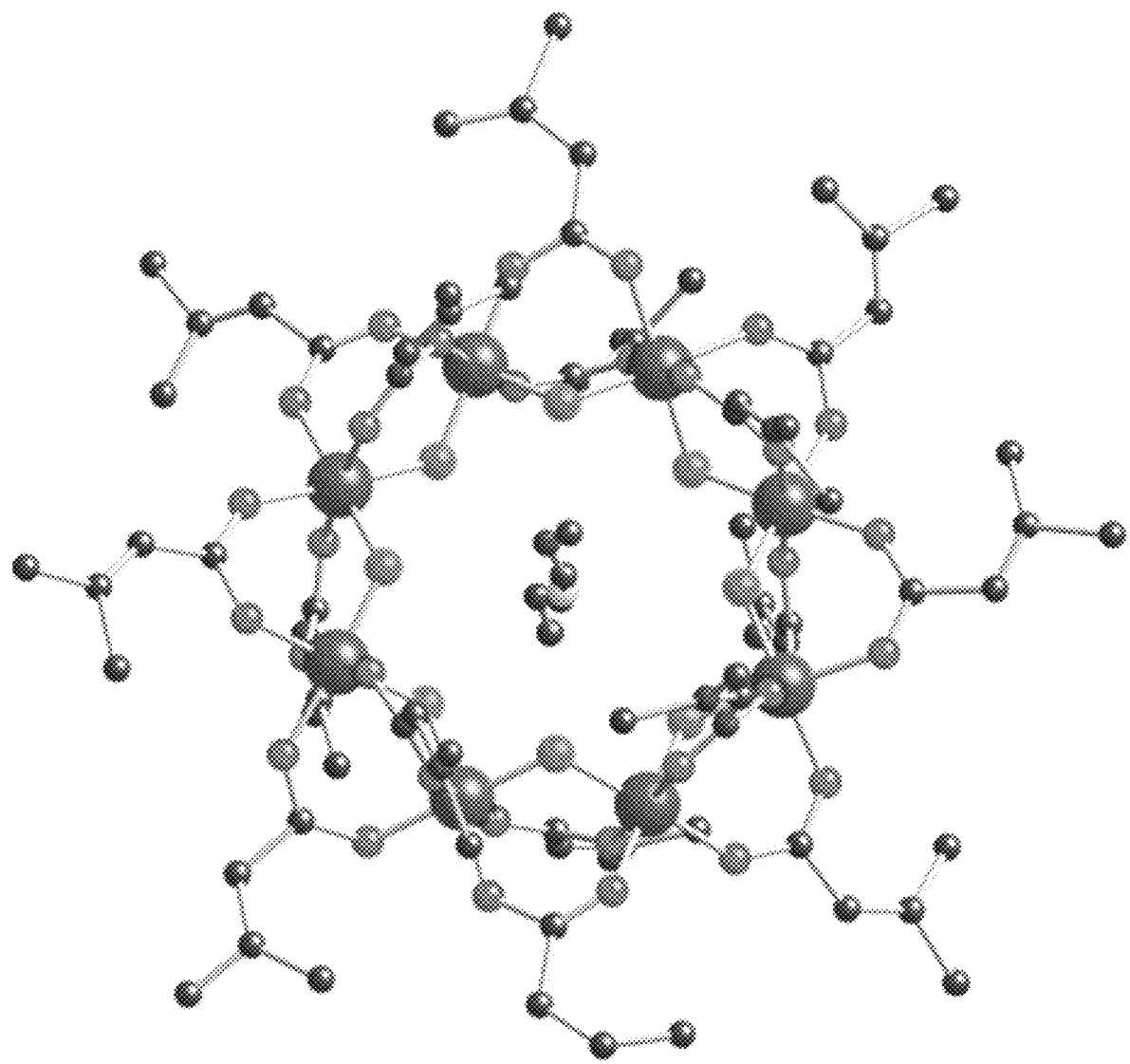
FIG. 13 is a 3-dimensional ball and stick representation of $Cr_7Ni$-based complex.

| Cr₇Ni base structure (see FIG. 13) | Where R is 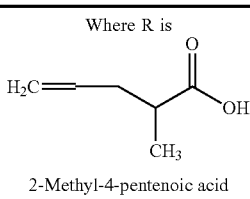 2-Methyl-4-pentenoic acid | 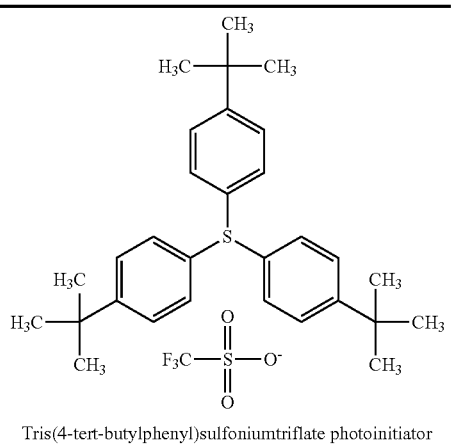 Tris(4-tert-butylphenyl)sulfoniumtriflate photoinitiator |

Example 2A(i) and (ii)—Formulation A (Cr₇Ni/2-Methyl-4-pentenoate Complex+Sulfoniumtriflate)

Formulations A(i) and (ii) were prepared using the antiscattering-resist hybrid compound of Example 1A, one without the Tris(4-tert-butylphenyl)sulfoniumtriflate (A(i)) and another with the Tris(4-tert-butylphenyl)sulfoniumtriflate (A(ii)).

To form the resist composition, 20 mg antiscattering-resist hybrid compound of Example 1A is dissolved in 1 g of tert butyl methyl ether (MTBE) and filtered through a 0.2 μm PTFE filter to yield Formulation A(i).

To produce Formulation A(ii), in a separate vessel, 4 mg of Tris(4-tert-butylphenyl)sulfoniumtriflate (a common photoacid generator and photoinitiator) is dissolved in 8 g of Acetone and filtered through a 0.2 μm PTFE filter. Finally, 100 mg of the Tris(4-tert-butylphenyl)sulfoniumtriflate/Acetone product is introduced into the solution of Cr₇Ni antiscattering-resist hybrid compound to yield Formulation A(ii).

Example 2B—Formulation 8 (Cr₇M/2-Methyl-4-pentenoate/diallylamine Complex)

Formulation B was prepared using the antiscattering-resist hybrid compound of Example 1B.

To form the resist composition, 15 mg antiscattering-resist hybrid compound of Example 1B is dissolved in 1 g of tert butyl methyl ether (MTBE) and filtered through a 0.2 μm PTFE filter.

Example 2C—Formulation C (Cr₇Ni/2-Methyl-4-pentenoate/Diallylamine Complex Diethoxyacetophenone Photoinitiator)

Formulation C was prepared using the antiscattering-resist hybrid compound of Example 1B.

To form the resist composition, 15 mg antiscattering-resist hybrid compound of Example 1B is dissolved in 1 g of tert butyl methyl ether (MTBE) along with 50 μg of 2,2-diethoxyacetophenone, and filtered through a 0.2 μm PTFE filter.

Example 2D—Formulation D (Cr₇Ni/2-Methyl-4-pentenoate/Diallylamine Complex+Diethoxyacetophenone Photoinitiator+Further Diallylamine or N,N Methylenebisacrylamide (Bis-AMD))

Formulation D was prepared using the antiscattering-resist hybrid compound of Example 1B.

To form the resist composition, 15 mg antiscattering-resist hybrid compound of Example 1B is dissolved in 1 g of tert butyl methyl ether (MTBE) along with 50 μg of 2,2-diethoxyacetophenone, and 4 mg of Diallylamine or N,N methylenebisacrylamide (bis-AMD), before being filtered through a 0.2 μm PTFE filter.

Example 2E—Formulation E (Cr₇Ni/2-Methyl-4-pentenoate/Diallylamine Complex Diethoxyacetophenone Photoinitiator+Diallylamine or N,N Methylenebisacrylamide (Bis-AMD)

Formulation E was prepared using the antiscattering-resist hybrid compound of Example 1B.

To form the resist composition, 15 mg antiscattering-resist hybrid compound of Example 1B is dissolved in 1 g of tert butyl methyl ether (MTBE) along with 50 μg of 2,2-diethoxyacetophenone, and 1 mg of Pentraerythritol tetraacrylate (PET), before being filtered through a 0.2 μm PTFE filter.

Example 2F—Formulation F (Cr₇M/2-Methyl-4-pentenoate/diallylamine Complex+Sulfoniumtriflate)

Formulation F was prepared using the antiscattering-resist hybrid compound of Example 1B.

To form the resist composition, 15 mg antiscattering-resist hybrid compound of Example 1A is dissolved in 1 g of tert butyl methyl ether (MTBE), along with 50 μg of Tris(4-tert-butylphenyl)sulfoniumtriflate, before being filtered through a 0.2 μm PTFE filter.

Example 2G—Formulation G (Cr₇M/2-Methyl-4-pentenoate/diallylamine Complex+Sulfoniumtriflate)

Formulation G was prepared using the antiscattering-resist hybrid compound of Example 1B.

To form the resist composition, 15 mg antiscattering-resist hybrid compound of Example 1B is dissolved in 1 g of tert butyl methyl ether (MTBE), along with 50 μg of Tris(4-tert-butylphenyl)sulfoniumtriflate, and 4 mg of DiAllylamine or N,N methylenebisacrylamide (bis-AMD), before being filtered through a 0.2 μm PTFE filter.

Example 2H—Formulation H (Cr₇M/2-Methyl-4-pentenoate/diallylamine Complex+Sulfoniumtriflate)

Formulation H was prepared using the antiscattering-resist hybrid compound of Example 1B.

To form the resist composition, 15 mg antiscattering-resist hybrid compound of Example 1B is dissolved in 1 g of tert butyl methyl ether (MTBE), along with 50 µg of Tris(4-tert-butylphenyl)sulfoniumtriflate, and 1 mg of Pentraerythritol tetraacrylate, before being filtered through a 0.2 µm PTFE filter.

Example 3—Preparation of Resist-Coated Substrates

Each of the aforementioned Example resist compositions 2A-2H were spun onto 10 mm×10 mm silicon substrates. Each resist composition was spun using a spin cycle of 8000 rpm for 60 seconds, which was followed by a soft-bake at 100° C. for 2 minutes, allowing the cast solvent to evaporate. The resist film resulted with a thickness of 100 nm. The resist films were exposed with 248 and 193 nm radiation through a Silver optical mask which consisted of 250 and 200 nm features. Each material was developed using a solution of Hexane, for 30 s followed by an $N_2$ blow dry.

Results and Discussion

FIG. 1 shows a graph illustrating how radiation-absorption varies with incident wavelength for each of Formulations A(i) (i.e. $Cr_7Ni$ metal complex only) and Formulation A(ii) ($Cr_7Ni$ complex+photoacid generator).

It is evident from FIG. 1 that, at a wavelength of 248 nm (suitable for photolithography), the $Cr_7Ni$ ring molecule alone absorbs approximately 0.5% of the total amount of radiation available, whereas in combination with the photoacid generator it absorbs approximately 2% of the available radiation. As such, the photoacid generator appears to impart 4 times the efficiency efficient, based on its absorption spectrum, even at the ultra-low concentrations of the photoacid generator used (i.e. 400 times less by weight than the $Cr_7Ni$ ring molecule). This was seen as promising, since using very low concentrations of PAG or photoinitiator would improve resulting resolution by reducing proximity effects.

Figure 2:
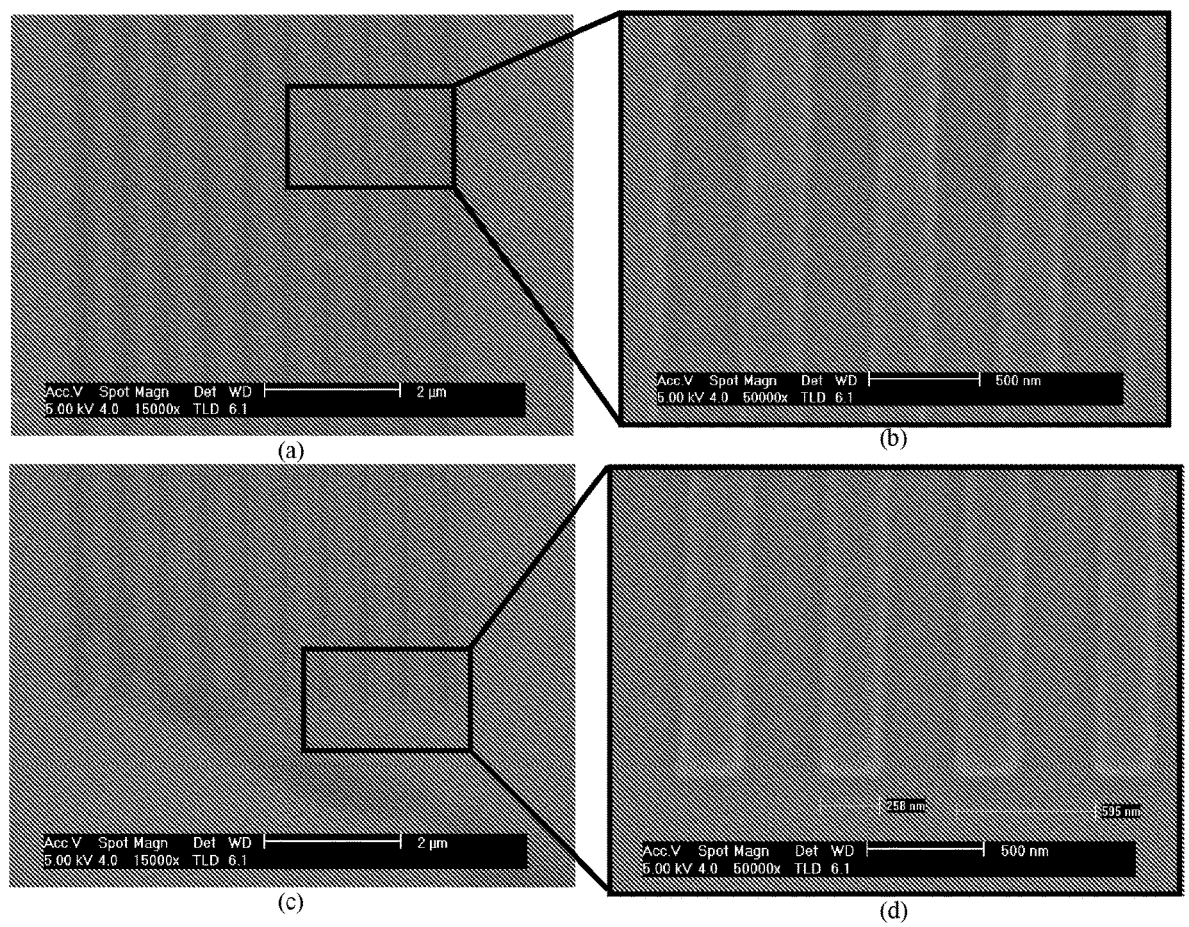
FIG. 2 shows SEM images of post-developed resist coatings based on resist compositions of Example 2A(i) and 2A(ii): (a) 250 nm nanostructures with a pitch of 600 nm produced at a wavelength of 248 nm using Formulation A(i); (b) Close up of the nanostructures that were produced in (a, indicated by the black box) using Formulation A(i). (c) 250 nm nanostructures that were fabricated using the PAG using Formulation A(ii), (d) Close up of the nanostructures that were produced in (c, indicated by the black box) using Formulation A(ii).

FIG. 2 shows SEM images of post-developed resist coatings based on resist compositions of Example 2A(i) and 2A(ii): (a) 250 nm nanostructures with a pitch of 600 nm produced at a wavelength of 248 nm using Formulation A(i); (b) Close up of the nanostructures that were produced in (a, indicated by the black box) using Formulation A(i). (c) 250 nm nanostructures that were fabricated using the PAG using Formulation A(ii), (d) Close up of the nanostructures that were produced in (c, indicated by the black box) using Formulation A(ii).

These nanostructures were produced using an extremely low exposure dose of (3.29 mJ/cm² for Formulation A(i)), thus suggestive of a highly sensitive resist composition. It is thought that such high sensitives arise from the periphery of the metal cage compounds being essentially saturated with 16 cross-linkable alkene groups. Thus the probability of fruitful photon collisions is high as it is 45.6% of the total molecule and thus, creating a condition for the $Cr_7Ni$ ring molecules to cross link to each other, hence, forming a polymerization process.

Likewise, photosensitivity was also evidently very high for Formulations A(ii) (with the PAG—2.4 mJ/cm²). Thus adding the PAG apparently reduced the exposure time (and thus increased photosensitivity) by a factor of 1.37. This is, however, lower than expected in view of the absorption coefficients shown in FIG. 1. Thus it was concluded that even without a photoinitiator or photoacid, the resist compositions of the invention delivered high sensitivity and high resolutions.

Figure 3:
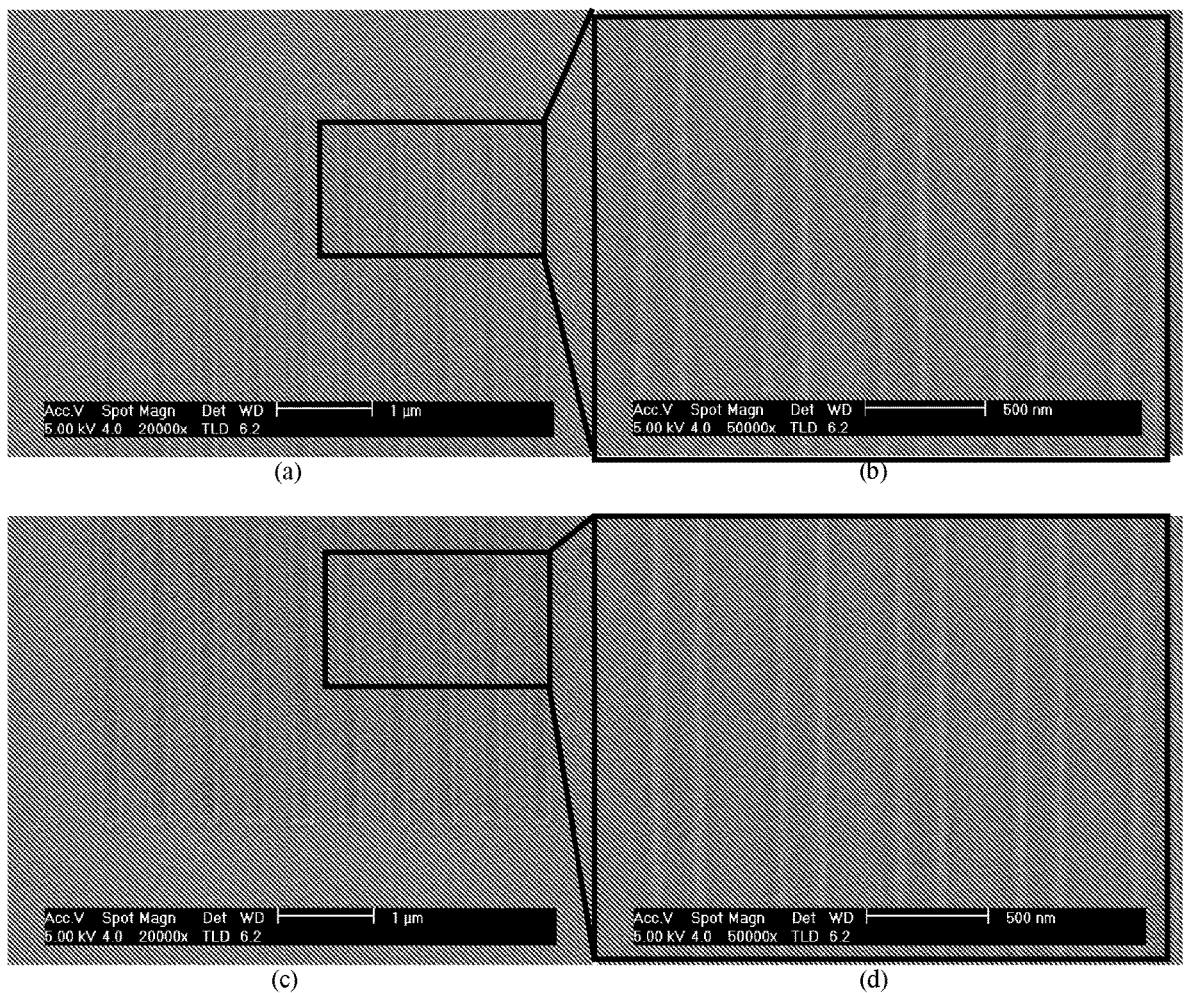
FIG. 3 shows SEM images of post-developed resist coatings based on resist compositions of Example 2A(i) and 2A(ii): (a) SEM image of 200 nm nanostructures produced using Formulation A(i) at a wavelength of 193 nm, (b) Close up of the nanostructures that were produced in (a, indicated by the black box) using Formulation A(i). (c) 200 nm nanostructures that were fabricated using the PAG (i.e. Formulation A(ii)), (d) Close up of the nanostructures that were produced in (c, indicated by the black box) using Formulation A(ii).

FIG. 3 shows SEM images of post-developed resist coatings based on resist compositions of Example 2A(i) and 2A(ii): (a) SEM image of 200 nm nanostructures produced using Formulation A(i) at a wavelength of 193 nm, (b) Close up of the nanostructures that were produced in (a, indicated by the black box) using Formulation A(i). (c) 200 nm nanostructures that were fabricated using the PAG (i.e. Formulation A(ii)), (d) Close up of the nanostructures that were produced in (c, indicated by the black box) using Formulation A(ii).

The nanostructures of FIGS. 3(a) and (b) (i.e. without the PAG) were produced using an exposure dose of 4.6 mJ/cm², which again represented extremely impressive sensitivity.

The nanostructures of FIGS. 3(c) and (d) (i.e. with the PAG) were produced using an exposure dose of 3.4 mJ/cm², which again represented extremely impressive sensitivity.

Again, the resist composition of Formulation A(ii) (with the PAG) appears 1.35 more sensitive than without the PAG (i.e. Formulation A(i)). Comparatively, therefore, the CrNi ring per se appears to be more sensitive at the radiation wavelength of 248 nm.

Due to that the 193 nm photons are larger than the molecule, the interaction is small but it is because there are approximately $10^{14}$ molecules per unit volume they can scatter the light in arbitrary directions (this is called Mie scattering). It is this mechanism that defines the sensitivity and resolution. This is because the density of the molecule is 1.6 g/cm³ (which is low from a photon scattering perspective, and high density parts of the molecule are actually constituted by the groups that photons should be absorbed by) and its molecular weight is large (2501 g/mol). From this, most of the film is free space and as a consequence the photons are constrained due to that the scattering interaction is small, therefore lateral scattering is prohibited. Hence, a greater resolution could be achieved.

Figure 4:
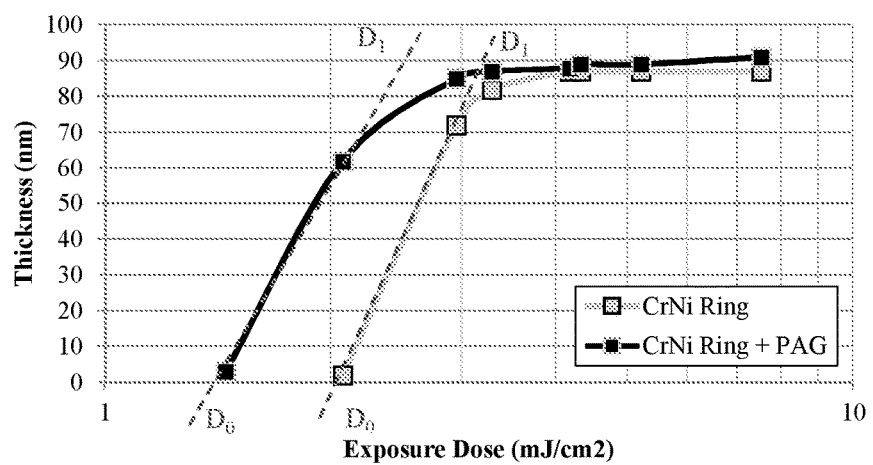
FIG. 4 shows the contrast curve for the Cr7Ni ring molecule after it has been exposed at the 248 nm wavelength.
Figure 6:
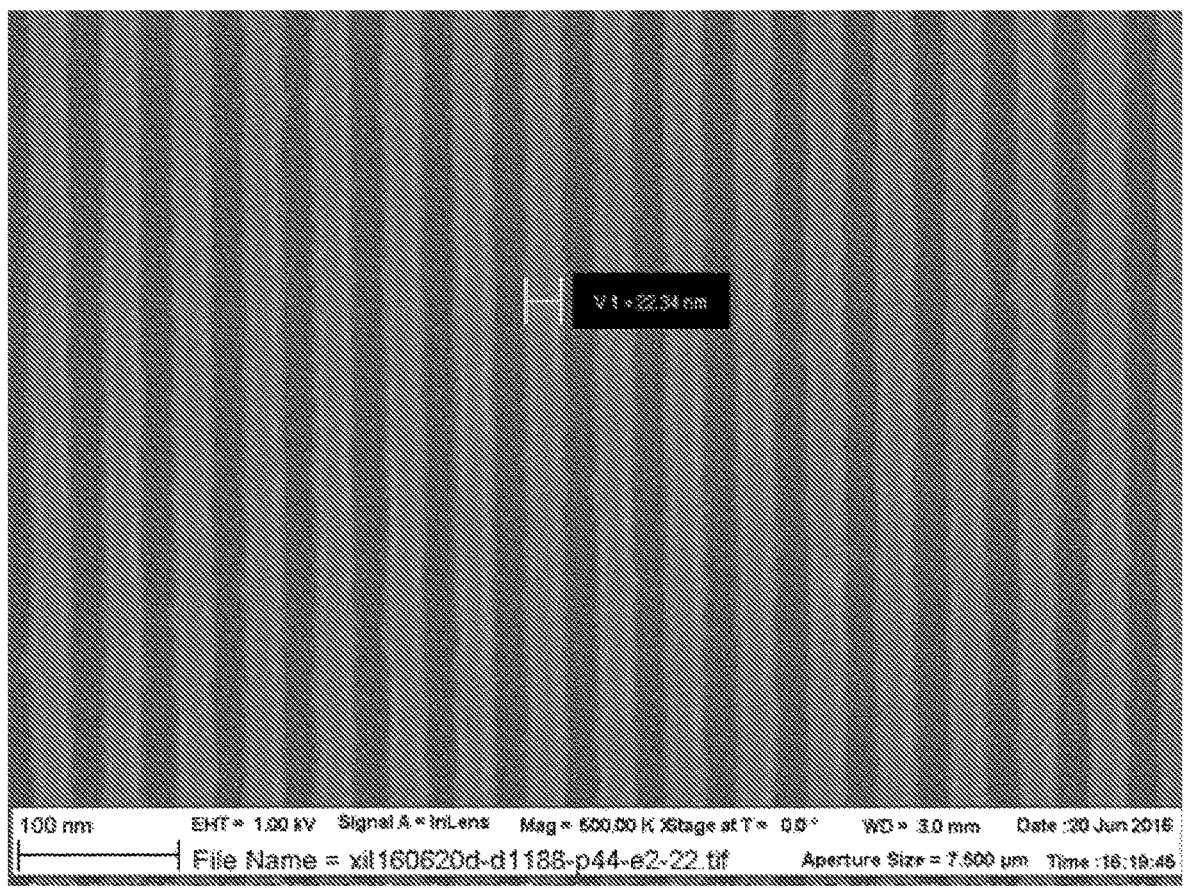
FIG. 6 shows a magnified view of a post-developed/dried resist-coated substrate based on compound 3 ($HgCl_2$-derived) exposed to EUV at an exposure dose of 396 mJ/cm$^2$ to yield a feature width of approximately 22 nm and pitch of approximately 44 nm.

FIG. 4 shows the contrast curve for the $Cr_7Ni$ ring molecule after it has been exposed at the 248 nm wavelength. It can be seen that the material produces a contrast of 5.67 and found by the following equation:

$$\frac{1}{\gamma} = \log_{10}\frac{D_1}{D_0}$$

where the values for $D_1$ was 3 and for $D_0$ it was 2 can be found in FIG. 6. When the PAG was added the values for $D_1$ was 2.3 and for $D_0$ it was 1.45. This gave a contrast of 4.99. Therefore, the introduction of the PAG produced very little affect on the contrast.

Figure 5:
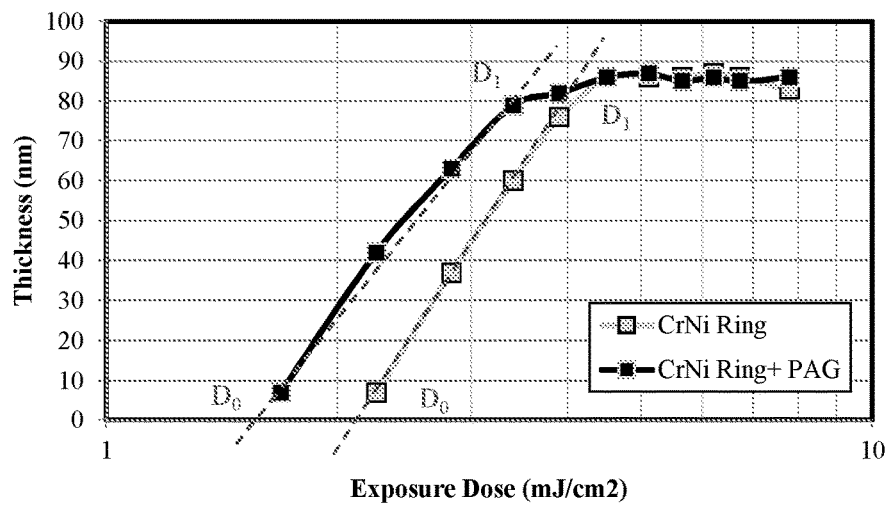
FIG. 5 shows the contrast curve for the Cr7Ni ring molecule after it has been exposed at the 193 nm wavelength.

FIG. 5 shows the contrast curve for the $Cr_7Ni$ ring molecule after it has been exposed at the 193 nm wavelength. It can be seen that the material produces a contrast of 3.15. When the PAG was added to the CrNi Ring molecule, this gave a contrast of 2.86. Therefore, the introduction of the PAG produced very little affect on the contrast.

CONCLUSIONS

A novel resist system based on polymetallic cage compounds, such as $Cr_7Ni$ complexes, containing cross-linkable or polymerizable alkene-containing ligands, has been developed. This resist system has demonstrated 250 and 200 nm nanostructures when irradiated with 248 and 193 nm radiation respectively. Both exposures exhibited extraordinary sensitivities of 3.29 and 4.6 mJ/cm², whilst having a contrast of 4.64 and 3.15 (248 and 193 nm respectively). If was found that by introducing the PAG to the CrNi ring molecule the sensitivity was increased by a factor of 1.3, however, the contrast had decreased to 4.99 and 2.86 respectively. The sensitivity is clearly due to that the $Cr_7Ni$ ring molecule having so many cross-linkable moieties (i.e. 16 alkene groups associated to the outside of the molecule), which is effective for the polymerization process to occur. Thus there is a 45.6% probability of a creating the cross linking conditions for the $Cr_7Ni$ ring molecules to cross link to each other. The alkene content could be easily adapted to adjust sensitivity.

Without wishing to be bound by theory, it is believed that photolytically-induced cross-linking occurs between neighbouring alkene groups as a result of initial electronic excitation (~3.6 eV) causing a π-bond of one alkene to break (e.g. following a π→π* single-electron transition) followed by a radical reaction with a neighbouring alkene (which may be unexcited). Such π→π* transitions and subsequent reactions could in principle lead to a cascade of reactions, depending on various factors (e.g. steric effects, electron transfer properties of surrounding groups, kinetics of termination reactions, photoemission, etc.). Though the presence of a photoinitiator or photoacid may, under certain circumstances, improve sensitivity, resist compositions of the invention need not contain such photosensitive compounds, especially where the relevant resist component is inherently already sufficiently photolytically reactive.

The principles underlying the improvements in exposure control afforded by the anti-scattering compounds is equally applicable to resist compositions where the resist component is not itself bonded to the anti-scattering compound. In view of the teachings presented herein, the skilled person is now able to make judicious adjustments and choices to enable the production of resist compositions that benefit from the principles underlying the invention.

Example 4—Preparation of Further Resist Compositions Containing Secondary Electron Generator and Testing Using Extreme Ultraviolet (eUV) Radiation Synthesis of $[C_6H_{10}NH_2][Cr_7NiF_8(O_2C^tBu)_{15}(O_2CC_5H_4N)]$ (Compound 1) and $[C_6H_{10}NH_2][Cr_7NiF_8(O_2C^tBu)_{14}(O_2CC_5H_4N)_2]$ (Compound 2)

$[C_6H_{10}NH_2][Cr_7NiF_8(O_2C^tBu)_{16}]$ (4.3 g, 1.78 mmol) (which may be obtained by a simple adaptation of the procedures used in Examples 1), iso-nicotinic acid (0.68 g, 5.34 mmol) and n-propanol (100 mL) were refluxed for 24 h with constant stirring. The resulting solution was cooled to room temperature and filtered. The solvent from the filtrate was removed under reduced pressure and extracted in diethyl ether (100 mL). The obtained solution was filtered and the diethyl ether was removed under reduced pressure leaving a solid. Flash chromatography with toluene/ethyl acetate (97/3) afforded product 1, then gradient elution up to toluene/ethyl acetate (50/50) afforded the product 2, both as green solids after evaporation of the solvent mixtures.

1 Yield: 4.89 g (32%). Elemental analysis (%) calcd for $C_{87}H_{151}Cr_7F_8N_2NiO_{32}$: Cr 15.72, Ni 2.53, C 45.12, H 6.75, N 1.21; found: Cr 15.97, Ni 2.56, C 44.90, H 6.90, N 1.19. ES-MS (sample dissolved in THF, run in MeOH): m/z=2334 $[M+Na]^+$; 2312 $[M+H]^+$.

2 Yield: 1.62 g (10%). Elemental analysis (%) calcd for $C_{88}H_{146}Cr_7F_8N_3NiO_{32}$: Cr 15.60, Ni 2.52, C 45.31, H 6.31, N 1.80. found: Cr 15.56, Ni 2.39, C 45.56, H 6.77, N 1.82. ES-MS (sample dissolved in THF, run in MeOH): m/z=2355 $[M+Na]^+$; 2333 $[M+H]^+$.

Co-Ordination with Mercury Chloride:

Synthesis of $[C_6H_{10}NH_2][Cr_7NiF_8(O_2CC_2H_5)_{15}(O_2CC_5H_4N).HgCl]$ (Compound 3)

Compound 1 (100 mg, 0.04 mmol) was dissolved in hot acetone (10 mL). A solution of mercury chloride (11.7 mg, 0.04 mmol) in acetone (2 mL) was added dropwise and the green solution was stirred at 50° C. for 1 hour. The solution was cooled to room temperature and concentrated. A green microcrystalline powder 3 was obtained. Elemental analysis (%) calcd for $C_{87}H_{151}Cr_7F_8N_2NiO_{32}HgCl$: Cr 14.29, Ni 2.30, C 41.02, H 5.97, N 1.10; found: Cr 14.22, Ni 2.28, C 41.10, H 5.99, N 1.16.

Synthesis of $[C_6H_{10}NH_2][Cr_7NiF_8(O_2CC_2H_5)_{14}(O_2CC_5H_4N)_2.2HgCl]$ (Compound 4)

Compound 2 (100 mg, 0.04 mmol) was dissolved in hot acetone (10 mL). A solution of mercury chloride (23.1 mg, 0.08 mmol) in acetone (2 mL) was added dropwise and the green solution was stirred at 50° C. for 1 hour. The solution was cooled to room temperature and concentrated. A green microcrystalline powder 4 was obtained. Elemental analysis (%) calcd for $C_{88}H_{146}Cr_7F_8N_3NiO_{32}Hg_2Cl_4$: Cr 12.66, Ni 2.04, C 36.76, H 5.12, N 1.46; found: Cr 12.80, Ni 2.09, C 36.96, H 5.21, N 1.46.

Co-Ordination with Mercury Iodide:

Synthesis of $[C_6H_{10}NH_2][Cr_7NiF_8(O_2CC_2H_5)_{15}(O_2CC_5H_4N).HgI]$ (Compound 5)

Compound 1 (100 mq, 0.04 mmol) was dissolved in hot acetone (10 mL). A solution of mercury iodide (19.4 mq, 0.04 mmol) in acetone/tetrahydrofuran (1.5 mL/0.5 mL) was added dropwise and the green solution was stirred at 50° C. for 1 hour. The solution was cooled to room temperature and concentrated. A green microcrystalline powder 5 was obtained. Elemental analysis (%) calcd for $C_{87}H_{151}Cr_7F_8N_2NiO_{32}HgI$: Cr 13.79, Ni 2.22, C 39.59, H 5.77, N 1.06; found: Cr 13.98, Ni 2.20, C 39.92, H 5.86, N 1.10.

Synthesis of $[C_6H_{10}NH_2][Cr_7NiF_8(O_2CC_2H_5)_{14}(O_2CC_5H_4N)_2.2HgI]$ (Compound 6)

Compound 2 (100 mg, 0.04 mmol) was dissolved in hot acetone (10 mL). A solution of mercury iodide (38.9 mg, 0.08 mmol) in acetone/tetrahydrofuran (1.5 mL/0.5 mL) was added dropwise and the green solution was stirred at 50° C. for 1 hour. The solution was cooled to room temperature and concentrated. A green microcrystalline powder 6 was obtained. Elemental analysis (%) calcd for $C_{85}H_{146}Cr_7F_8N_3NiO_{32}Hg_2I_4$: Cr 11.23, Ni 1.81, C 32.61, H 4.54, N 1.30; found: Cr 11.30, Ni 1.79, C 32.76, H 4.66, N 1.19.

Formation of Resist Compositions

The resist formulations were made by dissolving 20 mg of $Cr_7Ni$ derivative (i.e. compound 3, 4, 5, and 6 above) in 5 g of tert butyl methyl ether and filter it through a 0.2 μm PTFE filter.

Spin-Coating, Exposure, and Development of Resist Compositions

The fabrication process is as follows: The resist formulations, prepared as per above, were negative tone resists. Such resist compositions were spun onto 10 mm×10 mm silicon substrates. The resist was spun using a spin cycle of 8000 rpm for 60 seconds, which was followed by a soft-bake at 100° C. for 2 minutes, allowing the cast solvent to evaporate. The resist film resulted with a thickness of 25 nm. The resist films were exposed with 13.4 nm radiation (extreme ultra violet—eUV) through an optical mask which consisted of 22 nm features with a pitch of 44 nm and 16 nm features with a pitch of 32. Each material was developed using a solution of hexane, for 30 s followed by an $N_2$ blow dry.

The experiments discussed below used resist compositions of compound 3 (mercury chloride derivative) and compound 5 (mercury iodide derivative), and exposure doses were varied.

FIG. 6 shows a magnified view of a post-developed/dried resist-coated substrate based on compound 3 ($HgCl_2$-derived) exposed to eUV at an exposure dose of 396 $mJ/cm^2$ to yield a feature width of approximately 22 nm and pitch of approximately 44 nm.

Figure 7:
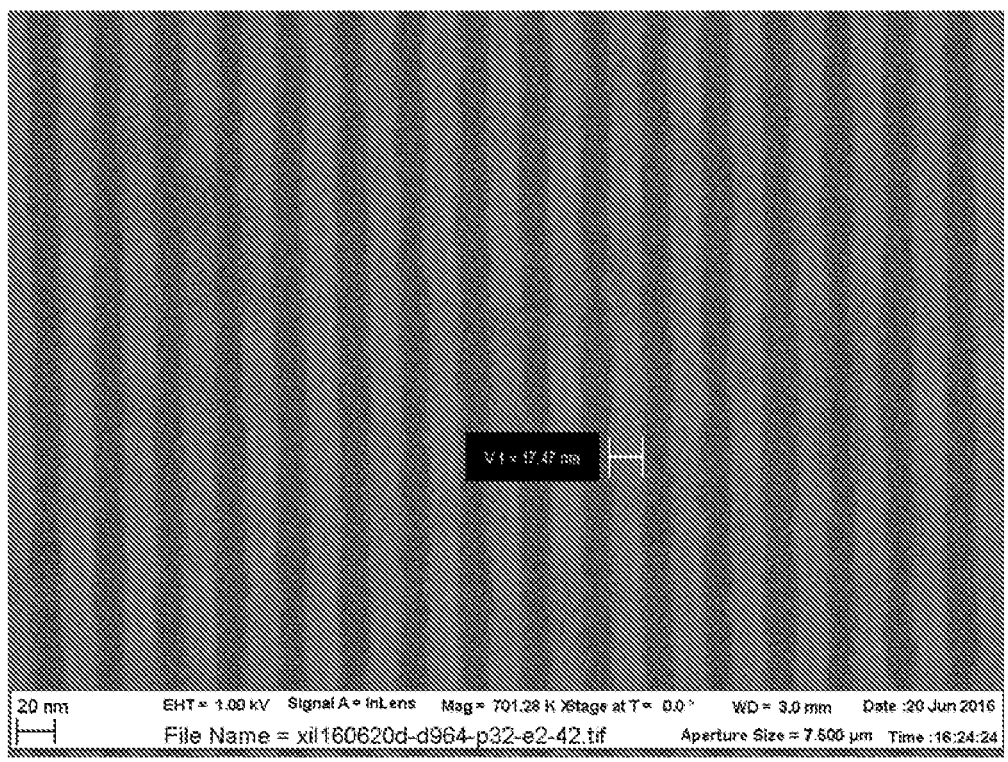
FIG. 7 shows a magnified view of a post-developed/dried resist-coated substrate based on compound 3 ($HgCl_2$-derived) exposed to eUV at an exposure dose of 322 mJ/cm$^2$ to yield a feature width of approximately 16 nm and pitch of approximately 32 nm.

FIG. 7 shows a magnified view of a post-developed/dried resist-coated substrate based on compound 3 ($HgCl_2$-derived) exposed to eUV at an exposure dose of 322 $mJ/cm^2$ to yield a feature width of approximately 16 nm and pitch of approximately 32 nm.

Figure 8:
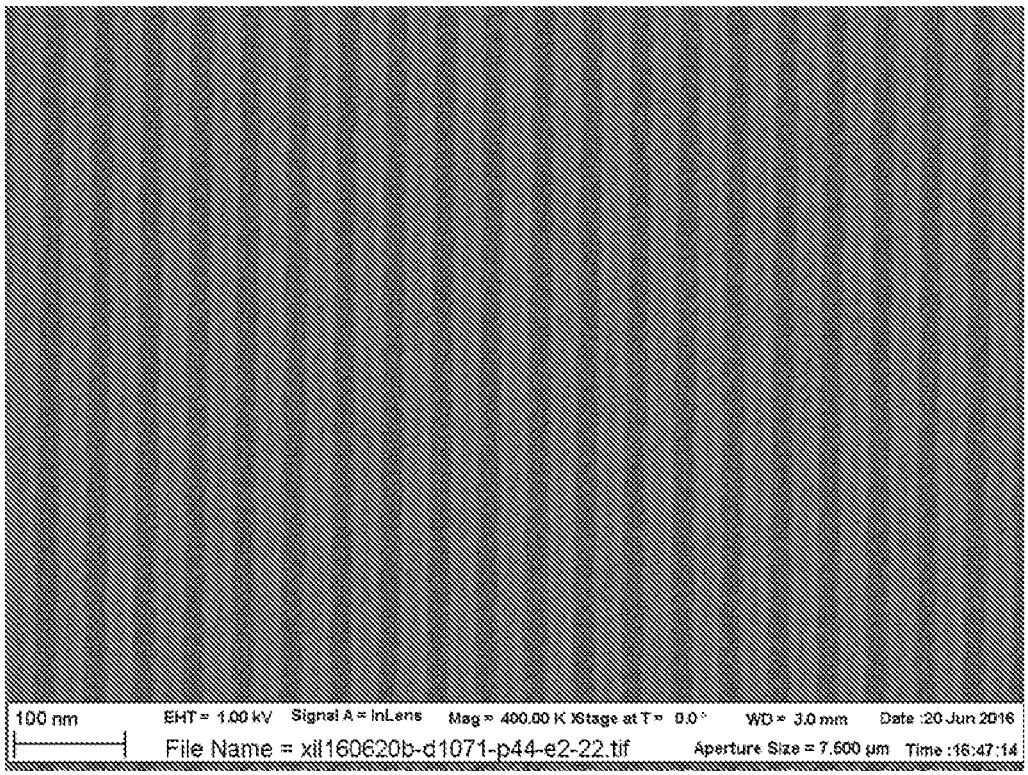
FIG. 8 shows a magnified view of a post-developed/dried resist-coated substrate based on compound 5 ($HgI_2$-derived) exposed to eUV at an exposure dose of 357 mJ/cm$^2$ to yield a feature width of approximately 22 nm and pitch of approximately 44 nm.

FIG. 8 shows a magnified view of a post-developed/dried resist-coated substrate based on compound 5 ($HgI_2$-derived) exposed to eUV at an exposure dose of 357 $mJ/cm^2$ to yield a feature width of approximately 22 nm and pitch of approximately 44 nm.

Figure 9:
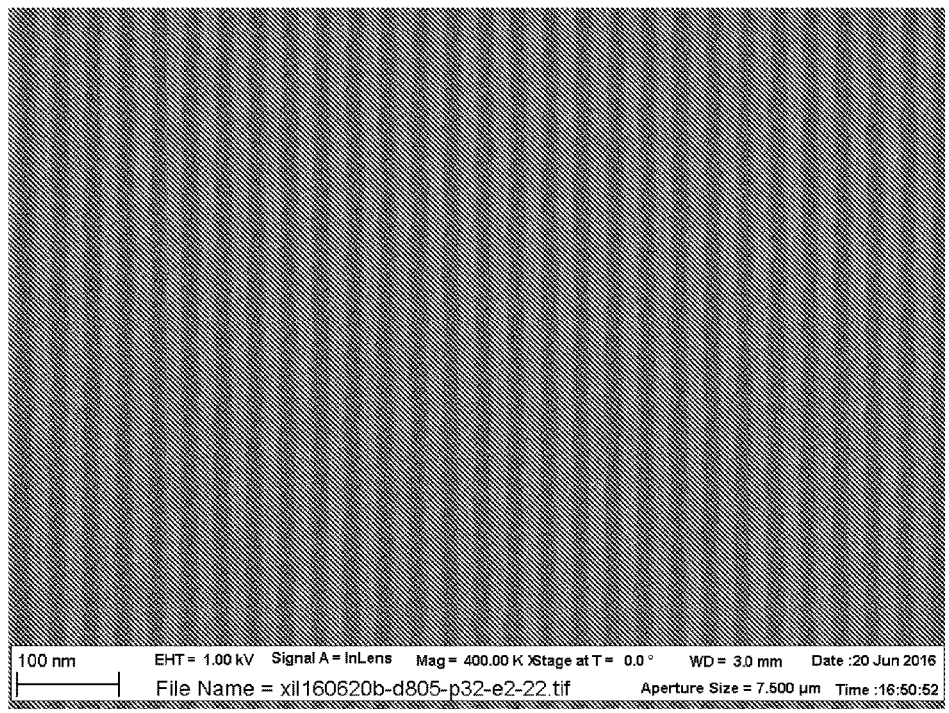
FIG. 9 shows a magnified view of a post-developed/dried resist-coated substrate based on compound 5 ($HgI_2$-derived) exposed to eUV at an exposure dose of 268 mJ/cm$^2$ to yield a feature width of approximately 16 nm and pitch of approximately 32 nm.

FIG. 9 shows a magnified view of a post-developed/dried resist-coated substrate based on compound 5 ($HgI_2$-derived) exposed to eUV at an exposure dose of 268 $mJ/cm^2$ to yield a feature width of approximately 16 nm and pitch of approximately 32 nm.

Figure 10:
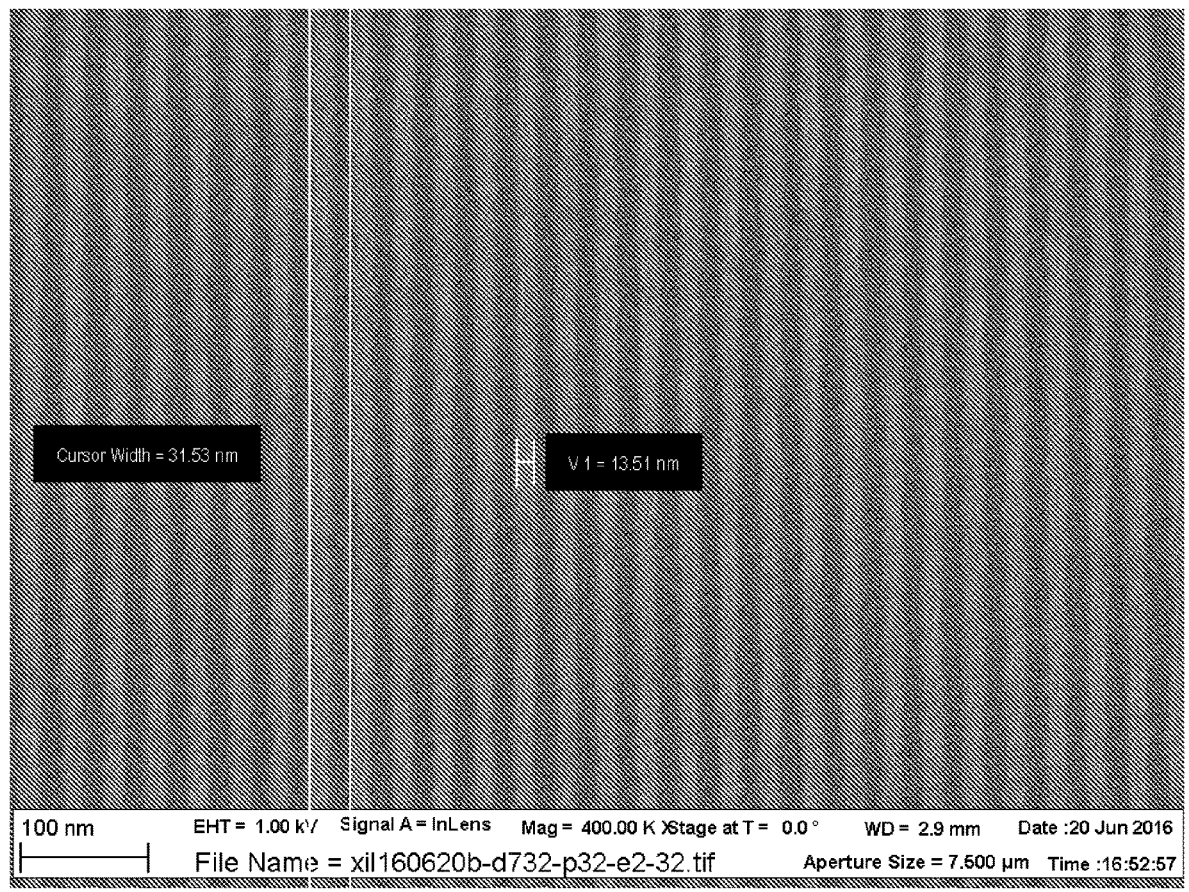
FIG. 10 shows a magnified view of a post-developed/dried resist-coated substrate based on compound 5 ($HgI_2$-derived) exposed to eUV at an exposure dose of 244 mJ/cm$^2$ to yield a feature width of approximately 13 nm and pitch of approximately 32 nm. This exposure produced optimal results under the conditions.

FIG. 10 shows a magnified view of a post-developed/dried resist-coated substrate based on compound 5 ($HgI_2$-derived) exposed to eUV at an exposure dose of 244 $mJ/cm^2$ to yield a feature width of approximately 13 nm and pitch of approximately 32 nm. This exposure produced optimal results under the conditions.

Figure 11:
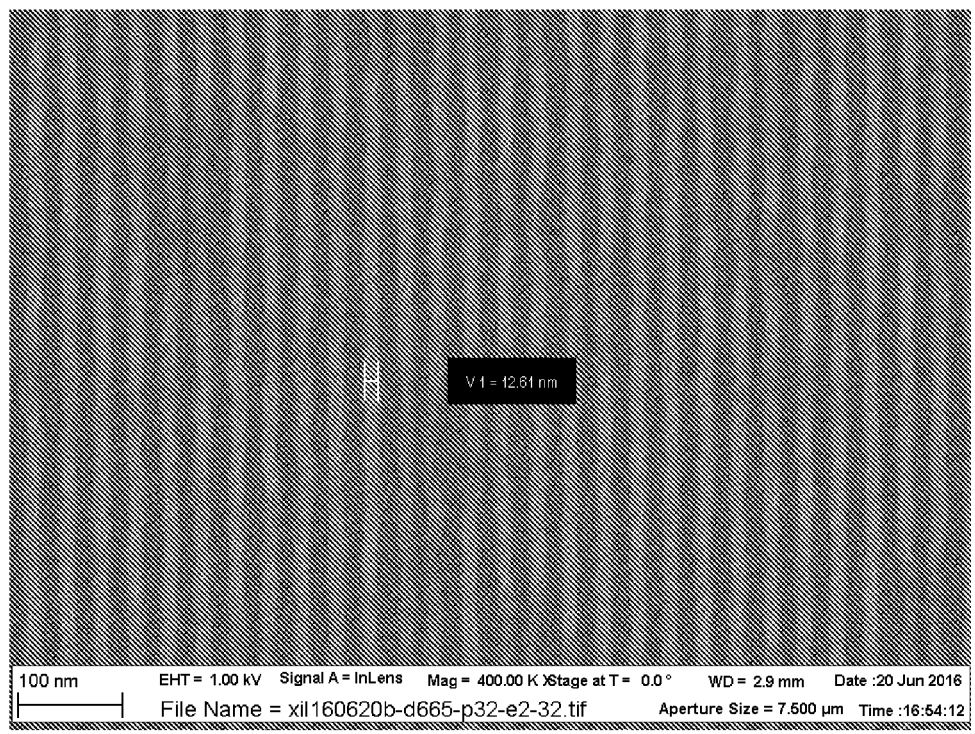
FIG. 11 shows a magnified view of a post-developed/dried resist-coated substrate based on compound 5 ($HgI_2$-derived) exposed to eUV at an exposure dose of 222 mJ/cm$^2$ to yield a feature width of approximately 13 nm and pitch of approximately 32 nm. This exposure produced optimal results under the conditions.

FIG. 11 shows a magnified view of a post-developed/dried resist-coated substrate based on compound 5 ($HgI_2$-derived) exposed to eUV at an exposure dose of 222 $mJ/cm^2$ to yield a feature width of approximately 13 nm and pitch of approximately 32 nm. This exposure produced optimal results under the conditions.

Results and Discussion

Table 1 below collates the results of the eUV experiments performed using the synthesised resist compositions.

TABLE 1

Results Summary of eUV exposure experiments

| Expt No. | Resist Cmpd | Exposure | FIG. | Comment |
|---|---|---|---|---|
| 1 | 3 | 396 $mJ/cm^2$ | 6 | Feature/Pitch = 22/44 nm; good exposure/contrast |
| 2 | 3 | 322 $mJ/cm^2$ | 7 | Feature/Pitch = 16/32 nm; good exposure/contrast |
| 3 | 5 | 357 $mJ/cm^2$ | 8 | Feature/Pitch = 22/44 nm; good exposure/contrast |
| 4 | 5 | 268 $mJ/cm^2$ | 9 | Feature/Pitch = 16/32 nm; good exposure/contrast |
| 5 | 5 | 244 $mJ/cm^2$ | 10 | Feature/Pitch = 13/32 nm; excellent exposure/contrast |
| 6 | 5 | 222 $mJ/cm^2$ | 11 | Feature/Pitch = 13/32 nm; underexposed |

Experiment 5 yielded the best results under the prevailing testing conditions—that is the mercury iodide derivative exposed at 244 $mJ/cm^2$. The line edge roughness (LER) in some of the exposures is due to quality limitations imposed by the photomask.

The incorporation of secondary electron generators such as $HgCl_2$ and/or $HgI_2$ improved the sensitivities of the resists without compromising resolution. For instance, the inventors have found that using $HgI_2$ improves sensitivity by at least ×1.32 compared to equivalent formulations without $HgI_2$. This is reflected in the lower exposure doses required during exposure.

Figure 12:
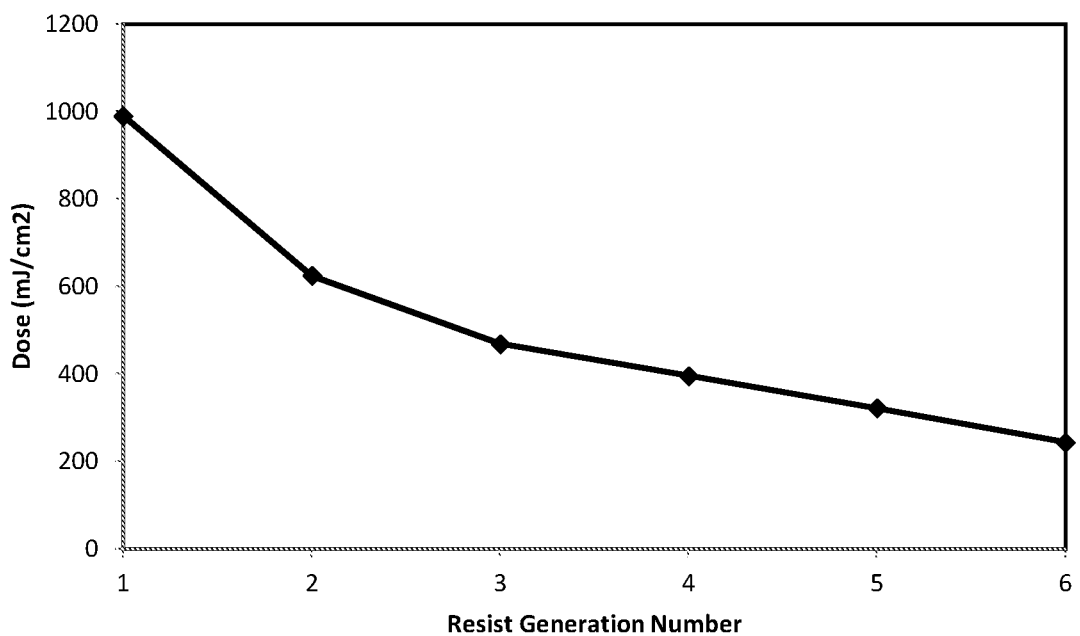
FIG. 12 is a graph showing the required exposure dose decreasing (hence sensitivity increasing) over 6 generations of improvements to the resist coatings.

FIG. 12 is a graph showing the required exposure dose decreasing (hence sensitivity increasing) through the 6 generations of resist coatings currently developed, the respective 6 generations of coatings being:

Generation 1-60 nm thick resist coating of Compound 1 (without secondary electron generator)
Generation 2-60 nm thick resist coating of Compound 3
Generation 3-60 nm thick resist coating of Compound 5
Generation 4-50 nm thick resist coating of Compound 3
Generation 5-20 nm thick resist coating of Compound 3
Generation 6-20 nm thick resist coating of Compound 5

The inventors have exposed the aforementioned 6 generations of resist to EUV radiation (Energy=92 eV).

The $1^{st}$ generation resist material had an exposure dose of 990 $mJ/cm^2$ which is higher than desired. As secondary electron generators and the chemistry underlying their incorporation into resist compositions of the invention became better understood, the inventors were able to produce significant improvements in resist sensitivities. The 6th generation resist exhibited an exposure dose that had been reduced to a line exposure dose of 244 $mJ/cm^2$. The progress can be seen in the graph of FIG. 12.

As such, inclusion of a secondary electron generator (e.g. high $Z_{eff}$ and high density metal compound) is desirable for increased sensitivity and, conveniently, it is viable to co-ordinate the secondary electron generator to the resist compounds. This essentially provides low density resist compositions (e.g. with predominantly anti-scattering materials), which promotes high resolution and reduces scattering, with sporadic (and regular) regions of high density, which promote localised scattering to increase resist sensitivity.

It will be understood by those skilled in the art that the aforementioned are merely examples of a broader concept which may be applied to other resist compounds, resist compositions, and other secondary electron generators. With regards to the secondary electron generator component, patent publication WO 2015/145144 (by the same inventors/applicant) describes an range of suitable alternative secondary electron generators which may be mixed into resist compositions of the present invention, either in a free dispersed form and/or co-ordinated to the anti-scattering and/or resist material(s). In this regard, WO 2015/145144 is hereby incorporated by reference.

CONCLUSIONS

The abovementioned experimental results illustrate the viability of the resist compositions of the invention across a full range of ultraviolet wavelengths. As such, these resists not only provide the important benefits outlined elsewhere herein (e.g. high resolution, sensitivity, spin-coatability, etc.), but also offer sufficient versatility to enable these benefits to be accessed and realised across a range of conditions, thereby widening their industrial applicability. The resists of the invention make a special contribution to the field of electronics and integrated circuits, where the benefits of the invention can be universally realised to produce the highest quality next generation of high specification electronics.

REFERENCES

1) G. E. Moore, 'Cramming more components onto intergrated circuits', Electronics, 38 (80 (1965).
2) R. Mahajan, R. Nair, V. Wakharkar, J Swan, G. Vandentop, 'Emerging directions for packaging technologies', Intel Technology Journal, 6 (2), pp. 62-75, (2002).
3) H. Bakoglu, 'Circuit, interconnection and packaging for VLSI', Addison-Wesley publication Company, Reading Mass., (1990).

The invention claimed is:

1. A method of fabricating an integrated circuit die or an integrated circuit wafer comprising a plurality of integrated circuit dice, the or each die comprising a plurality of electronic components, wherein the method comprises:
   i) applying a resist coating to a substrate;
   ii) exposing part(s) of the resist coating to radiation to provide an exposed resist coating;
   iii) developing the exposed resist coating to generate a resist pattern layer, the resist pattern layer comprising: developer-insoluble coating portions of the resist coating; and an array of grooves extending through the resist pattern layer;
   iv) modifying the substrate, substrate surface, or part(s) thereof, underlying the resist pattern layer;
   v) removing the resist pattern layer to provide a modified substrate;
   vi) optionally repeating, one or more times, step iv) and/or steps i)-v) with either the resist coating or an alternative resist coating; and optionally using alternative radiation during exposure upon the modified substrate;
   vii) optionally conductively interconnecting the electronic components of the or each die with conductor(s) if not already performed during one or more substrate/substrate-surface modifying steps to provide an integrated circuit with external contact terminals;
   viii) optionally performing one or more further finishing steps;
   ix) optionally separating an integrated circuit die from a wafer comprising a plurality of integrated circuit dice;
wherein step (i) of the method is optionally preceded by performing steps (i) to (vi) of this method, optionally repeated one or more times, using either the resist coating of the invention or an alternative resist coating;
wherein the resist coating comprises an optionally dried and/or cured resist composition;
wherein the resist composition comprises an anti-scattering component and a resist component, wherein the anti-scattering component comprises a primary metal complex (PMC) that is a polymetallic metal-organic complex characterized by a polymetallic cage and/or a polymetallic ring system comprising one or more types of metal species coordinated to one or more ligands, where boron and silicon are not metal species, wherein either:
   (a) the anti-scattering component is the resist component;
   (b) the anti-scattering component comprises the resist component such that the resist component is part of the anti-scattering component or is mutually associated or connected therewith, whether chemically and/or physically, by way of bonding; or
   (c) the resist component is a separate compound from the anti-scattering component.

2. A method of manufacturing an integrated circuit package, the integrated circuit package comprising a plurality of pins and an integrated circuit die with external contact terminals conductively connected to the corresponding plurality of pins, wherein the method comprises:
   i) fabricating an integrated circuit die by the method of claim 1;
   ii) attaching the integrated circuit die to a package substrate, wherein the package substrate comprises electrical contacts, each of the electrical contacts being optionally connected or connectable to a corresponding pin;
   iii) conductively connecting each of the external contact terminals of the integrated circuit die to corresponding electrical contacts of the package substrate;
   iv) optionally connecting the electrical contacts of the package substrate to corresponding pins;
   v) encapsulating the integrated circuit die.

3. A method of manufacturing a circuit board comprising an integrated circuit package comprising a plurality of pins, wherein the method comprises:
   i) manufacturing an integrated circuit package by the method of claim 2; and
   ii) conductively connecting the integrated circuit package to a circuit board.

4. A method of manufacturing an electronic device or system, the electronic device or system comprising or being connectable to a power source and comprising a circuit board conductively connected to or connectable to a power source, wherein the method comprises:
   i) manufacturing a circuit board by the method of claim 3; and
   ii) incorporating the circuit board within the electronic device or system.

5. The method of claim 1, wherein the primary metal complex comprises or is otherwise associated with one or more resist components in that the one or more resist components are resist ligands bonded to the primary metal complex via a co-ordination donor atom or group borne by the resist ligand(s).

6. The method of claim 1, wherein the resist component undergoes a change upon exposure to relevant exposure radiation;
   wherein the exposure radiation causes the one or more resist components to chemically transform and potentially undergo further chemical reactions.

7. The method of claim 1, wherein the one or more resist components are or otherwise comprise a photosensitive component capable of undergoing photolytic reactions without the assistance of additional photoinitiators or photocatalysts.

8. The method of claim 1, wherein
the primary metal complex comprises at least two types of metal ion, wherein the at least two types of metal ion comprise different metals; and/or
the primary metal complex comprises at least two types of metal ion, wherein the at least two types of metal ion have a different oxidation state.

9. The method of claim 1, wherein the primary metal complex comprises a transition metal (d-block) species.

10. The method of claim 1, wherein the composition comprises a secondary electron generator, which is a compound or component having an effective atomic number ($Z_{eff}$) greater than or equal to 25, wherein the secondary electron generator SEG is either:
a separate compound from the antiscattering component; or
a component of the antiscattering component by virtue of being co-ordinatively attached, wherein the $Z_{eff}$ of the secondary electron generator is calculated by excluding the molecule to which it is co-ordinatively attached;
wherein the secondary electron generator is a lewis acid or is derived from a compound that is a lewis acid.

11. The method of claim 1, wherein the one or more ligands comprise bridging ligands that bind together metal species within the primary metal complex.

12. The method of claim 1, wherein the polymetallic cage or ring system is heterometallic in that the polymetallic cage or ring system comprise two or more different metal species derived from different metal elements, $M^1$, $M_2$, . . . , $M^n$.

13. The method of claim 12, wherein the molar ratio of $M_1$ to $M_2$ is between 10:1 and 2:1.

14. The method of claim 12, wherein $M^1$ is selected from the group consisting of $Cr^{III}$, $Fe^{III}$, $V^{III}$, $Ga^{III}$, $Al^{III}$, and $In^{III}$.

15. The method of claim 12, wherein $M^2$ is selected from the group consisting of $Ni^{II}$, $Co^{II}$, $Zn^{II}$, $Cd^{II}$, $Mn^{II}$, $Mg^{II}$, $Ca^{II}$, $Sr^{II}$, $Ba^{II}$, $Cu^{II}$, and $Fe^{II}$.

16. The method of claim 12, wherein $M^1$ is $Cr^{III}$, and $M^2$ is $Ni^{II}$.

17. The method of claim 1, wherein the primary metal complex comprises a mixture of two or more different types of ligand.

18. The method of claim 17, wherein one of the types of ligand is monodentate and one of the types of ligand is bidentate.

19. The method of claim 1, wherein the one or more ligands comprise a carboxylate ligand.

20. The method of claim 19, wherein the carboxylate is a bridging ligand that provides a bridge between two or more metal species.

21. The method of claim 1, wherein the one or more ligands comprise a fluoro ligand.

22. The method of claim 1, wherein the primary metal complex comprises a bifunctional ligand comprising co-ordinating atom(s) capable of forming an internal dative bond(s) with metal species within the primary metal complex, and one or more additional co-ordinating atoms capable of forming external dative bonds.

23. The method of claim 22, wherein the bifunctional ligand comprises a carboxylate group and an additional nitrogen-containing moiety.

24. The method of claim 1, wherein the anti-scattering compound comprises one or more counterions associated with the primary metal complex.

25. The method as claimed in claim 24, wherein the one or more counterions comprise one or more cations selected from the group consisting of an ammonium cation, a primary ammonium cation, a secondary ammonium cation, a tertiary ammonium cation, a quaternary ammonium cation, and an imidazolium cation.

26. The method of claim 1, wherein the resist composition comprises a secondary electron generator which is a metal compound comprising a metal species having an atomic number (Z) greater than or equal to 49 and having an oxidation state of +1 or higher.

27. The method of claim 26, wherein the secondary electron generator comprises a d-block, p-block, or f-block metal species having an atomic number greater than 57.

28. The method of claim 27, wherein the secondary electron generator is a metal (I), metal (II), metal (III), or metal (IV) halide.

29. The method of claim 26, wherein the anti-scattering component forms one or more dative bonds with the secondary electron generator such that the secondary electron generator is co-ordinated to the primary metal complex.

30. The method of claim 29, wherein one or more ligands of the antiscattering component comprise one or more lone-pair-bearing heteroatoms which co-ordinate with the secondary electron generator.

31. The method of claim 30, wherein the one or more ligands of the antiscattering compound which co-ordinate with the secondary electron generator are bifunctional ligands which are a carboxylate defined by the formula $R_{B2}CO_2^-$, wherein $R_{B2}$ is a group comprising a basic or chelating group selected from the group consisting of:
an optionally substituted heterocyclyl, heteroaryl, heterocyclyl(1-6C)alkyl, or heteroaryl(1-6C)alkyl group;
a (1-12C)alkyl, (1-12C)alkenyl, (1-12C)alkynyl, (3-8C)cycloalkyl, (3-8C)cycloalkenyl, (1-3C)alkyl(3-8C)cycloalkyl, (1-3C)alkyl(3-8C)cycloalkenyl, aryl, (1-3C)alkylaryl, or aryl(1-3C)alkyl group substituted with one or more basic or chelating groups;
a (1-12C)alkyl, (1-12C)alkenyl, (1-12C)alkynyl, (3-8C)cycloalkyl, (3-8C)cycloalkenyl, (1-3C)alkyl(3-8C)cycloalkyl, (1-3C)alkyl(3-8C)cycloalkenyl, aryl, (1-3C)alkylaryl, or aryl(1-3C)alkyl group substituted with an amino, alkylamino, dialkylamino, hydroxyl, (1-6C)alkoxy, carbonyl, immino, thio, or thiocarbonyl group;
a pyridyl, aminophenyl, N-(1-3C)alkylaminophenyl, or N,N-di(1-3C)alkylaminophenyl group; and
isonicotinate.

32. The method of claim 1, wherein the resist composition further comprises a photosensitive component selected from a photoinitiator, photoacid, or photosensitizer.

33. The method of claim 32, wherein the resist component may be or otherwise contain or comprise the photosensitive component.

34. The method of claim 33, wherein the resist component is a part of the anti-scattering component.

35. The method of claim 1, wherein the radiation in step ii) is performed with electromagnetic radiation.

36. The method of claim 35, wherein the electromagnetic radiation is ultraviolet radiation.

37. The method of claim 36, wherein the ultraviolet radiation has wavelengths between 100 nm and 400 nm.

38. The method of claim 1, wherein the primary metal complex comprises three or more moles of the metal species per mole of primary metal complex.

39. The method of claim 1, wherein the primary metal complex is free of direct metal-metal bonds.

40. The method of claim 1, wherein the one or more ligands of the primary metal complex are coordinated to all of the metal species so as to bind together all of the metal species of the primary metal complex.

41. The method of claim 1, wherein the primary metal complex comprises ligands of sufficient types and numbers to afford an average of at least 4 dative bonds per individual metal species within the complex.

42. The method of claim 1, wherein co-ordination sites of all the metal species within the primary metal complex are completely saturated by the ligands.

43. The method of claim 1, wherein all of the ligands within the primary metal complex are coordinated to metal species via a donor atom or group comprising one or more lone-pair bearing heteroatoms.

44. The method of claim 1, wherein all of the ligands within the primary metal complex have coordinating atoms capable of donating more than one lone pair of electrons.

45. The method of claim 1, wherein all ligands are negatively charged.

* * * * *